United States Patent
Kim et al.

(10) Patent No.: US 9,899,416 B2
(45) Date of Patent: Feb. 20, 2018

(54) SEMICONDUCTOR DEVICE AND FABRICATING METHOD THEREOF

(71) Applicant: Samsung Electronics Co., Ltd., Suwon-si (KR)

(72) Inventors: Bo Soon Kim, Hwaseong-si (KR); Hyun Ji Kim, Hwaseong-si (KR); Jeong Yun Lee, Yongin-si (KR); Gi Gwan Park, Hwaseong-si (KR); Sang Duk Park, Hwaseong-si (KR); Young Mook Oh, Hwaseong-si (KR); Yong Seok Lee, Hwaseong-si (KR)

(73) Assignee: SAMSUNG ELECTRONICS CO., LTD., Samsung-ro, Yeongtong-gu, Suwon-si, gyeonggi-do (KR)

( * ) Notice: Subject to any disclaimer, the term of this patent is extended or adjusted under 35 U.S.C. 154(b) by 0 days.

(21) Appl. No.: 15/403,307

(22) Filed: Jan. 11, 2017

(65) Prior Publication Data
US 2017/0200738 A1 Jul. 13, 2017

(51) Int. Cl.
*H01L 27/088* (2006.01)
*H01L 27/12* (2006.01)
(Continued)

(52) U.S. Cl.
CPC ......... *H01L 27/1203* (2013.01); *H01L 21/84* (2013.01); *H01L 21/845* (2013.01);
(Continued)

(58) Field of Classification Search
CPC ............. H01L 27/1203; H01L 27/1211; H01L 29/42392; H01L 21/84; H01L 21/845;
(Continued)

(56) References Cited

U.S. PATENT DOCUMENTS

| 7,427,788 B2 | 9/2008 | Li et al. |
| 7,544,572 B2 | 6/2009 | Pan et al. |

(Continued)

FOREIGN PATENT DOCUMENTS

| JP | 2011-503864 | 1/2011 |
| JP | 2011-029503 | 2/2011 |

(Continued)

*Primary Examiner* — Vu A Vu
(74) *Attorney, Agent, or Firm* — Muir Patent Law, PLLC

(57) ABSTRACT

There is provided a semiconductor device capable of enhancing device performance by variably adjusting threshold voltage of a transistor having gate-all-around structure. The semiconductor device includes a substrate including a first region and a second region, a first wire pattern provided on the first region of the substrate and spaced apart from the substrate, a second wire pattern provided on the second region of the substrate and spaced apart from the substrate, a first gate insulating film surrounding a perimeter of the first wire pattern, a second gate insulating film surrounding a perimeter of the second wire pattern, a first gate electrode provided on the first gate insulating film, intersecting with the first wire pattern, and including a first metal oxide film therein, a second gate electrode provided on the second gate insulating film and intersecting with the second wire pattern, a first gate spacer on a sidewall of the first gate electrode, and a second gate spacer on a sidewall of the second gate electrode.

20 Claims, 71 Drawing Sheets

(51) Int. Cl.
*H01L 29/06* (2006.01)
*H01L 29/423* (2006.01)
*H01L 21/84* (2006.01)
*H01L 29/49* (2006.01)
*H01L 29/51* (2006.01)
*H01L 21/8234* (2006.01)
*H01L 29/78* (2006.01)

(52) U.S. Cl.
CPC ...... *H01L 27/1211* (2013.01); *H01L 29/0673* (2013.01); *H01L 29/42392* (2013.01); *H01L 21/823456* (2013.01); *H01L 21/823462* (2013.01); *H01L 21/823468* (2013.01); *H01L 29/4908* (2013.01); *H01L 29/4966* (2013.01); *H01L 29/4991* (2013.01); *H01L 29/517* (2013.01); *H01L 29/7853* (2013.01)

(58) Field of Classification Search
CPC ............. H01L 29/0673; H01L 29/7853; H01L 29/4908; H01L 29/517; H01L 29/4991; H01L 21/823468; H01L 21/823462; H01L 21/823456; H01L 29/4966
USPC ........................................................ 257/392
See application file for complete search history.

(56) References Cited

U.S. PATENT DOCUMENTS

| | | | |
|---|---|---|---|
| 7,615,429 | B2 | 11/2009 | Kim et al. |
| 7,663,166 | B2 * | 2/2010 | Kim ................... H01L 29/0657 257/288 |
| 7,696,046 | B2 | 4/2010 | Kim et al. |
| 8,099,686 | B2 | 1/2012 | Schultz |
| 8,367,487 | B2 | 2/2013 | Ernst et al. |
| 8,395,220 | B2 * | 3/2013 | Chang ..................... B82Y 10/00 257/368 |
| 8,502,318 | B2 | 8/2013 | Thomas et al. |
| 8,518,769 | B2 | 8/2013 | Ota et al. |
| 8,896,101 | B2 | 11/2014 | Then et al. |
| 8,946,789 | B2 | 2/2015 | Kim et al. |
| 8,987,794 | B2 | 3/2015 | Rachmady et al. |
| 9,012,284 | B2 | 4/2015 | Glass et al. |
| 9,035,277 | B2 * | 5/2015 | Ching ............... H01L 29/66439 257/288 |
| 9,111,784 | B2 | 8/2015 | Ching et al. |
| 9,123,567 | B2 | 9/2015 | Radosavljevic et al. |
| 9,219,064 | B2 | 12/2015 | Kim |
| 9,231,052 | B2 | 1/2016 | Kim et al. |
| 2011/0133167 | A1 * | 6/2011 | Bangsaruntip ......... B82Y 10/00 257/24 |
| 2013/0313524 | A1 | 11/2013 | De Micheli et al. |
| 2014/0151639 | A1 | 6/2014 | Chang et al. |
| 2014/0197377 | A1 | 7/2014 | Kim et al. |
| 2014/0353574 | A1 | 12/2014 | Li et al. |
| 2015/0048454 | A1 | 2/2015 | Colinge et al. |
| 2015/0084041 | A1 | 3/2015 | Hur et al. |
| 2015/0270346 | A1 | 9/2015 | Amarnath et al. |
| 2016/0086861 | A1 | 3/2016 | Kim |

FOREIGN PATENT DOCUMENTS

| | | |
|---|---|---|
| KR | 0652381 | 12/2006 |
| KR | 2007-0068725 | 7/2007 |
| KR | 2008-0011511 | 2/2008 |
| KR | 2012-0010512 | 2/2012 |
| KR | 2012-0100630 | 9/2012 |
| KR | 1337267 | 12/2013 |
| KR | 2014-0095834 | 8/2014 |
| KR | 2015-0081606 | 7/2015 |

* cited by examiner

SEMICONDUCTOR DEVICE AND FABRICATING METHOD THEREOF

CROSS-REFERENCE TO RELATED APPLICATION

This application claims the benefit of priority under 35 U.S.C. 119 to Korean Patent Application No. 10-2016-0003178 filed on Jan. 11, 2016 in the Korean Intellectual Property Office and Korean Patent Application No. 10-2016-0018929 filed on Feb. 18, 2016 in the Korean Intellectual Property Office, the contents of each of which are incorporated herein by reference in their entirety.

BACKGROUND

1. Technical Field

The present disclosure relates to a semiconductor device and a fabricating method thereof, and more particularly, to a semiconductor device having a gate-all-around structure, and a fabricating method thereof.

2. Description of the Related Art

For semiconductor device density enhancement, gate-all-around structure has been suggested as one of the scaling technologies, according to which a silicon body in a nanowire shape is formed on a substrate, with a gate then being formed to surround the silicon body.

Such gate-all-around structure is easy to scale, as it uses three-dimensional channel. Further, current control capability can be enhanced without requiring increased gate length. Furthermore, it is possible to effectively suppress short channel effect (SCE) which is a phenomenon that the electric potential of the channel region is influenced by the drain voltage.

SUMMARY

A technical objective of the present disclosure is to provide a semiconductor device capable of enhancing device performance by variably adjusting threshold voltage of a transistor having gate-all-around structure.

Another technical objective of the present disclosure is to provide a fabricating method of a semiconductor device capable of enhancing device performance by variably adjusting threshold voltage of a transistor having gate-all-around structure.

The objects according to the present disclosure are not limited to those set forth above and objects other than those set forth above will be clearly understood to a person skilled in the art from the following description.

According to an aspect of the present inventive concept, there is provided a semiconductor device comprising a substrate including a first region and a second region; a first wire pattern provided on the first region of the substrate and spaced apart from the substrate; a second wire pattern provided on the second region of the substrate and spaced apart from the substrate; a first gate insulating film surrounding a perimeter of the first wire pattern; a second gate insulating film surrounding a perimeter of the second wire pattern; a first gate electrode provided on the first gate insulating film, intersecting with the first wire pattern, and including a first metal oxide film therein; a second gate electrode being on the second gate insulating film and intersecting with the second wire pattern; a first gate spacer on a sidewall of the first gate electrode; and a second gate spacer on a sidewall of the second gate electrode.

According to another aspect of the present inventive concept, there is provided a semiconductor device comprising a first wire pattern provided on a substrate and spaced apart from the substrate; a second wire pattern provided on the first wire pattern and spaced apart from the first wire pattern; a gate spacer on the substrate, the gate spacer being disposed on opposite sides of the first wire pattern and the second wire pattern, and defining a trench; a gate insulating film surrounding perimeters of the first wire pattern and the second wire pattern and extending along a sidewall of the trench; a lower gate electrode provided on the gate insulating film and surrounding the first wire pattern and the second wire pattern; a metal oxide film provided on the gate insulating film and extending along at least a portion of a profile of the gate insulating film; and an upper gate electrode provided on the lower gate electrode and the metal oxide film and filling the trench.

According to still another aspect of the present inventive concept, there is provided a semiconductor device comprising a substrate including a first region and a second region; a first wire pattern provided on the first region of the substrate and spaced apart from the substrate; a second wire pattern provided on the second region of the substrate and spaced apart from the substrate and the first wire pattern; a first gate electrode intersecting with the first wire pattern, and overlapping the first wire pattern by a first width; and a second gate electrode intersecting the second wire pattern and overlapping the second wire pattern by a second width that is different from the first width.

According to still another aspect of the present inventive concept, there is provided a semiconductor device comprising a substrate including a first region and a second region; a first wire pattern provided on the first region of the substrate and spaced apart from the substrate; a second wire pattern provided on the first wire pattern and spaced apart from the first wire pattern; a third wire pattern provided on the second region of the substrate and spaced apart from the substrate; a fourth wire pattern provided on the third wire pattern and spaced apart from the third wire pattern; a first gate spacer disposed at opposite ends of the first wire pattern and the second wire pattern; a second gate spacer disposed at opposite ends of the third wire pattern and the fourth wire pattern, a distance between the second gate spacers between the third wire pattern and the fourth wire pattern being smaller than a distance between the first gate spacers between the first wire pattern and the second wire pattern; a first gate electrode intersecting the first wire pattern and the second wire pattern between the first gate spacers; and a second gate electrode intersecting the third wire pattern and the fourth wire pattern between the second gate spacers.

According to still another aspect of the present inventive concept, there is provided a semiconductor device comprising a substrate including a first region and a second region; a first wire pattern provided on the first region of the substrate and spaced apart from the substrate; a second wire pattern provided on the second region of the substrate and spaced apart from the substrate; a first gate spacer disposed at opposite ends of the first wire pattern; a second gate spacer disposed at opposite ends of the second wire pattern; a first gate electrode that intersects the first wire pattern between the first gate spacers; a second gate electrode that intersects the second wire pattern between the second gate spacers; a first epitaxial pattern disposed at opposite sides of the first gate electrode and connected to the first wire pattern; and a second epitaxial pattern disposed at opposite sides of the second gate electrode and connected to the second wire pattern, wherein a width of the first gate spacer disposed between the first epitaxial pattern and the first gate electrode between the first wire pattern and the substrate is different from a width of the second gate spacer disposed between the second epitaxial pattern and the second gate electrode between the second wire pattern and the substrate.

BRIEF DESCRIPTION OF THE DRAWINGS

The above and other objects, features and advantages of the present disclosure will become more apparent to those of ordinary skill in the art by describing in detail example embodiments thereof with reference to the accompanying drawings, in which.

DETAILED DESCRIPTION

Figure 1:
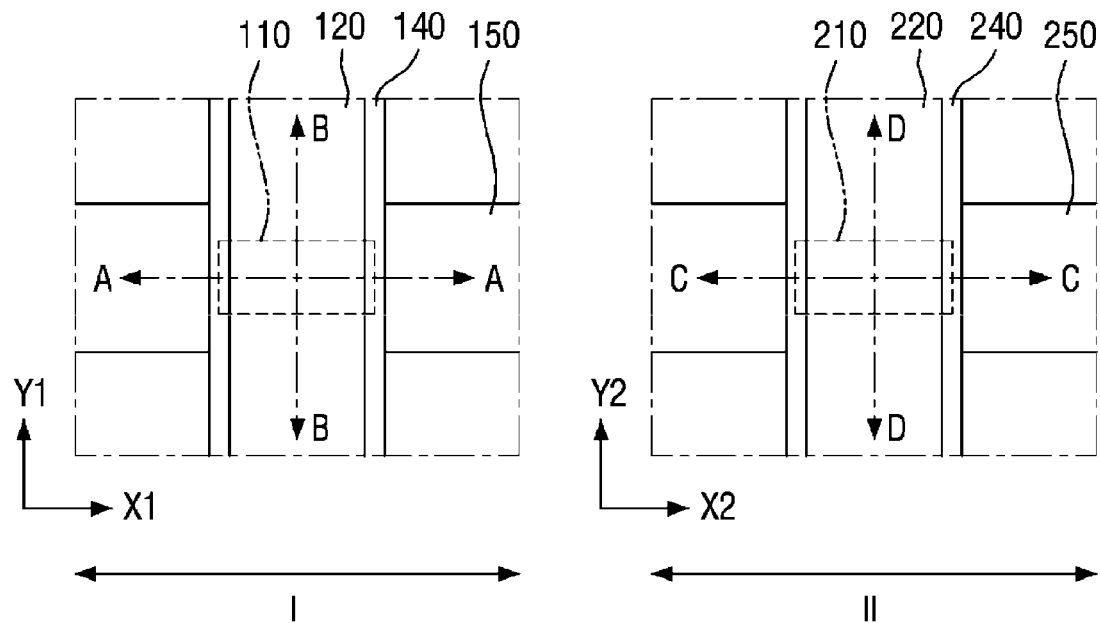
FIG. 1 is a schematic top view provided to explain a semiconductor device according to some example embodiments of the present disclosure.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, like numbers refer to like elements throughout. Though the different figures show various features of exemplary embodiments, these figures and their features are not necessarily intended to be mutually exclusive from each other. Rather, certain features depicted and described in a particular figure may also be implemented with embodiment(s) depicted in different figure(s), even if such a combination is not separately illustrated. Referencing such features/figures with different embodiment labels (e.g. "first embodiment") should not be interpreted as indicating certain features of one embodiment are mutually exclusive of and are not intended to be used with another embodiment.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

Spatially relative terms, such as "beneath," "below," "lower," "above," "upper" and the like, may be used herein for ease of description to describe one element's or feature's positional relationship relative to another element(s) or feature(s) as illustrated in the figures. It will be understood that such spatially relative terms are intended to encompass different orientations of the device in use or operation in addition to the orientation depicted in the figures. Thus, a device depicted and/or described herein to have element A below element B, is still deemed to have element A below element B no matter the orientation of the device in the real world.

Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "planar," "coplanar," "cylindrical," "square," etc., as used herein when referring to orientation, layout, location, shapes, sizes, amounts, or other measures, encompass acceptable variations from exact identically, including nearly identical layout, location, shapes, sizes, amounts, or other measures within acceptable variations that may occur, for example, due to manufacturing processes. The term "substantially" may be used herein to emphasize this meaning, unless the context or other statements indicate otherwise.

The term "air" as discussed herein, may refer to atmospheric air, or other gases that may be present during the manufacturing process.

Unless otherwise defined, all terms (including technical and scientific terms) used herein have the same meaning as commonly understood by one of ordinary skill consistent with their meaning in the context of the relevant art and/or the present application.

Although the drawings regarding a semiconductor device according to some example embodiments exemplify a gate-all-around field-effect transistor (GAA FET) including a channel region in a nanowire shape or nano-sheet shape, example embodiments are not limited thereto. A semiconductor device according to some example embodiments may include a tunneling FET, a bipolar junction transistor, a laterally diffused metal oxide semiconductor (LDMOS) transistor, and so on.

Hereinbelow, a semiconductor device according to some example embodiments will be explained with reference to FIGS. 1 to 6C.

Figure 2:
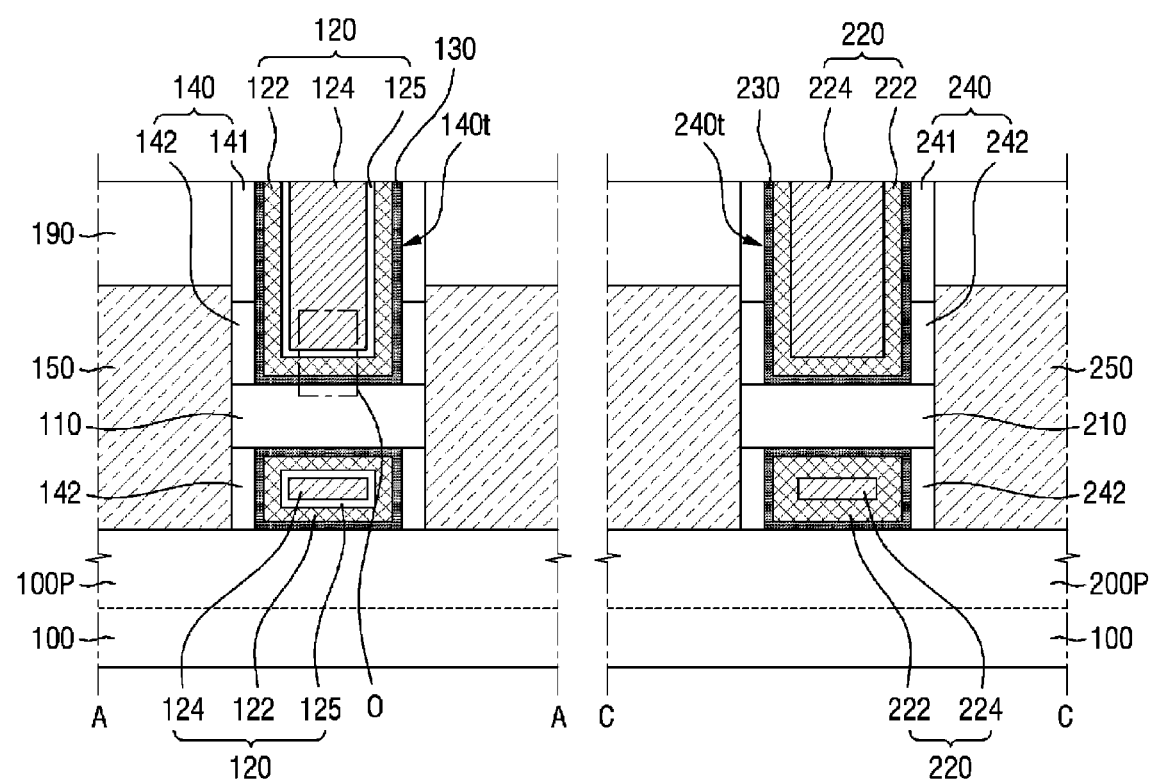
FIG. 2 shows cross sectional views taken on lines A-A and C-C of FIG. 1.
Figure 3:
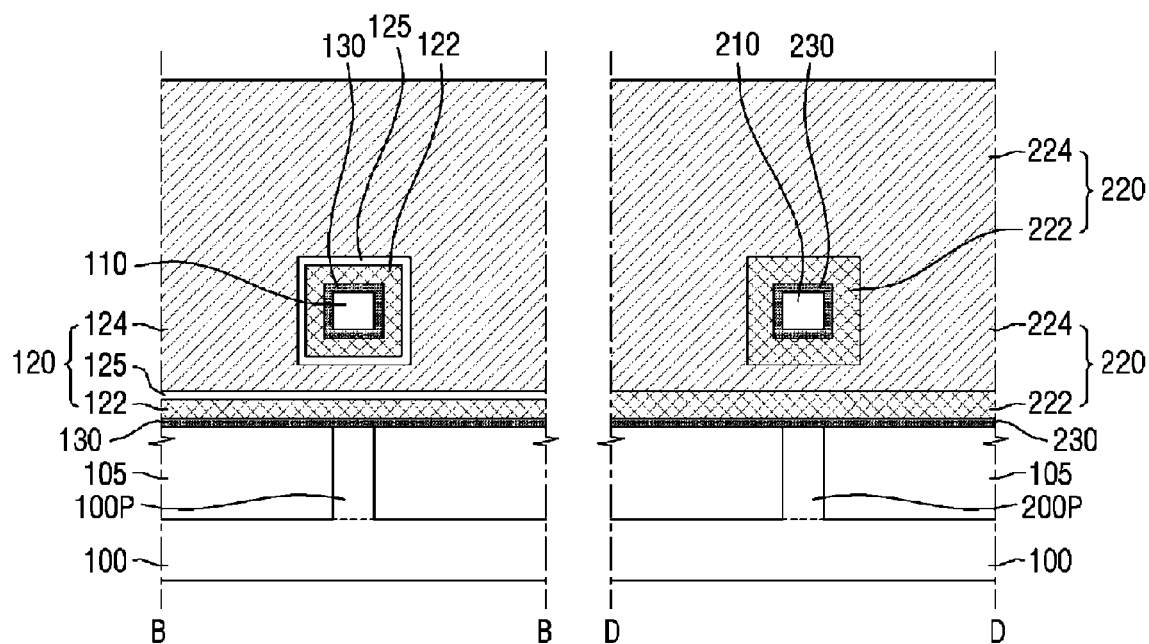
FIG. 3 shows cross sectional views taken on lines B-B and D-D of FIG. 1.
Figure 4:
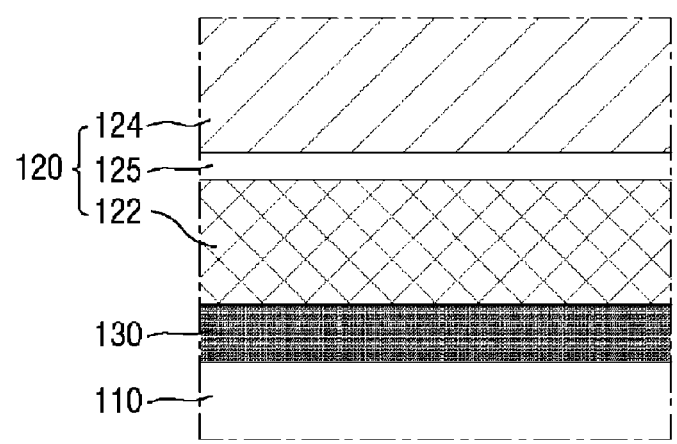
FIG. 4 is an enlarged view of the encircled area O of FIG. 2.

FIG. 1 is a schematic top view provided to explain a semiconductor device according to some example embodiments of the present disclosure. FIG. 2 shows cross sectional views taken on lines A-A and C-C of FIG. 1. FIG. 3 shows cross sectional views taken on lines B-B and D-D of FIG. 1. FIG. 4 is an enlarged view of the encircled area O of FIG. 2. FIGS. 5A to 5E show various cross sectional views of the first wire pattern of FIG. 1 taken on line B-B. FIGS. 6A to 6C show various cross sectional views of the first wire pattern of FIG. 1 taken on line A-A. For convenience of explanation, FIG. 1 skips illustration of an interlayer insulating film 190, or the like.

Referring to FIGS. 1 to 4, a semiconductor device according to some example embodiments may include a substrate 100, a first wire pattern 110, a second wire pattern 210, a first gate insulating film 130, a second gate insulating film 230, a first gate electrode 120, and a second gate electrode 220.

The substrate 100 may include a first region I and a second region II. The first region I and the second region II may be spaced apart from each other in one embodiment, or connected with each other in another embodiment. Transistors of different types may be formed in the first region I and the second region II, or alternatively, transistors of the same type may be formed therein.

Further, the first region I and the second region II may each be one of, for example, logic region, SRAM region, and input/output (I/O) region. For example, the first region I and the second region II may be the regions performing a same function, or the regions performing different functions.

Furthermore, it is illustrated in FIG. 1 that the first gate electrode 120 and the second gate electrode 220 are different gate electrodes, but without limitation thereto.

In the case where the first region I and the second region II are connected to each other, and the first wire pattern 110 and the second wire pattern 210 spaced apart from each other are adjacent to each other, the first gate electrode 120 that intersects the first wire pattern 110 and the second gate electrode 220 that intersects the second wire pattern 210 may be an identical gate electrode.

The substrate 100 may be a silicon substrate, or may include other material such as silicon germanium, indium antimonide, lead telluride compound, indium arsenide, indium phosphide, gallium arsenide, or gallium antimonide. Alternatively, the substrate 100 may be a base substrate having an epitaxial layer formed thereon.

A first fin-type protruding portion 100P may be formed in the first region I, and a second fin-type protruding portion 200P may be formed in the second region II. The first fin-type protruding portion 100P and the second fin-type protruding portion 200P may protrude from an upper surface of the substrate 100.

A field insulating film 105 may surround at least a portion of a sidewall of the first fin-type protruding portion 100P and at least a portion of a sidewall of the second fin-type protruding portion 200P. The first fin-type protruding portion 100P and the second fin-type protruding portion 200P may be defined by the field insulating film 105. The field insulating film 105 may include one of, for example, oxide layer, nitride layer, oxynitride layer, or a combination thereof.

As illustrated in FIG. 3, the sidewalls of the first fin-type protruding portion 100P and the second fin-type protruding portion 200P may be entirely surrounded by the field insulating film 105, but this is illustrated so only for convenience of explanation and example embodiments are not limited thereto.

The first fin-type protruding portion 100P may be elongated in a first direction X1, and the second fin-type protruding portion 200P may be elongated in a second direction X2.

The first fin-type protruding portion 100P and the second fin-type protruding portion 200P may each be formed by etching away a portion of the substrate 100, and may include an epitaxial layer grown from the substrate 100.

The first fin-type protruding portion 100P and the second fin-type protruding portion 200P may each include an element semiconductor material such as silicon or germanium. Further, the first fin-type protruding portion 100P and the second fin-type protruding portion 200P may each include a compound semiconductor such as, for example, IV-IV group compound semiconductor or III-V group compound semiconductor.

Take the IV-IV group compound semiconductor for instance, this may be a binary compound or a ternary compound including at least two or more of carbon (C), silicon (Si), germanium (Ge), and tin (Sn), or such binary or ternary compound doped with a IV group element.

Take the III-V group compound semiconductor for instance, this may be one of a binary compound, a ternary compound and a quaternary compound which is formed by a combination of at least one of aluminum (Al), gallium (Ga), and indium (In) as a III group element, with one of phosphorus (P), arsenic (As) and antimony (Sb) as a V group element.

The first wire pattern 110 may be formed on the substrate 100 of the first region I. The second wire pattern 210 may be formed on the substrate 100 of the second region II. The first wire pattern 110 and the second wire pattern 210 may each be formed with spacing from the substrate 100.

The first wire pattern 110 may be formed so as to extend in the first direction X1 as the first fin-type protruding portion 100P does. The second wire pattern 210 may be formed so as to extend in the second direction X2 as the second fin-type protruding portion 200P does.

The first wire pattern 110 may be formed on the first fin-type protruding portion 100P with spacing from the first fin-type protruding portion 100P. The first wire pattern 110 may be perpendicularly overlapped with the first fin-type protruding portion 100P. The first wire pattern 110 may be formed on the first fin-type protruding portion 100P, rather than being formed on the field insulating film 105.

The second wire pattern 210 may be formed on the second fin-type protruding portion 200P with spacing from the second fin-type protruding portion 200P. The second wire pattern 210 may be perpendicularly overlapped with the second fin-type protruding portion 200P. The second wire pattern 210 may be formed on the second fin-type protruding portion 200P, rather than being formed on the field insulating film 105.

The first wire pattern 110 and the second wire pattern 210 may each include an element semiconductor material such as silicon or germanium. Further, the first wire pattern 110 and the second wire pattern 210 may each include a compound semiconductor such as, for example, IV-IV group compound semiconductor or III-V group compound semiconductor.

The first wire pattern 110 and the second wire pattern 210 may be used as a channel region for the transistor, respectively. Depending on whether the semiconductor device including the first wire pattern 110 and the second wire pattern 210 is PMOS or NMOS, or depending on the function of the transistor, the first wire pattern 110 and the second wire pattern 210 may include the same material or different materials from each other.

Further, the first wire pattern 110 may include the same material as that of the first fin-type protruding portion 100P, or a material different from that of the first fin-type protruding portion 100P. Likewise, the second wire pattern 210 may include the same material as that of the second fin-type protruding portion 200P, or a material different from that of the second fin-type protruding portion 200P.

The first gate electrode 120 may be formed on the substrate 100 of the first region I. The second gate electrode 220 may be formed on the substrate 100 of the second region II. The first gate electrode 120 may extend in a third direction Y1. The second gate electrode 220 may extend in a fourth direction Y2.

The first gate electrode 120 may intersect with the first wire pattern 110 that is formed with spacing from the substrate 100 and the first fin-type protruding portion 100P. The first gate electrode 120 may be formed so as to surround the perimeter of the first wire pattern 110. The first gate electrode 120 may also be formed in a space defined between the first wire pattern 110 and the first fin-type protruding portion 100P.

The second gate electrode 220 may intersect with the second wire pattern 210 formed with spacing from the substrate 100 and the second fin-type protruding portion 200P. The second gate electrode 220 may be formed so as to surround the perimeter of the second wire pattern 210. The second gate electrode 220 may also be formed in a space defined between the second wire pattern 210 and the second fin-type protruding portion 200P.

The first gate electrode 120 and the second gate electrode 220 will be described below with respect to structures, and so on.

The first gate spacer 140 may be formed on both sidewalls (e.g., opposite sidewalls) of the first gate electrode 120 that extend in the third direction Y1. The first gate spacer 140 may be formed on both sides (e.g., opposite sides) of the first wire pattern 110, while facing each other. The first gate spacer 140 may define a first trench 140t that intersects with the first wire pattern 110.

The first gate spacer 140 may be disposed on both ends of the first wire pattern 110. The first gate spacer 140 may include a penetrating portion through which the first wire pattern 110 is passed.

The first wire pattern 110 may be passed through the first gate spacer 140. The first gate spacer 140 may entirely contact a perimeter of the end of the first wire pattern 110.

The first gate spacer 140 may include a first outer spacer 141 and a first inner spacer 142. The first inner spacer 142 may be disposed between the first fin-type protruding portion 100P and the first wire pattern 110. Although not illustrated, the width of the first inner spacer 142 in the third direction Y1 may be substantially equal to the width of the first wire pattern 110 in the third direction Y1.

Further, while the first inner spacer 142 and the first outer spacer 141 are illustrated as being positioned on the first wire pattern 110, this is illustrated so only for convenience of explanation and example embodiments are not limited thereto. For example, depending on the structure of the stack to form the first wire pattern 110, only the first outer spacer 141 may be positioned on the first wire pattern 110.

Figure 67A:
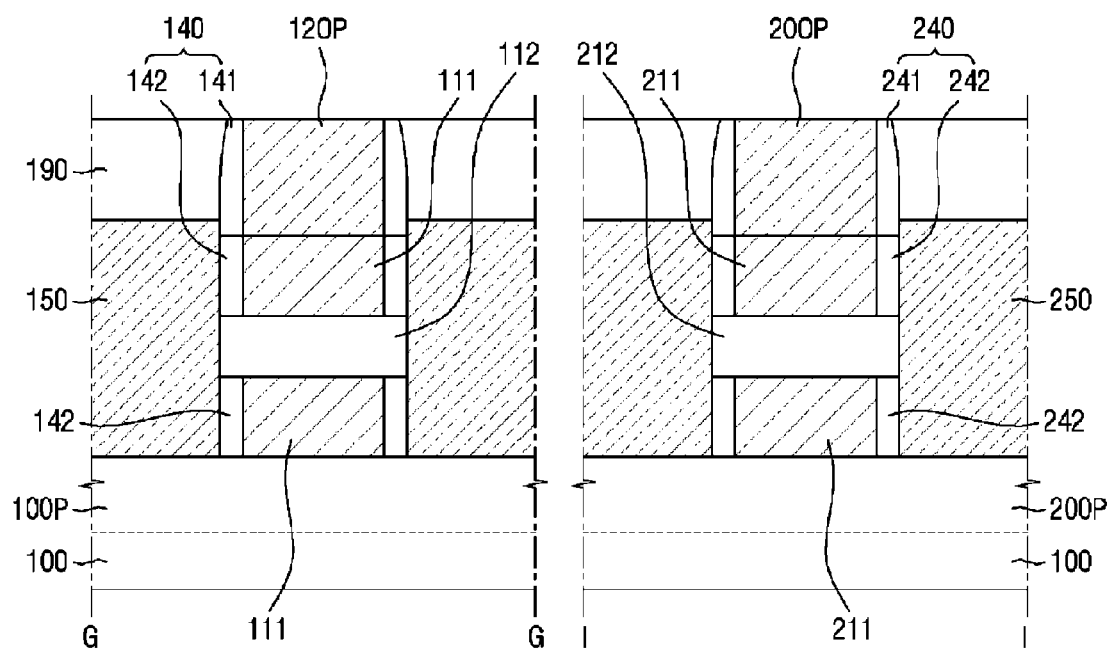

The first outer spacer 141 and the first inner spacer 142 will be understood easily based on the fabricating method exemplified with reference to FIG. 67A.

The second gate spacer 240 may be formed on both sidewalls of the second gate electrode 220 that extend in the fourth direction Y2. The second gate spacer 240 may be formed on both sides of the second wire pattern 210, while facing each other. The second gate spacer 240 may define a second trench 240t that intersects with the second wire pattern 210.

The second gate spacer 240 may be disposed on both ends of the second wire pattern 210. The second gate spacer 240 may include a penetrating portion through which the second wire pattern 210 is passed.

The second wire pattern 210 may be passed through the second gate spacer 240. The second gate spacer 240 may entirely contact a perimeter of the end of the second wire pattern 210.

The second gate spacer 240 may include a second outer spacer 241 and a second inner spacer 242. The second inner spacer 242 may be disposed between the second fin-type protruding portion 200P and the second wire pattern 210. Although not illustrated, the width of the second inner spacer 242 in the fourth direction Y2 may be substantially equal to the width of the second wire pattern 210 in the fourth direction Y2.

Further, while the second inner spacer 242 and the second outer spacer 241 are illustrated as being positioned on the second wire pattern 210, this is illustrated so only for convenience of explanation and example embodiments are not limited thereto. For example, depending on the structure of the stack to form the second wire pattern 210, only the second outer spacer 241 may be positioned on the second wire pattern 210.

The second outer spacer 241 and the second inner spacer 242 will be understood easily based on the fabricating method exemplified with reference to FIG. 67A.

The first outer spacer 141 and the second outer spacer 241 may each include at least one of, for example, silicon nitride (SiN), silicon oxynitride (SiON), silicon dioxide ($SiO_2$), silicon oxycarbonitride (SiOCN), and a combination thereof. The first inner spacer 142 and the second inner spacer 242 may each include at least one of, for example, low-k dielectric material, silicon nitride (SiN), silicon oxynitride (SiON), silicon dioxide ($SiO_2$), silicon oxycarbonitride (SiOCN), and a combination thereof. The low-k dielectric material may be the material that has a lower dielectric constant than the silicon oxide.

The first outer spacer 141 and the first inner spacer 142 may be the same materials or different materials from each other. Further, the first outer spacer 141 and the first inner spacer 142 may be the materials with the same dielectric constant, or materials with different dielectric constants from each other.

Description about the second outer spacer 241 and the second inner spacer 242 may be substantially similar to the description about the first outer spacer 141 and the first inner spacer 142.

For example, the first outer spacer 141 may be formed on an upper surface of the field insulating film 105, and the first inner spacer 142 may not be formed on the upper surface of the field insulating film 105. Moreover, the second outer spacer 241 may be formed on the upper surface of the field insulating film 105, and the second inner spacer 242 may not be formed on the upper surface of the field insulating film 105. An explanation on position of inner and outer spacer will be illustrated based on FIGS. 23 to 25.

The first gate insulating film 130 may be formed along the perimeter of the first wire pattern 110. For example, the first gate insulating film 130 may surround the first wire pattern 110. Further, the first gate insulating film 130 may also be formed on an upper surface of the field insulating film 105 and on the first fin-type protruding portion 100P. The first gate insulating film 130 may extend along an inner sidewall of the first gate spacer 140.

For example, the first gate insulating film 130 may extend along the sidewall and the bottom surface of the first trench 140t, and along the perimeter of the first wire pattern 110.

Although not illustrated, an interfacial film may be formed between the first gate insulating film 130 and the first wire pattern 110, and between the first gate insulating film 130 and the first fin-type protruding portion 100P. Additionally, depending on a method for forming the interfacial film, the interfacial film may be formed with the same profile as the first gate insulating film 130.

The second gate insulating film 230 may be formed along the perimeter of the second wire pattern 210. For example, the second gate insulating film 230 may surround the second wire pattern 210. Further, the second gate insulating film 230 may also be formed on the upper surface of the field insulating film 105 and on the second fin-type protruding portion 200P. The second gate insulating film 230 may extend along an inner sidewall of the second gate spacer 240.

For example, the second gate insulating film 230 may extend along the sidewall and the bottom surface of the second trench 240t, and along the perimeter of the second wire pattern 210.

Although not illustrated, an interfacial film may be formed between the second gate insulating film 230 and the second wire pattern 210, and between the second gate insulating film 230 and the second fin-type protruding portion 200P. Additionally, depending on a method for forming the interfacial film, the interfacial film may be formed with the same profile as the second gate insulating film 230.

The first gate insulating film 130 and the second gate insulating film 230 may each include at least one of silicon oxide, silicon oxynitride, silicon nitride, or a high-k dielectric material with a higher dielectric constant than silicon oxide.

For example, the high-k dielectric material may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

Furthermore, while the high-k dielectric insulating film described above is explained mainly with reference to oxides, there is no limitation thereto. Otherwise, the high-k dielectric insulating film may contain one or more of, for example, a nitride of a metallic material (for example, hafnium nitride) and oxynitride (for example, hafnium oxynitride), but without limitation thereto.

The first gate insulating film 130 and the second gate insulating film 230 may include the same material, or different materials from each other.

In FIGS. 2 and 3, a thickness of the first gate insulating film 130 may be identical to a thickness of the second gate insulating film 230.

The first gate electrode 120 may be disposed between the first gate spacers 140. The first gate electrode 120 may be formed on the first gate insulating film 130. The first gate electrode 120 may fill the first trench 140t.

The first gate electrode 120 may include M metal layers. In this case, M may be a natural number greater than two (2). For example, the first gate electrode 120 may include a first lower gate electrode 122, a first metal oxide film 125, and a first upper gate electrode 124.

The first lower gate electrode 122 may be formed on the first gate insulating film 130. The first lower gate electrode 122 may be formed along the profile of the first gate insulating film 130.

The first lower gate electrode 122 may be formed along the perimeter of the first wire pattern 110. The first lower gate electrode 122 may surround the first gate insulating film 130. Further, the first lower gate electrode 122 may also be formed on an upper surface of the field insulating film 105 and on the first fin-type protruding portion 100P. The first lower gate electrode 122 may extend along an inner sidewall of the first gate spacer 140.

For example, the first lower gate electrode 122 may extend along the sidewall and the bottom surface of the first trench 140t, and along the perimeter of the first wire pattern 110.

The first metal oxide film 125 may be formed on the first lower gate electrode 122. The first metal oxide film 125 may be formed along the profile of the first lower gate electrode 122. For example, the first metal oxide film 125 may be formed along the profile of the first gate insulating film 130.

The first upper gate electrode 124 may be formed on the first metal oxide film 125. The first upper gate electrode 124 may fill the first trench 140t in which the first lower gate electrode 122 and the first metal oxide film 125 are formed.

In FIG. 4, the first gate insulating film 130, the first lower gate electrode 122, the first metal oxide film 125, and the first upper gate electrode 124 may be formed in a sequential order on the first wire pattern 110. The first metal oxide film 125 may be positioned in a boundary between the first lower gate electrode 122 and the first upper gate electrode 124, for example.

The first lower gate electrode 122 may include at least one of, for example, titanium nitride (TiN), tantalum carbide (TaC), tantalum nitride (TaN), tantalum carbonitride (TaCN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbide (TiAlC), titanium aluminum carbonitride (TiAlC—N), titanium carbide (TiC), and a combination of thereof.

While the first lower gate electrode 122 is illustrated as a single film, this is illustrated so only for convenience of explanation and example embodiments are not limited thereto.

The first metal oxide film 125 may include an oxide form of the first lower gate electrode 122. When the first lower gate electrode 122 is a multi-film, the first metal oxide film 125 may include an oxide form of a film of the multi-film that is the most adjacent to the first upper gate electrode 124.

The first upper gate electrode 124 may include at least one of, for example, tungsten (W), aluminum (Al), copper (Cu), cobalt (Co), titanium (Ti), tantalum (Ta), nickel (Ni), platinum (Pt), nickel-platinum (Ni—Pt), poly-Si, SiGe or a metal alloy, but not limited thereto.

In a semiconductor device according to some example embodiments, the first metal oxide film 125 may be formed inside the first gate electrode 120. The first metal oxide film 125 may not be formed in a boundary between the first gate electrode 120 and the first gate insulating film 130.

The second gate electrode 220 may be disposed between the second gate spacers 240. The second gate electrode 220 may be formed on the second gate insulating film 230. The second gate electrode 220 may fill the second trench 240t.

The second gate electrode 220 may include N metal layers. In this case, N may be a natural number greater than two (2). For example, the second gate electrode 220 may include a second lower gate electrode 222, and a second upper gate electrode 224.

The second lower gate electrode 222 may be formed on the second gate insulating film 230. The second lower gate electrode 222 may be formed along the profile of the second gate insulating film 230.

The second lower gate electrode 222 may be formed along the perimeter of the second wire pattern 210. The second lower gate electrode 222 may surround the second gate insulating film 230. Further, the second lower gate electrode 222 may also be formed on an upper surface of the field insulating film 105 and on the second fin-type protruding portion 200P. The second lower gate electrode 222 may extend along an inner sidewall of the second gate spacer 240.

For example, the second lower gate electrode 222 may extend along the sidewall and the bottom surface of the second trench 240t, and along the perimeter of the second wire pattern 210.

The second upper gate electrode 224 may be formed on the second lower gate electrode 222. The second upper gate electrode 224 may fill the second trench 240t in which the second lower gate electrode 222 is formed.

The second gate electrode 220 may not include a metal oxide film in the second gate electrode 220. The second gate electrode 220 may not include a metal oxide film at a region other than a boundary between the second gate electrode 220 and the second gate insulating film 230.

The second lower gate electrode 222 may include at least one of, for example, titanium nitride (TiN), tantalum carbide (TaC), tantalum nitride (TaN), tantalum carbonitride (TaCN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbide (TiAlC), titanium aluminum carbonitride (TiAlC—N), titanium carbide (TiC), and a combination of thereof.

While the second lower gate electrode 222 is illustrated as a single film, this is illustrated so only for convenience of explanation and example embodiments are not limited thereto.

The second upper gate electrode 224 may include at least one of, for example, tungsten (W), aluminum (Al), copper (Cu), cobalt (Co), titanium (Ti), tantalum (Ta), nickel (Ni), platinum (Pt), nickel-platinum (Ni—Pt), poly-Si, SiGe or a metal alloy, but not limited thereto.

The first lower gate electrode 122 and the second lower gate electrode 222 may or may not have the same material or the same stack structure as each other. Further, the first upper gate electrode 124 and the second upper gate electrode 224 may or may not include the same material as each other.

For example, the first lower gate electrode 122 and the second lower gate electrode 222 may each include a work function adjustment film that adjusts the work function. The first upper gate electrode 124 and the second upper gate electrode 224 may each play a role of filling the space formed by the first lower gate electrode 122 and the second lower gate electrode 222.

A first source/drain region 150 may be formed on both sides of the first gate electrode 120. A second source/drain region 250 may be formed on both sides of the second gate electrode 220. The first source/drain region 150 and the second source/drain region 250 may each include an epitaxial layer or an epitaxial pattern formed on the first fin-type protruding portion 100P and the second fin-type protruding portion 200P.

The interlayer insulating film 190 may be formed on the substrate 100. The interlayer insulating film 190 may surround an outer sidewall of the first gate spacer 140 that defines the first trench 140t, and an outer sidewall of the second gate spacer 240 that defines the second trench 240t.

In some embodiments, the interlayer insulating film 190 may include at least one of silicon oxide, silicon nitride, silicon oxynitride, and a low-k dielectric material. For example, the low-k dielectric material may include flowable oxide (FOX), Torene silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

It is illustrated in FIG. 2 that the upper surface of the interlayer insulating film 190 of the first region I is disposed on a same plane as the upper surface of the first gate electrode 120, and the upper surface of the interlayer insulating film 190 of the second region II is disposed on a same plane as the upper surface of the second gate electrode 220, but without limitation thereto.

Unlike as illustrated in FIG. 2, a capping pattern may be formed on each upper surface of the first gate electrode 120 and the second gate electrode 220. When the capping pattern is formed, an upper surface of the capping pattern on the first gate electrode 120 may be disposed on a same plane as an upper surface of the interlayer insulating film 190 of the first region I. Likewise, an upper surface of the capping pattern on the second gate electrode 220 may be disposed on a same plane as the upper surface of the interlayer insulating film 190 of the second region II.

The transverse section of the first wire pattern 110 will be described below with reference to FIGS. 5A to 5E. Of course, the description about the first wire pattern 110 is applicable to the second wire pattern 210.

Figure 5A:
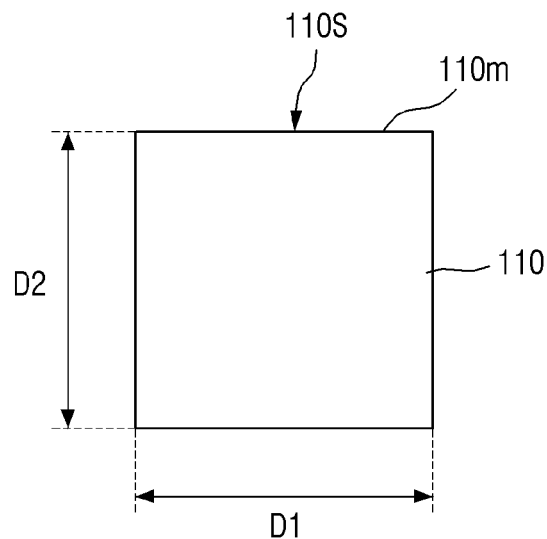
FIGS. 5A to 5E show various cross sectional views of the first wire pattern of FIG. 1 taken on line B-B.
Figure 6A:
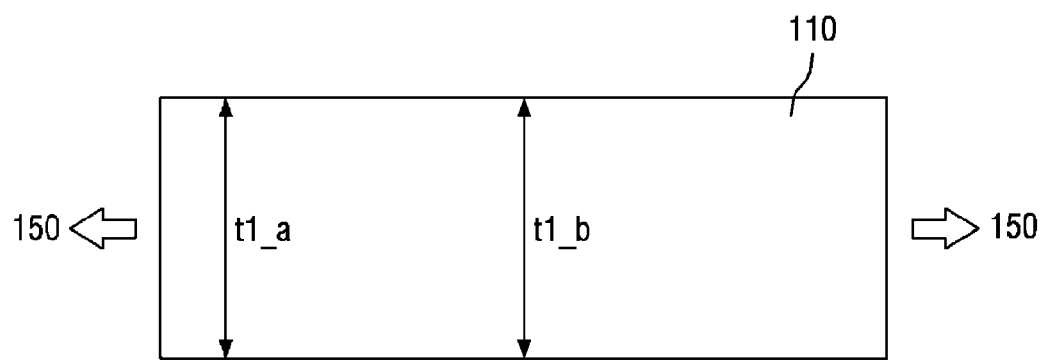
FIGS. 6A to 6C show various cross sectional views of the first wire pattern of FIG. 1 taken on line A-A.
Figure 6B:
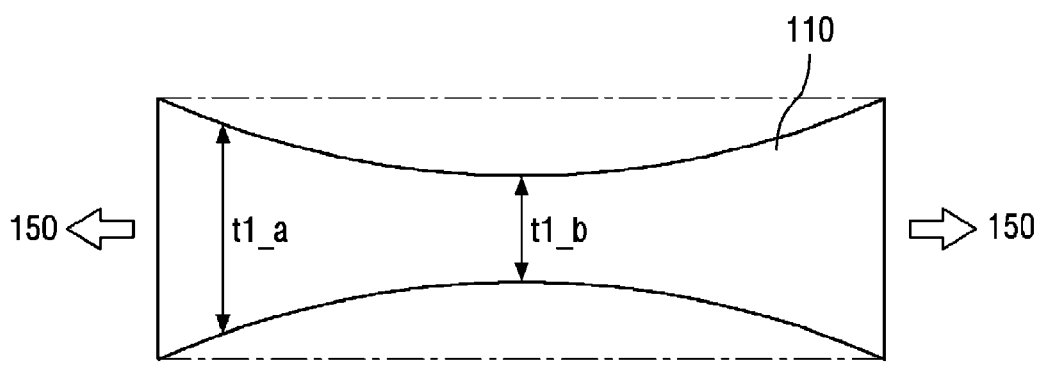
Figure 6C:
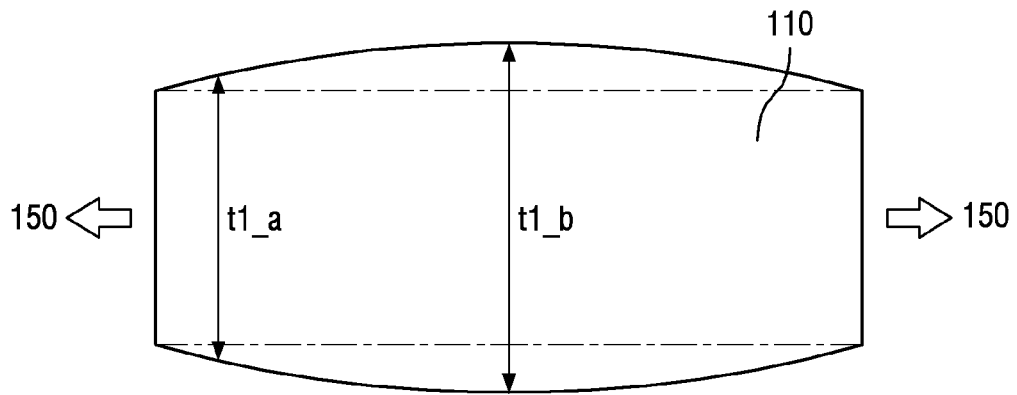

Referring to FIG. 5A, the transverse section 110s of the first wire pattern 110 may be a figure having a combination of straight lines 110m. The transverse section 110s of the first wire pattern 110 may be a rectangle, for example. Regarding the transverse section 110s of the first wire pattern 110, the width D1 of the first wire pattern 110 and the height D2 of the first wire pattern 110 may be equal to each other. More specifically, the transverse section 110s of the first wire pattern 110 may be a square, but not limited thereto.

Figure 5B:
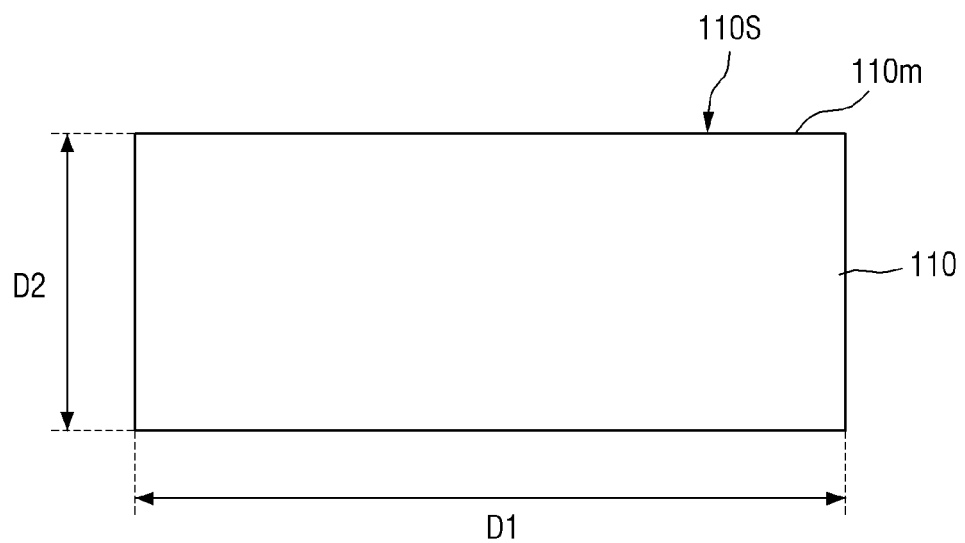

Referring to FIG. 5B, in the cross-section 110s of the first wire pattern 110, unlike in FIG. 5A, the width D1 of the first wire pattern 110 and the height D2 of the first wire pattern 110 may be different from each other. More specifically, the transverse section 110s of the first wire pattern 110 may be an oblong, but not limited thereto.

Figure 5C:
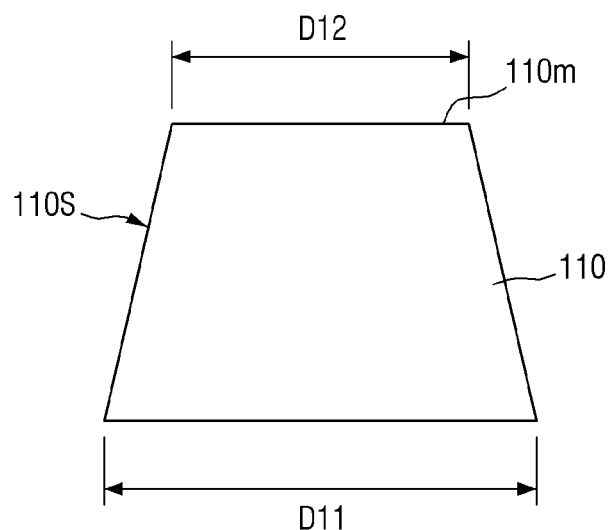

Referring to FIG. 5C, in the cross-section 110s of the first wire pattern 110, unlike in FIG. 5A, a width D11 of one side of the first wire pattern 110 and a width D12 of another side of the first wire pattern 110 facing each other may be different to each other. More specifically, the transverse section 110s of the first wire pattern 110 may be a trapezoid, but without limitation thereto.

Figure 5D:
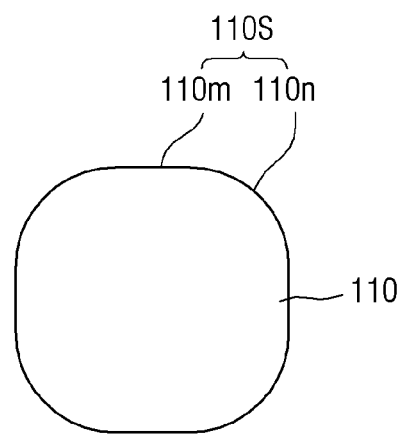

Unlike FIG. 5A, the transverse section 110s of the first wire pattern 110 in FIG. 5D may be a figure having a combination of straight lines 110m and curved lines 110n. The transverse section 110s of the first wire pattern 110 may be a rectangle with round corners, for example.

Figure 5E:
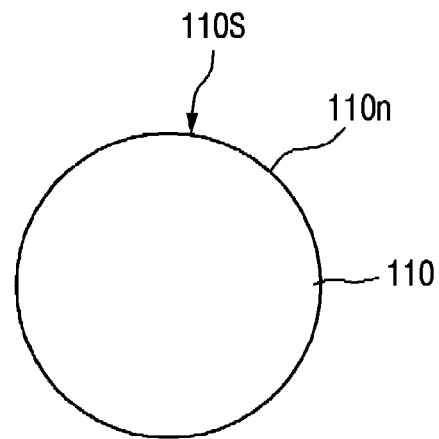

Unlike FIG. 5A, the transverse section 110s of the first wire pattern 110 in FIG. 5E may be a figure having a combination of curved lines 110n.

In FIGS. 5A to 5E, the transverse section 110s of the first wire pattern 110 may be one of a figure having a combination of straight lines, a figure having a combination of straight lines and curve lines, and a figure having a combination of curved lines.

The longitudinal section of the first wire pattern 110 will be described below with reference to FIGS. 6A to 6C. Of course, the description about the first wire pattern 110 is applicable to the second wire pattern 210.

In FIG. 6A, the thickness of the first wire pattern 110 may be substantially the same with the increasing distance from the first source/drain region 150 and the first gate spacer 140. For example, the thickness t1_a of the end portion of the first wire pattern 110 adjacent to the first source/drain region 150 may be substantially equal to the thickness t1_b of the middle portion of the first wire pattern 110.

In FIG. 6B, the thickness of the first wire pattern 110 may decrease as the distance from the first source/drain region 150 and the first gate spacer 140 increases. For example, the thickness t1_a of the end portion of the first wire pattern 110 adjacent to the first source/drain region 150 may be greater than the thickness t1_b of the middle portion of the first wire pattern 110.

In FIG. 6C, the thickness of the first wire pattern 110 may increase as the distance from the first source/drain region 150 and the first gate spacer 140 increases. For example, the thickness t1_a of the end portion of the first wire pattern 110 adjacent to the first source/drain region 150 may be less than the thickness t1_b of the middle portion of the first wire pattern 110.

Referring to FIG. 6B and FIG. 6C, a thickness of the first wire pattern 110 may continuously change as it gets farther away from the first source/drain region 150 and the first gate spacer 140.

Figure 7:
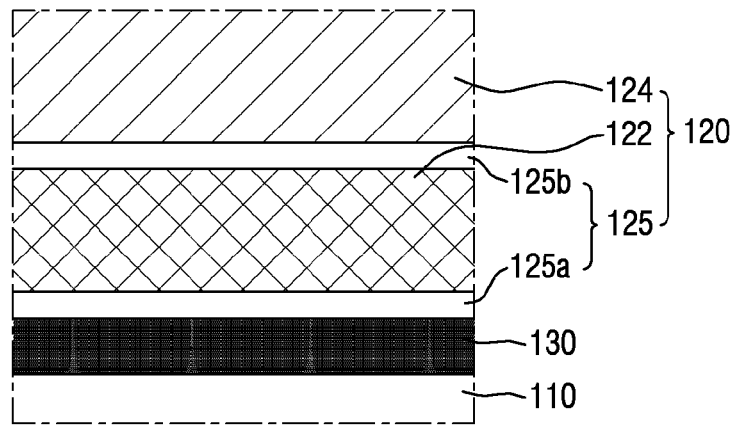
FIG. 7 is a view provided to explain a semiconductor device according to some example embodiments of the present disclosure.
Figure 8:
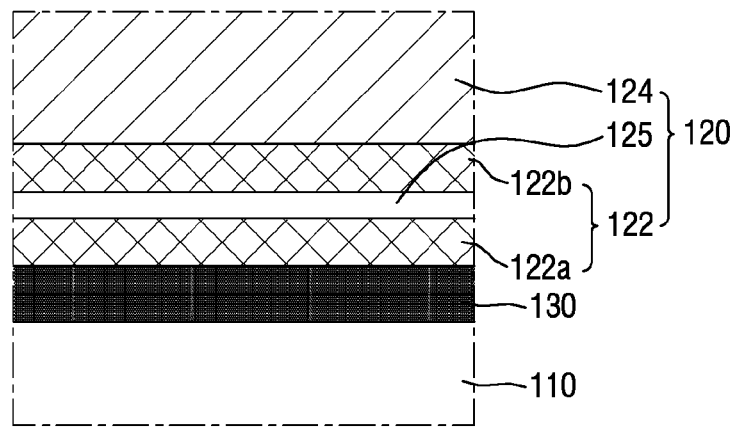
FIG. 8 is a view provided to explain a semiconductor device according to some example embodiments of the present disclosure.
Figure 9:
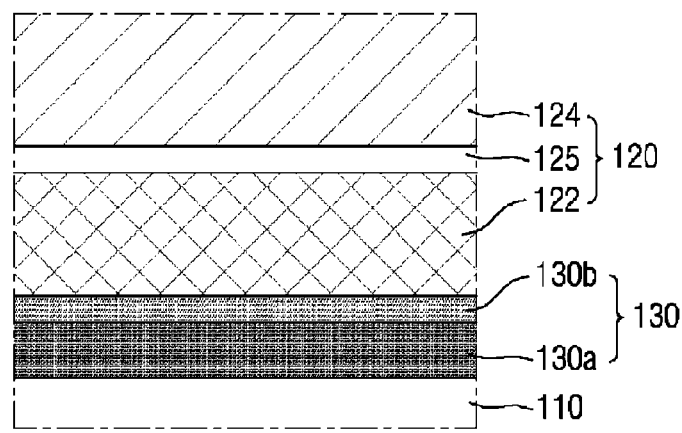
FIG. 9 is a view provided to explain a semiconductor device according to some example embodiments of the present disclosure.

FIG. 7 is a view provided to explain a semiconductor device according to some example embodiments of the present disclosure. FIG. 8 is a view provided to explain a semiconductor device according to some example embodiments of the present disclosure. FIG. 9 is a view provided to explain a semiconductor device according to some example embodiments of the present disclosure. For convenience of explanation, differences that are not explained above with reference to FIGS. 1 to 6C will be mainly explained below.

For reference, FIGS. 7 to 9 are enlarged views of the encircled area O of FIG. 2, respectively. Additionally, it is of course possible that those skilled in the art can easily envisage the cross-sectional views as shown in FIGS. 2 and 3, using the shapes illustrated in FIGS. 7 to 9.

Referring to FIG. 7, in a semiconductor device according to some example embodiments, the first metal oxide film 125 may include a first lower metal oxide film 125a and a first upper metal oxide film 125b that are spaced apart from each other.

The first lower metal oxide film 125a may be positioned in a boundary between the first lower gate electrode 122 and the first gate insulating film 130. The first lower metal oxide film 125a may be in contact with the first gate insulating film 130.

The first lower metal oxide film 125a may include an oxide form of the first lower gate electrode 122. When the first lower gate electrode 122 is a multi-film, the first lower metal oxide film 125a may include an oxide form of a film of the multi-film that is the most adjacent to the first gate insulating film 130.

For example, the metal included in the first lower metal oxide film 125a may be different from the metal included in the first gate insulating film 130. More specifically, the metal included in the first lower metal oxide film 125a may be different from the metal included in the portion of the first gate insulating film 130 that is in contact with the first lower metal oxide film 125a.

The first upper metal oxide film 125b may be positioned in a boundary between the first lower gate electrode 122 and the first upper gate electrode 124, for example. The first upper metal oxide film 125b may include an oxide form of the first lower gate electrode 122.

When the first lower gate electrode 122 is a multi-film, the first upper metal oxide film 125b may include an oxide form of a film of the multi-film that is the most adjacent to the first upper gate electrode 124.

The first lower gate electrode 122 may be positioned between the first lower metal oxide film 125a and the first upper metal oxide film 125b.

In FIG. 7, a portion of the first metal oxide film 125 may not be positioned inside the first gate electrode 120. For example, the first lower metal oxide film 125a may not be positioned inside the first gate electrode 120.

Referring to FIG. 8, in a semiconductor device according to some example embodiments, the first metal oxide film 125 may be positioned inside the first lower gate electrode 122.

More specifically, by the first metal oxide film 125, the first lower gate electrode 122 may be divided into a first portion 122a of the first lower gate electrode and a second portion 122b of the first lower gate electrode.

The first metal oxide film 125 and the first gate insulating film 130 may be spaced apart from each other, as the first portion 122a of the first lower gate electrode is positioned between the first metal oxide film 125 and the first gate insulating film 130.

Further, the first metal oxide film 125 and the first upper gate electrode 124 may be spaced apart from each other, as the second portion 122b of the first lower gate electrode is positioned between the first metal oxide film 125 and the first upper gate electrode 124.

For example, the first metal oxide film 125 may include an oxide form of the first portion 122a of the first lower gate electrode.

The first portion 122a of the first lower gate electrode and the second portion 122b of the first lower gate electrode may include materials same as, or different from each other.

Referring to FIG. 9, in a semiconductor device according to some example embodiments, the first gate insulating film 130 may include a lower portion 130a and an upper portion 130b.

The first gate insulating film 130 may include a metal oxide. For example, the first gate insulating film 130 may include an oxide form of a metal.

The lower portion 130a of the first gate insulating film and the upper portion 130b of the first gate insulating film may include the same metal.

Meanwhile, the fraction of oxygen included in the lower portion 130a of the first gate insulating film may be different from the fraction of oxygen included in the upper portion 130b of the first gate insulating film. For example, the oxygen-to-metal ratio in the lower portion 130a of the first gate insulating film may be different from the oxygen-to-metal ratio in the upper portion 130b of the first gate insulating film.

Figure 10:
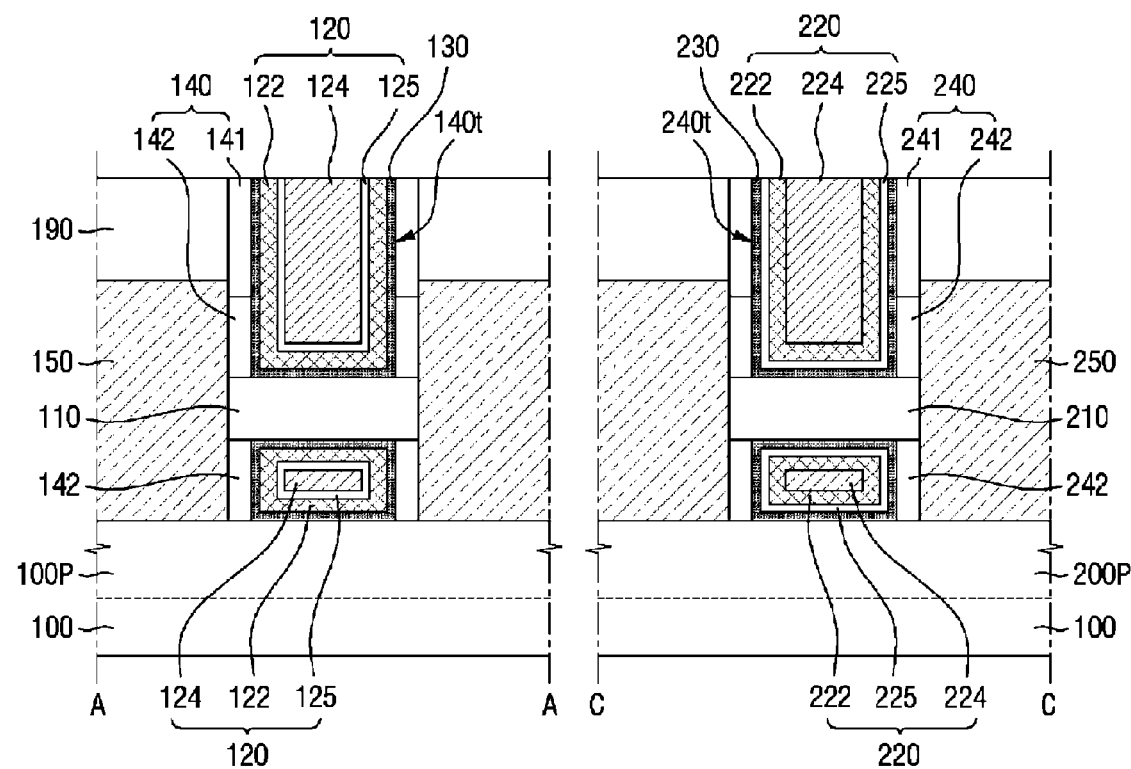
FIGS. 10 and 11 are views provided to explain a semiconductor device according to some example embodiments of the present disclosure.
Figure 11:
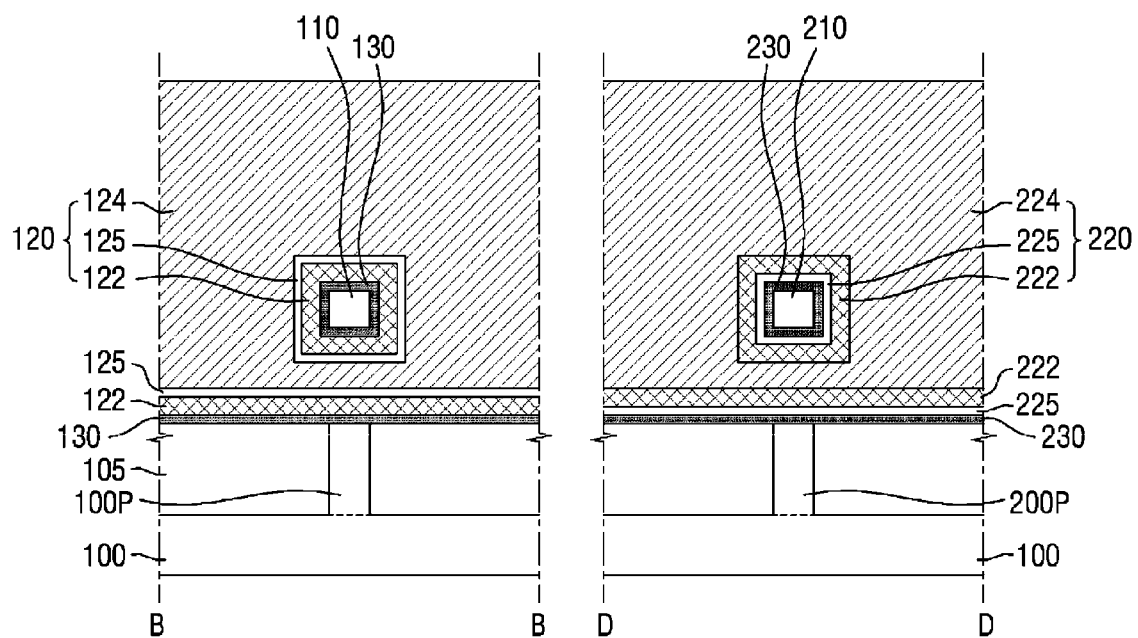

FIGS. 10 and 11 are views provided to explain a semiconductor device according to some example embodiments of the present disclosure. For convenience of explanation, differences that are not explained above with reference to FIGS. 1 to 6C will be mainly explained below.

Referring to FIGS. 10 and 11, in a semiconductor device according to some example embodiments, the second gate electrode 220 may further include a second metal oxide film 225.

The second metal oxide film 225 may be positioned in a boundary between the second lower gate electrode 222 and the second gate insulating film 230. The second metal oxide film 225 may be in contact with the second gate insulating film 230.

The second lower gate electrode 222 and the second upper gate electrode 224 may be formed on the second metal oxide film 225.

The second metal oxide film 225 may include an oxide form of the second lower gate electrode 222. When the second lower gate electrode 222 is a multi-film, the second metal oxide film 225 may include an oxide form of a film of the multi-film that is the most adjacent to the second gate insulating film 230.

For example, the metal included in the second metal oxide film 225 may be different from the metal included in the second gate insulating film 230. More specifically, the metal included in the second metal oxide film 225 may be different from the metal included in the portion of the second gate insulating film 230 that is in contact with the second metal oxide film 225.

In FIG. 11, the second metal oxide film 225 may not be positioned inside the second gate electrode 220. The second metal oxide film 225 may be positioned in a boundary between the second gate electrode 220 and the second gate insulating film 230.

Figure 12:
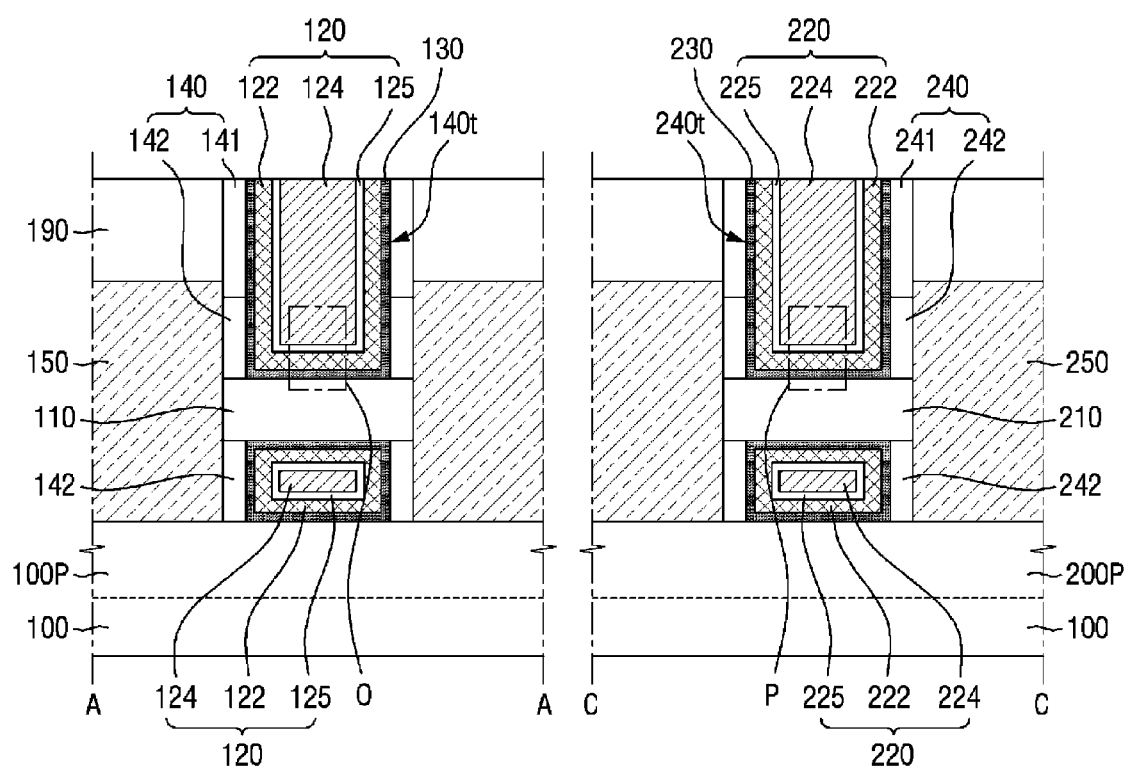
FIGS. 12 and 13 are views provided to explain a semiconductor device according to some example embodiments of the present disclosure.
Figure 13:
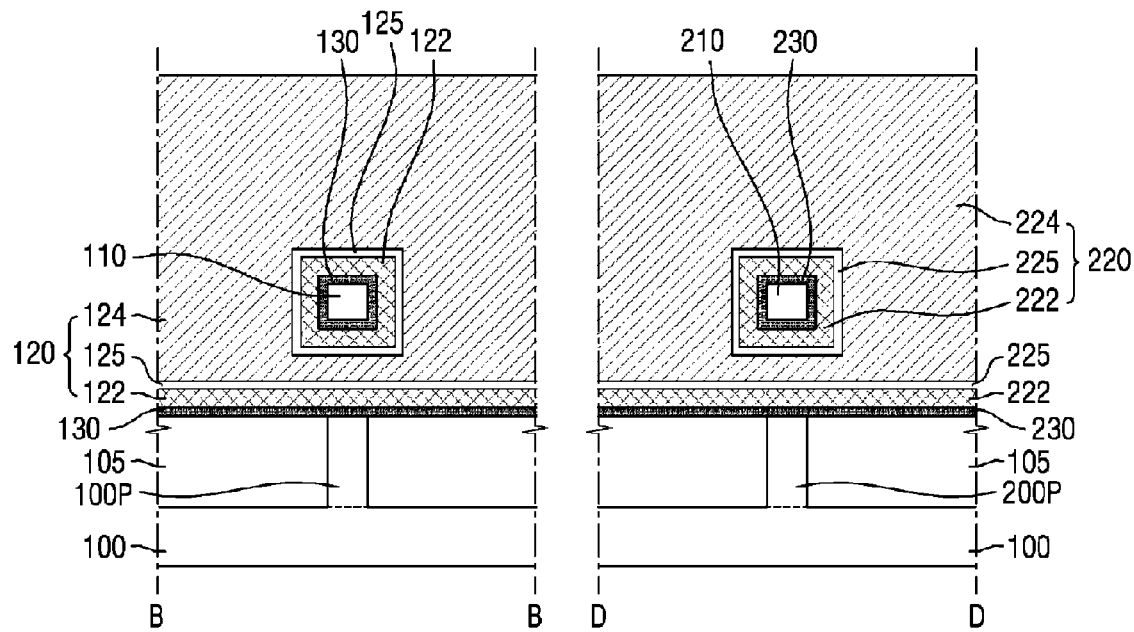
Figure 14:
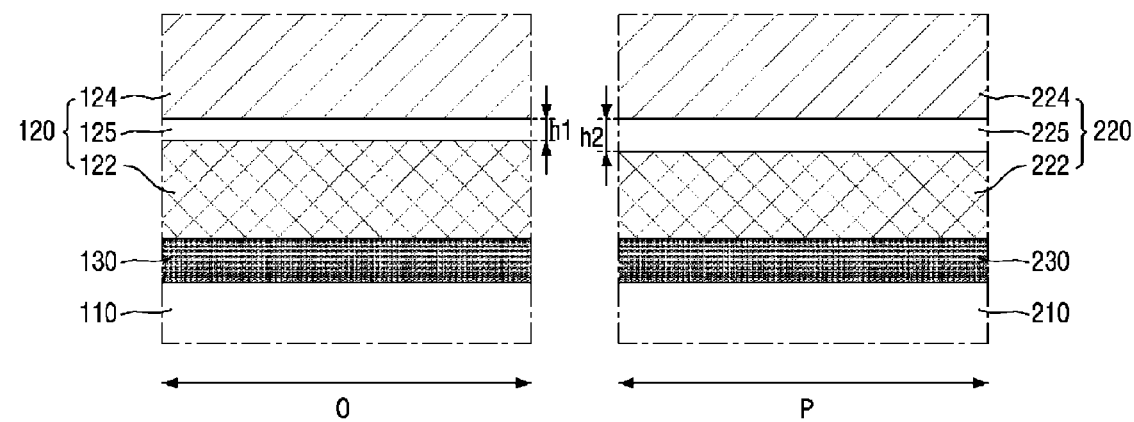
FIG. 14 shows enlarged views of encircled areas O and P of FIG. 12.

FIGS. 12 and 13 are views provided to explain a semiconductor device according to some example embodiments of the present disclosure. FIG. 14 shows enlarged views of encircled areas O and P of FIG. 12. For convenience of explanation, differences that are not explained above with reference to FIGS. 1 to 6C will be mainly explained below.

While the illustration corresponding to the first region in FIGS. 12 and 13 are substantially identical to those described by referring to FIGS. 1 to 4, these are illustrated so only for convenience of explanation and example embodiments are not limited thereto. For example, it is of course possible that the illustrations corresponding to the first region in FIGS. 12 and 13 are the illustrations described with reference to FIGS. 7 to 9.

Referring to FIGS. 12 to 14, in a semiconductor device according to some example embodiments, the second gate electrode 220 may include a second metal oxide film 225 formed inside the second gate electrode 220.

The second metal oxide film 225 may be formed on the second lower gate electrode 222. The second metal oxide film 225 may be formed along the profile of the second lower gate electrode 222. For example, the second metal oxide film 225 may be formed along the profile of the second gate insulating film 230.

The second upper gate electrode 224 may be formed on the second metal oxide film 225. The second upper gate electrode 224 may fill the second trench 240t in which the second lower gate electrode 222 and the second metal oxide film 225 are formed.

As illustrated in FIG. 14, the second gate insulating film 230, the second lower gate electrode 222, the second metal oxide film 225, and the second upper gate electrode 224 may be formed in a sequential order on the second wire pattern 210. The second metal oxide film 225 may be positioned in a boundary between the second lower gate electrode 222 and the second upper gate electrode 224, for example.

The second metal oxide film 225 may include an oxide form of the second lower gate electrode 222. When the second lower gate electrode 222 is a multi-film, the second metal oxide film 225 may include an oxide form of a film of the multiple-film that is the most adjacent to the second upper gate electrode 224.

In FIG. 14, the thickness of the first metal oxide film 125 may be a first thickness h1, and the thickness of the second metal oxide film 225 may be a second thickness h2.

First, when the first lower gate electrode 122 and the second lower gate electrode 222 including the work function adjustment films include the same material or have a stack structure of the same material, the thickness h1 of the first metal oxide film 125 may be different from the thickness h2 of the second metal oxide film 225. By varying the thickness h1 of the first metal oxide film 125 and the thickness h2 of the second metal oxide film 225 from each other, the threshold voltages of the respective semiconductor devices including the first gate electrode 120 and the second gate electrode 220 may be varied.

Next, when the first lower gate electrode 122 and the second lower gate electrode 222 including the work function adjustment films include different materials or have a stack structure of different materials, the thickness h1 of the first metal oxide film 125 may be equal to the thickness h2 of the second metal oxide film 225 or may be different. This is because the materials different from each other provide different sizes of work function adjustment.

Further, since the first metal oxide film 125 includes an oxide form of the first lower gate electrode 122 and the second metal oxide film 225 includes an oxide form of the second lower gate electrode 222, the first metal oxide film 125 may include the same material as the second metal oxide film 225, or may include different material from the second metal oxide film 225.

Figure 15:
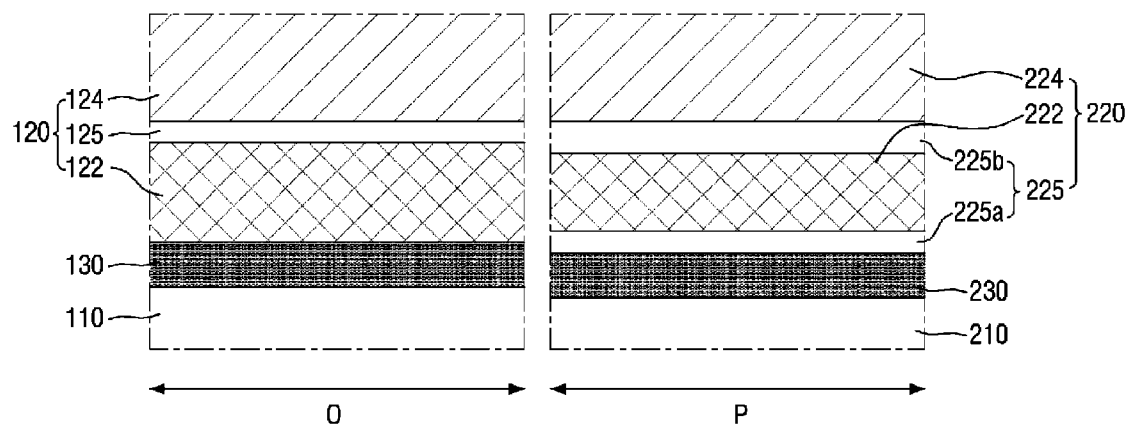
FIG. 15 is a view provided to explain a semiconductor device according to some example embodiments of the present disclosure.
Figure 16:
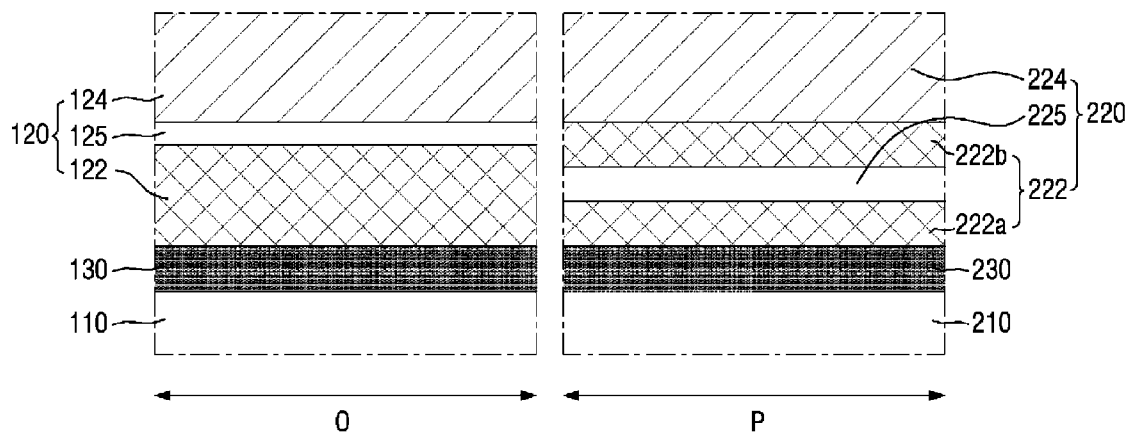
FIG. 16 is a view provided to explain a semiconductor device according to some example embodiments of the present disclosure.

FIG. 15 is a view provided to explain a semiconductor device according to some example embodiments of the present disclosure. FIG. 16 is a view provided to explain a semiconductor device according to some example embodiments of the present disclosure. For convenience of explanation, differences that are not explained above with reference to FIGS. 12 to 14 will be mainly explained below.

For reference, FIGS. 15 and 16 are enlarged views of the encircled areas O and P of FIG. 12, respectively. Additionally, it is of course possible that those skilled in the art can easily envisage the cross-sectional views as shown in FIGS. 12 and 13, using the shapes illustrated in FIGS. 15 and 16.

Referring to FIG. 15, in a semiconductor device according to some example embodiments, the second metal oxide film 225 may include a second lower metal oxide film 225a and a second upper metal oxide film 225b that are spaced apart from each other.

The second lower metal oxide film 225a may be positioned in a boundary between the second lower gate electrode 222 and the second gate insulating film 230. The second lower metal oxide film 225a may be in contact with the second gate insulating film 230.

The second lower metal oxide film 225a may include an oxide form of the second lower gate electrode 222. When the second lower gate electrode 222 is a multi-film, the second lower metal oxide film 225a may include an oxide form of a film of the multi-film that is the most adjacent to the second gate insulating film 230.

For example, the metal included in the second lower metal oxide film 225a may be different from the metal included in the second gate insulating film 230. More specifically, the metal included in the second lower metal oxide film 225a may be different from the metal included in the portion of the second gate insulating film 230 that is in contact with the second lower metal oxide film 225a.

The second upper metal oxide film 225b may be positioned in a boundary between the second lower gate electrode 222 and the second upper gate electrode 224, for example. The second upper metal oxide film 225b may include an oxide form of the second lower gate electrode 222.

When the second lower gate electrode 222 is a multi-film, the second upper metal oxide film 225b may include an oxide form of a film of the multi-film that is the most adjacent to the second upper gate electrode 224.

The second lower gate electrode 222 may be positioned between the second lower metal oxide film 225a and the second upper metal oxide film 225b.

In FIG. 15, a portion of the second metal oxide film 225 may not be positioned inside the second gate electrode 220. For example, the second lower metal oxide film 225a may not be positioned inside the second gate electrode 220.

Referring to FIG. 16, in a semiconductor device according to some example embodiments, the second metal oxide film 225 may be positioned inside the second lower gate electrode 222.

More specifically, by the second metal oxide film 225, the second lower gate electrode 222 may be divided into a first portion 222a of the second lower gate electrode and a second portion 222b of the second lower gate electrode.

The second metal oxide film 225 and the second gate insulating film 230 may be spaced apart from each other, as the first portion 222a of the second lower gate electrode is positioned between the second metal oxide film 225 and the second gate insulating film 230.

Further, the second metal oxide film 225 and the second upper gate electrode 224 may be spaced apart from each other, as the second portion 222b of the second lower gate electrode is positioned between the second metal oxide film 225 and the second upper gate electrode 224.

For example, the second metal oxide film 225 may include an oxide form of the first portion 222a of the second lower gate electrode.

The first portion 222a of the second lower gate electrode and the second portion 222b of the second lower gate electrode may include the same material, or different materials from each other.

Figure 17:
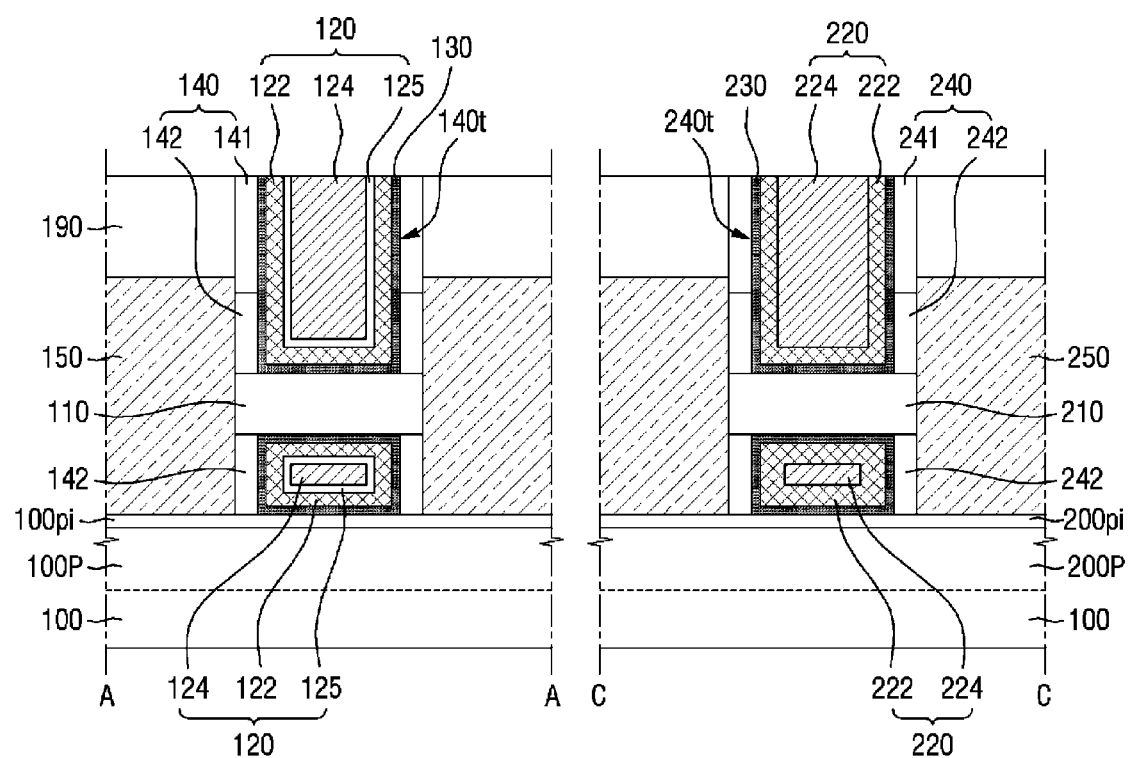
FIGS. 17 and 18 are views provided to explain a semiconductor device according to some example embodiments of the present disclosure.
Figure 18:
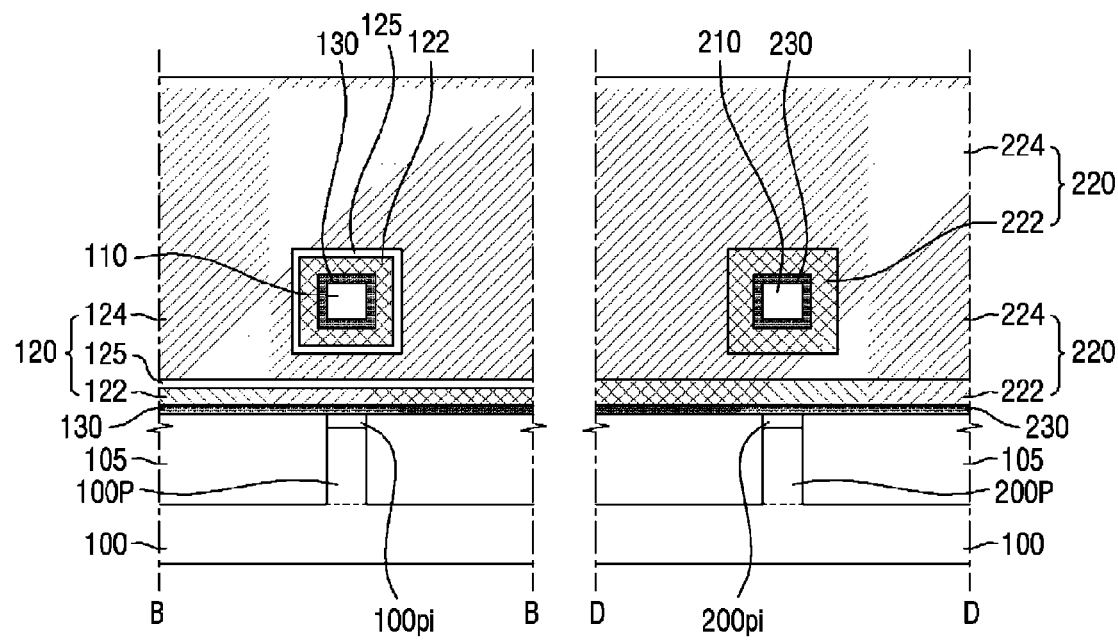

FIGS. 17 and 18 are views provided to explain a semiconductor device according to some example embodiments of the present disclosure. For convenience of explanation, differences that are not explained above with reference to FIGS. 1 to 6C will be mainly explained below.

Referring to FIGS. 17 and 18, a semiconductor device according to some example embodiments may additionally include a first insulating pattern 100pi formed on the first fin-type protruding portion 100P, and a second insulating pattern 200pi formed on the second fin-type protruding portion 200P.

The first insulating pattern 100pi may be formed on an upper surface of the first fin-type protruding portion 100P. The first insulating pattern 100pi may be in contact with the first fin-type protruding portion 100P. The first insulating pattern 100pi may not be formed on an upper surface of the field insulating film 105.

The width of the first insulating pattern 100pi may correspond to the width of the first fin-type protruding portion 100P under the first insulating pattern 100pi.

The second insulating pattern 200pi may be formed on an upper surface of the second fin-type protruding portion 200P. The second insulating pattern 200pi may be in contact with the second fin-type protruding portion 200P. The second insulating pattern 200pi may not be formed on an upper surface of the field insulating film 105.

The width of the second insulating pattern 200pi may correspond to the width of the second fin-type protruding portion 200P under the second insulating pattern 200pi.

The first insulating pattern 100pi and the second insulating pattern 200pi may include an insulating material.

While FIG. 18 exemplifies that the upper surfaces of the first insulating pattern 100pi and the second insulating pattern 200pi are in the same plane as the upper surface of the field insulating film 105, this is illustrated so only for convenience of explanation and the example embodiments are not limited thereto.

While FIG. 18 exemplifies that the first insulating pattern 100pi is formed entirely along the upper surface of the first fin-type protruding portion 100P and the second insulating pattern 200pi is formed entirely along the upper surface of the second fin-type protruding portion 200P, this is illustrated so only for convenience of explanation and the example embodiments are not limited thereto.

For example, the first insulating pattern 100pi may be formed at a portion overlapped with the first gate electrode 120, and not formed at a portion overlapped with the first source/drain region 150. In contrast, the first insulating pattern 100pi may not be formed at a portion overlapped with the first gate electrode 120, but formed at a portion overlapped with the first source/drain region 150.

For example, the first insulating pattern 100pi may be formed at a portion of the upper surface of the first fin-type protruding portion 100P, but not formed at a remaining portion.

Since description of the second insulating pattern 200pi may be substantially similar to that of the first insulating pattern 100pi, it will not be redundantly described below.

Figure 19:
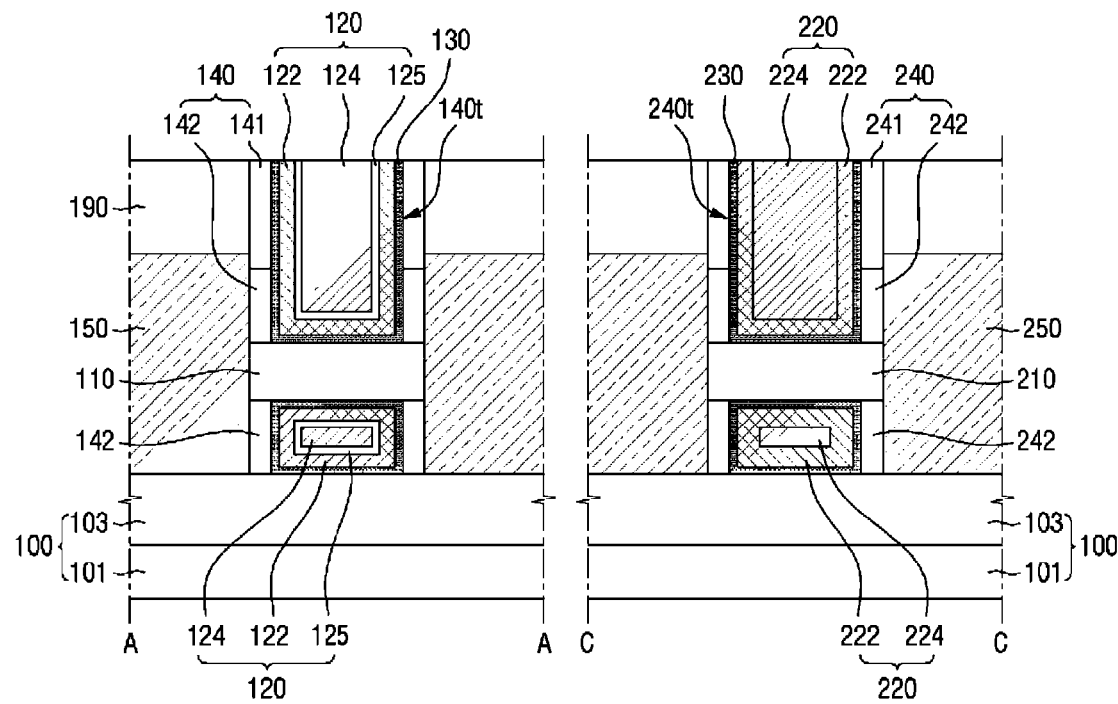
FIGS. 19 and 20 are views provided to explain a semiconductor device according to some example embodiments of the present disclosure.
Figure 20:
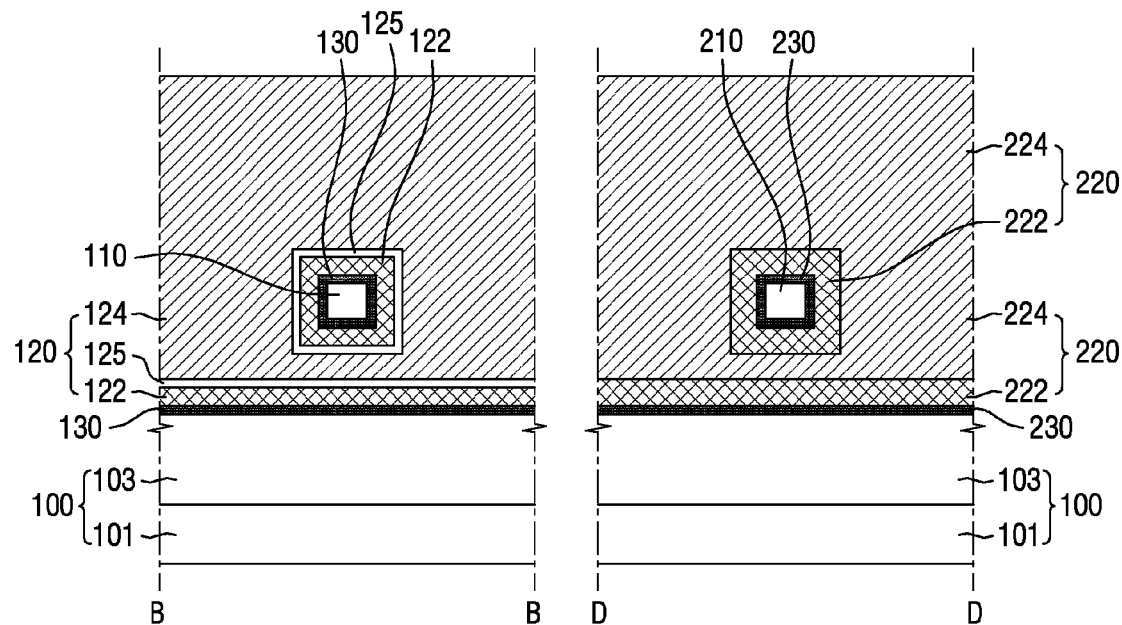

FIGS. 19 and 20 are views provided to explain a semiconductor device according to some example embodiments of the present disclosure. For convenience of explanation, differences that are not explained above with reference to FIGS. 1 to 6C will be mainly explained below.

Referring to FIGS. 19 to 20, in a semiconductor device according to some example embodiments, the substrate 100 may include a lower substrate 101, and an upper substrate 103 formed on one surface of the lower substrate 101.

For example, the lower substrate 101 may be a semiconductor substrate, and the upper substrate 103 may be an insulating film substrate.

The substrate 100 may include a semiconductor substrate, and an insulating film substrate formed on one surface of the semiconductor substrate, and may be, for example, silicon on insulator (SOI) or silicon-germanium on insulator (SGOI), but not limited thereto.

Figure 21:
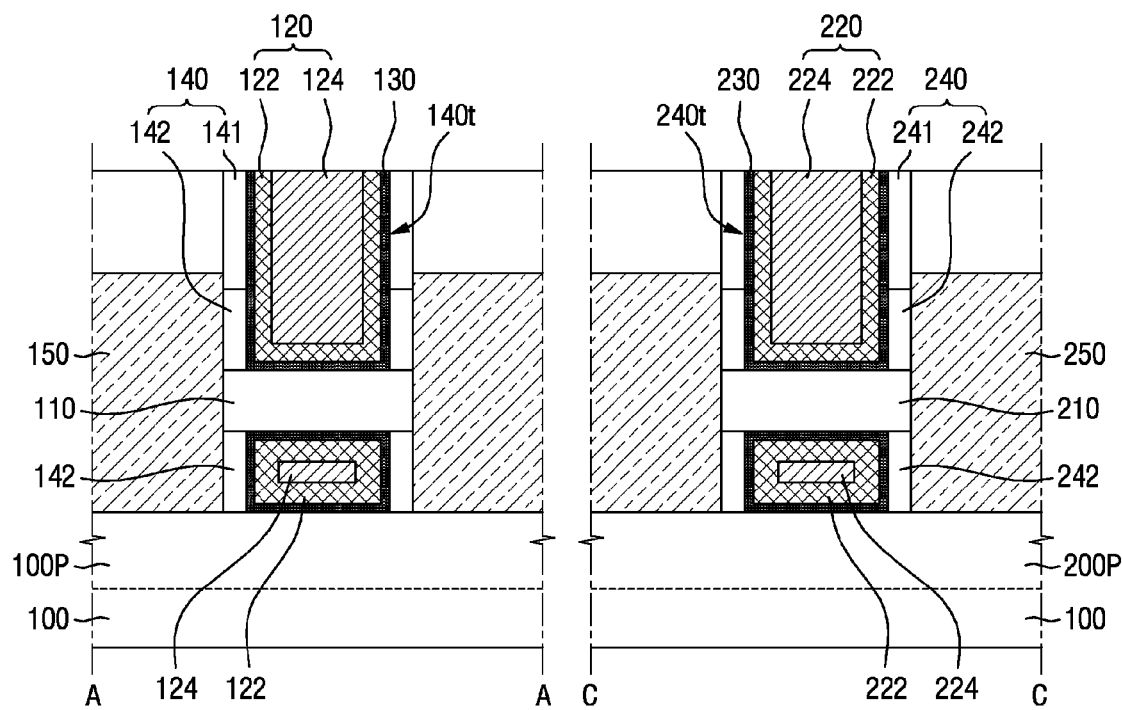
FIG. 21 shows views provided to explain a semiconductor device according to some example embodiments of the present disclosure.

FIG. 21 shows views provided to explain a semiconductor device according to some example embodiments of the present disclosure. For convenience of explanation, differences that are not explained above with reference to FIGS. 1 to 6C will be mainly explained below.

Referring to FIG. 21, in a semiconductor device according to some example embodiments, the first gate electrode 120 may not include a metal oxide film formed inside the first gate electrode 120.

The first gate electrode 120 may include the first lower gate electrode 122 and the first upper gate electrode 124, and the second gate electrode 220 may include the second lower gate electrode 222 and the second upper gate electrode 224.

The first lower gate electrode 122 may include a first work function adjustment film, and the second lower gate electrode 222 may include a second work function adjustment film.

In this case, the first work function adjustment film included in the first lower gate electrode 122 may include a material different from the second work function adjustment film included in the second lower gate electrode 222. For example, using different work function adjustment films for the first region I and the second region II from each other, it is possible to differently adjust the threshold voltages of the semiconductor device formed in the first region I and the semiconductor device formed in the second region II.

Meanwhile, the first gate insulating film 130 may include a different material from the second gate insulating film 230. For example, the first gate insulating film 130 may include an oxide of a first metal, and the second gate insulating film 230 may include an oxide of a second metal that is different from the first metal.

Since the first gate insulating film 130 formed in the first region I includes a different material from the second gate insulating film 230 formed in the second region II, the semiconductor device in the first region I that includes the first gate insulating film 130 may have a different threshold voltage from the semiconductor device in the second region II that includes the second gate insulating film 230.

FIGS. 22 to 25 are views provided to explain a semiconductor device according to some example embodiments. For convenience of explanation, differences that are not explained above with reference to FIGS. 1 to 6C will be mainly explained below.

Figure 22:
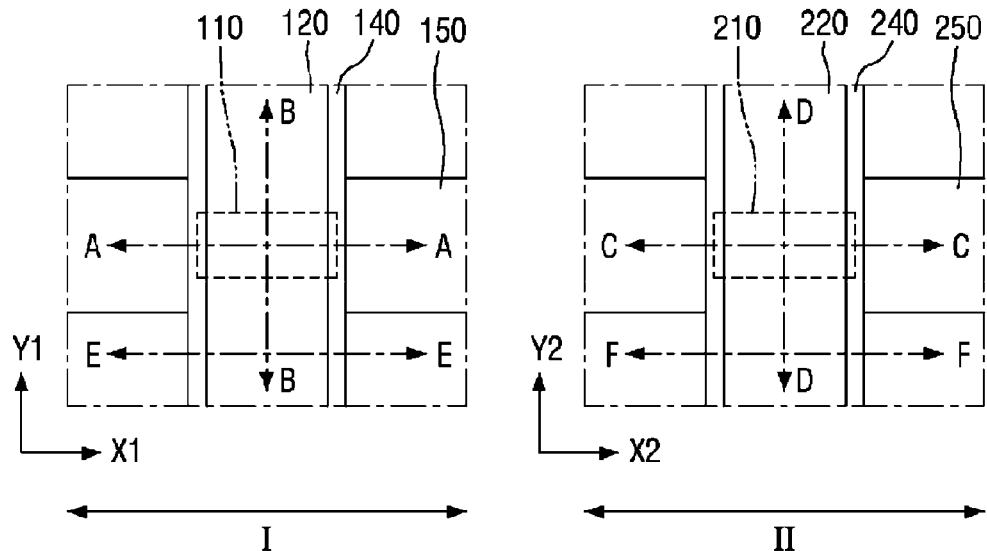
FIGS. 22 to 25 are views provided to explain a semiconductor device according to some example embodiments of the present disclosure.
Figure 23:
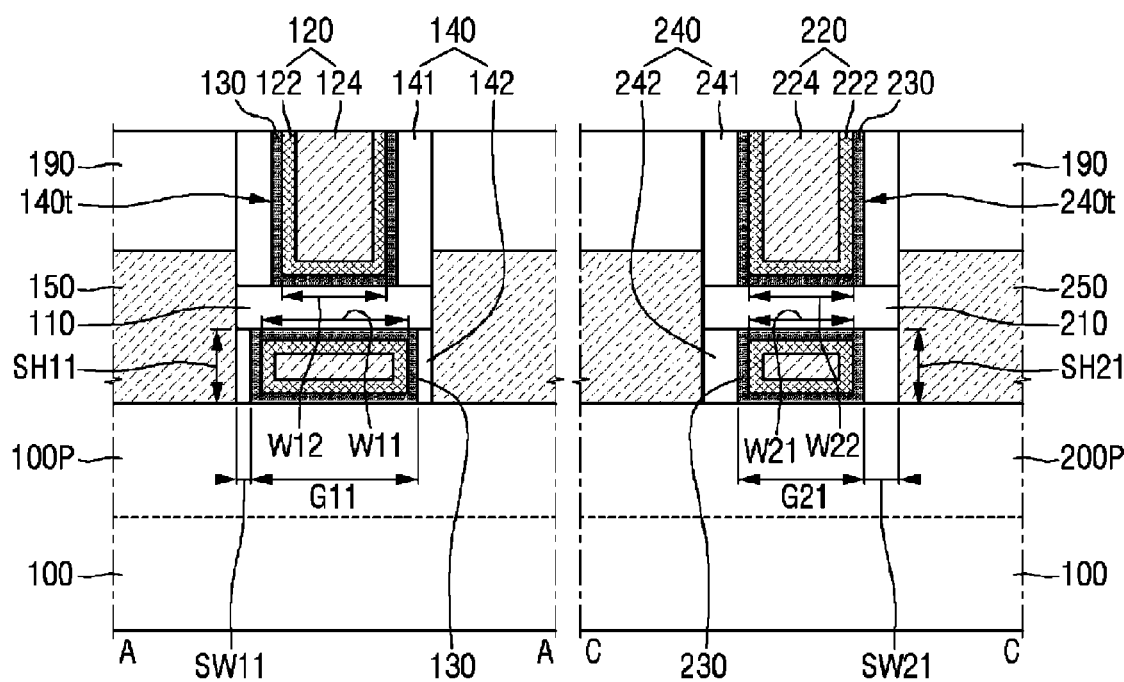
Figure 24:
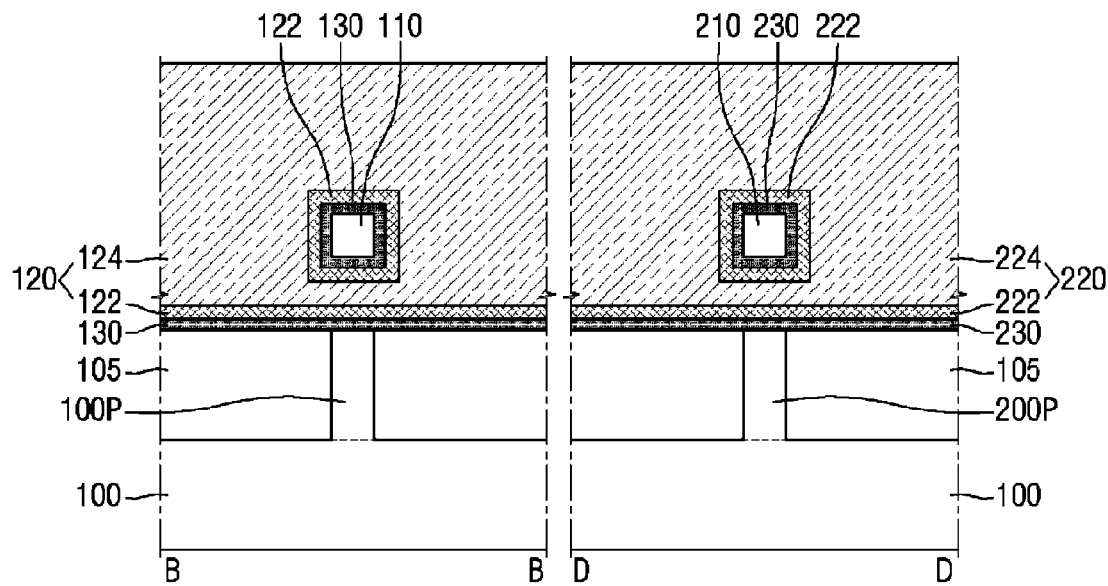
Figure 25:
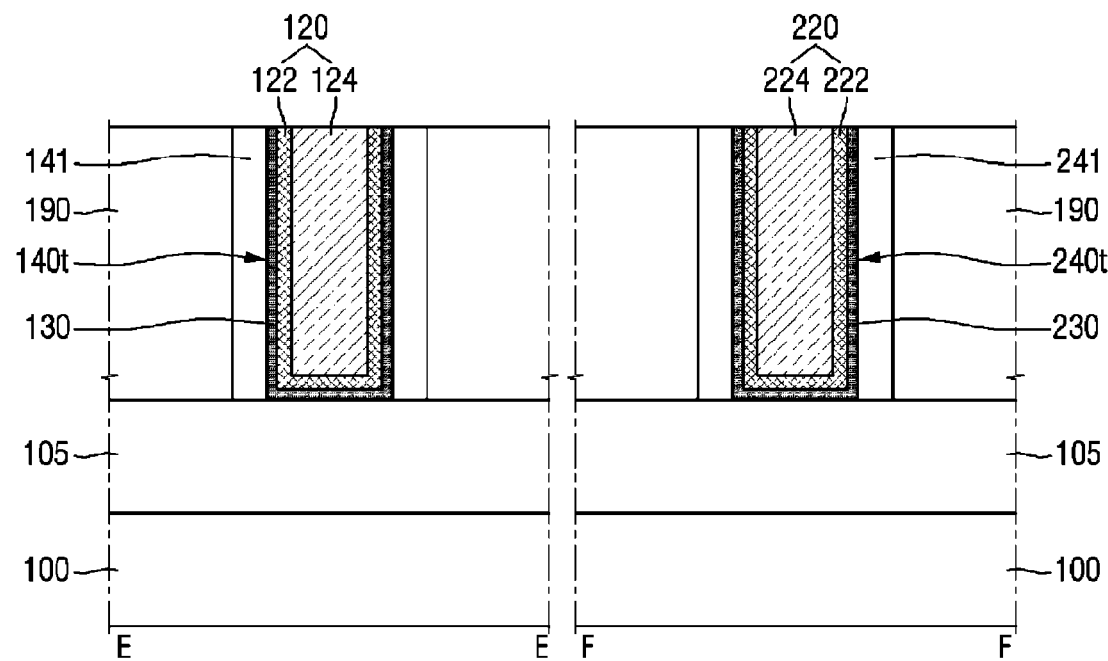

For reference, FIG. 22 is a plane view schematically illustrating a semiconductor device according to some embodiments of the present disclosure. FIG. 23 illustrates a cross-sectional view of FIG. 22 taken on A-A and C-C. FIG. 24 illustrates a cross-sectional view of FIG. 22 taken on B-B and D-D. FIG. 25 illustrates cross-sectional views of FIG. 22 taken on E-E and F-F.

Also, changes of a width of the first gate electrode 120 between the first inner spacers 142 and changes of a width of the second gate electrode 220 between the second inner spacers 242 according to a relationship between the first inner spacer 142 and the second inner spacer 242 will be mainly explained.

In FIG. 23, it assumed the first inner spacer 142 is not disposed on the first wire pattern 110 between the first outer spacer 141 and the first wire pattern 110, and the second inner spacer 242 is not disposed on the second wire pattern 210 between the second outer spacer 241 and the second wire pattern 210.

Referring to FIGS. 22 and 25, in a semiconductor device according to some example embodiments of this disclosure, a width SW11 of the first inner spacers 142 may be different from a width SW21 of the second inner spacers 242.

More specifically, the width SW11 of the first inner spacer 142 disposed between the first gate electrode 120 and the first source/drain region 150 between the first wire pattern 110 and the substrate 100 may be different from the width SW21 of the second inner spacer 242 disposed between the second gate electrode 220 and the second source/drain region 250 between the second wire pattern 210 and the substrate 100.

For example, in FIG. 23, the width SW11 of the first inner spacer 142 between the first wire pattern 110 and the substrate 100 may be smaller than the width SW21 of the second inner spacer 242 between the second wire pattern 210 and the substrate 100.

A distance between outer sidewalls of the first gate spacer 140 facing the first source/drain region 150 may be substantially identical to a distance between outer sidewalls of the second gate spacer 240 facing the second source/drain region 250.

For example, a distance G11 between the first gate spacers 140 between the first wire pattern 110 and the substrate 100 may be different from a distance G21 between the second gate spacers 240 between the second wire pattern 210 and the substrate 100.

More specifically, the distance G11 between the first inner spacers 142 between the first wire pattern 110 and the substrate 100 may be different from the distance G21 between the second inner spacers 242 between the second wire pattern 210 and the substrate 100.

For example, in FIG. 23, the distance G11 between the first gate spacers 140 between the first wire pattern 110 and the substrate 100 may be greater than the distance G21 between the second gate spacers 240 between the second wire pattern 210 and the substrate 100.

On the other hand, a height SH11 of the first gate spacer 140 between the first wire pattern 110 and the substrate 100 may be substantially identical to a height SH21 of the second gate spacer 240 between the second wire pattern 210 and the substrate 100.

The height SH11 of the first inner spacer 142 between the first wire pattern 110 and the substrate 100 may be substantially identical to the height SH21 of the second inner spacer 242 between the second wire pattern 210 and the substrate 100.

Since the distance G11 between the first inner spacers 142 is different from the distance G21 between the second inner spacers 242, a width W11 of the first gate electrode 120 between the first wire pattern 110 and the substrate 100 may be different from a width W21 of the second gate electrode 220 between the second wire pattern 210 and the substrate 100.

Since the distance G11 between the first inner spacers 142 is greater than the distance G21 between the second inner spacers 242, the width W11 of the first gate electrode 120 between the first wire pattern 110 and the substrate 100 may be greater than the width W21 of the second gate electrode 220 between the second wire pattern 210 and the substrate 100.

The width W11 by which the first gate electrode 120 and the first wire pattern 110 overlap each other between the first wire pattern 110 and the substrate 100 may be different from the width W21 by which the second gate electrode 220 and the second wire pattern 210 overlap each other between the second wire pattern 210 and the substrate 100.

For example, the width W11 by which the first gate electrode 120 and the first wire pattern 110 overlap each other between the first wire pattern 110 and the substrate 100 may be greater than the width W21 by which the second gate electrode 220 and the second wire pattern 210 overlap each other between the second wire pattern 210 and the substrate 100.

Meanwhile, in FIG. 23, the first wire pattern 110 may include a first side and a second side facing each other. The first side of the first wire pattern 110 may be closer to the substrate 100 than the second side of the first wire pattern 110.

The width W11 by which the first side of the first wire pattern 110 overlaps the first gate electrode 120 may be different from the width W12 by which the second side of the first wire pattern 110 overlaps the first gate electrode 120.

In FIG. 23, the second wire pattern 210 may include a third side and a fourth side facing each other. The third side of the second wire pattern 210 may be closer to the substrate 100 than the fourth side of the second wire pattern 210.

It is illustrated that the width W21 by which the third side of the second wire pattern 210 and the second gate electrode 220 overlap each other is identical to the width W22 by which the fourth side of the second wire pattern 210 and the second gate electrode 220 overlap each other, but without limitation thereto.

As the width W11 by which the first gate electrode 120 and the first wire pattern 110 overlap each other between the first wire pattern 110 and the substrate 100 is different from the width W21 by which the second gate electrode 220 and the second wire pattern 210 overlap each other between the second wire pattern 210 and the substrate 100, a threshold voltage of the transistor in the first region I may be different from a threshold voltage of the transistor of the second region II.

Based on the aforementioned, by fabricating a semiconductor device having various threshold voltages, it is possible to improve the performance of the semiconductor device.

In FIGS. 23 and 25, the first inner spacer 142 may be formed in a position where it may vertically overlap the first wire pattern 110 and/or the first fin-type protruding portion 100P. The first inner spacer 142 may not be formed on the field insulating film 105 not overlapping the first wire pattern 110 and/or the first fin-type protruding portion 100P.

Further, the second inner spacer 242 may be formed in a position where it may vertically overlap the second wire pattern 210 and/or the second fin-type protruding portion 200P. On the field insulating film 105 not overlapping the second wire pattern 210 and/or the second fin-type protruding portion 200P, the second inner spacer 242 may not be formed.

For example, the first outer spacer 141 and the second outer spacer 241 are formed on the upper surface of the field insulating film 105.

In the semiconductor devices explained with reference to FIGS. 1 to 6C, the first outer spacer 141 and the second outer spacer 241 may be formed on the upper surface of the field insulating film 105. But, the first inner spacer 142 and the second inner spacer 242 may not be formed on the upper surface of the field insulating film 105.

Furthermore, the first gate electrode 120 may or may not include the first metal oxide film 125. And, the second gate electrode 220 may or may not include a second metal oxide film 225.

Figure 26:
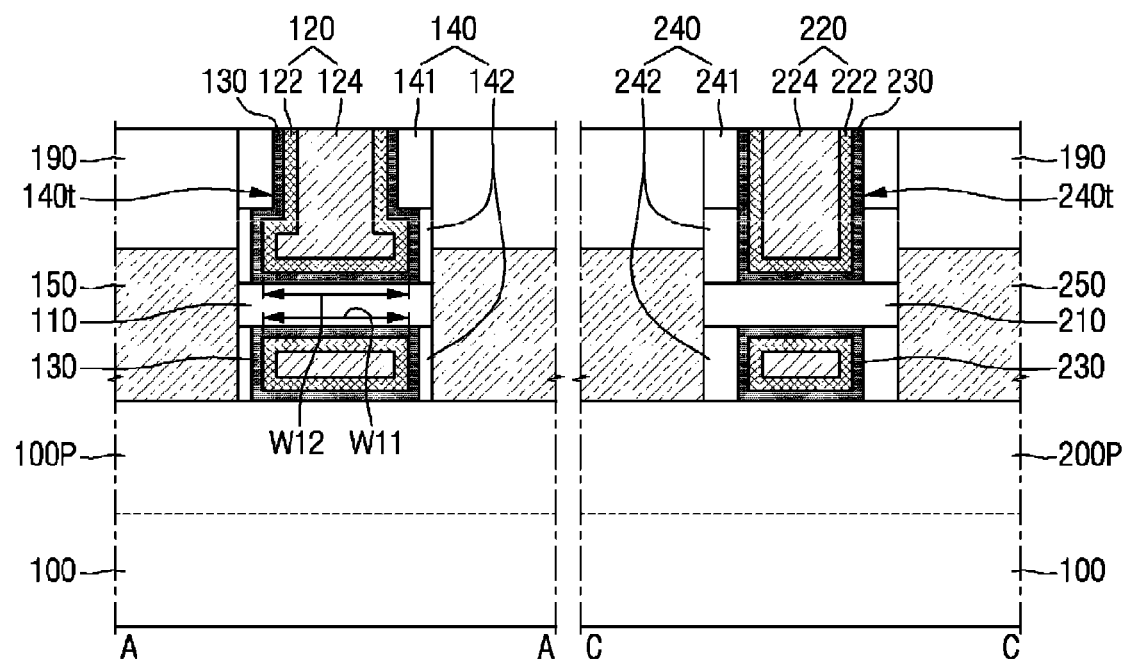
FIG. 26 shows views provided to explain a semiconductor device according to some example embodiments of the present disclosure.
Figure 27:
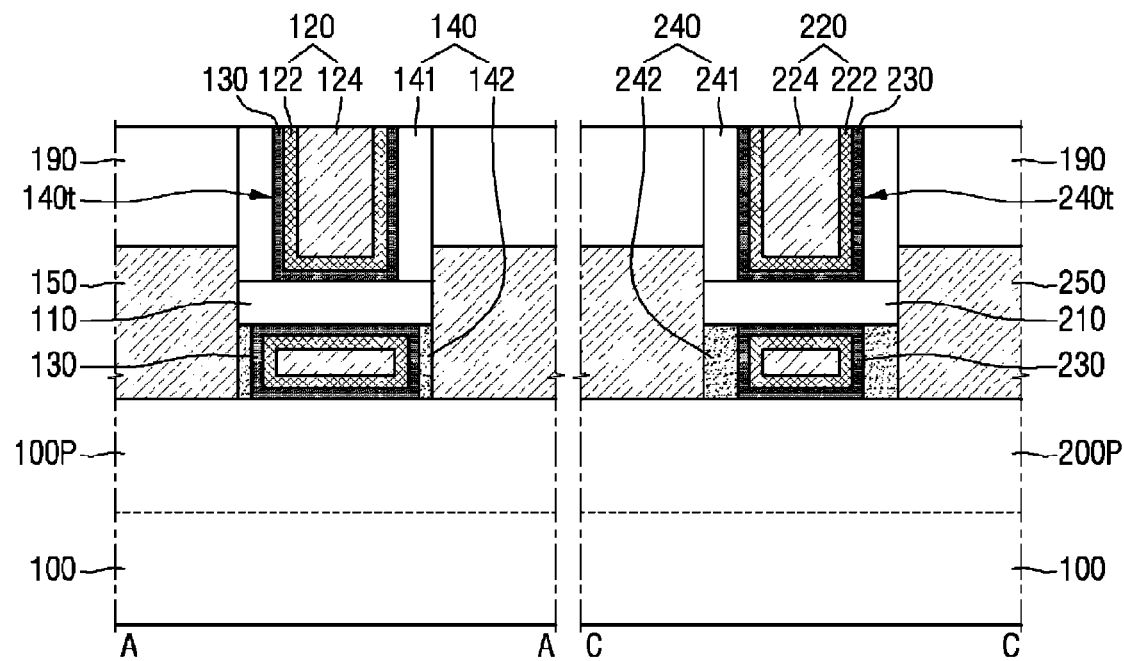
FIG. 27 shows views provided to explain a semiconductor device according to some example embodiments of the present disclosure.
Figure 28:
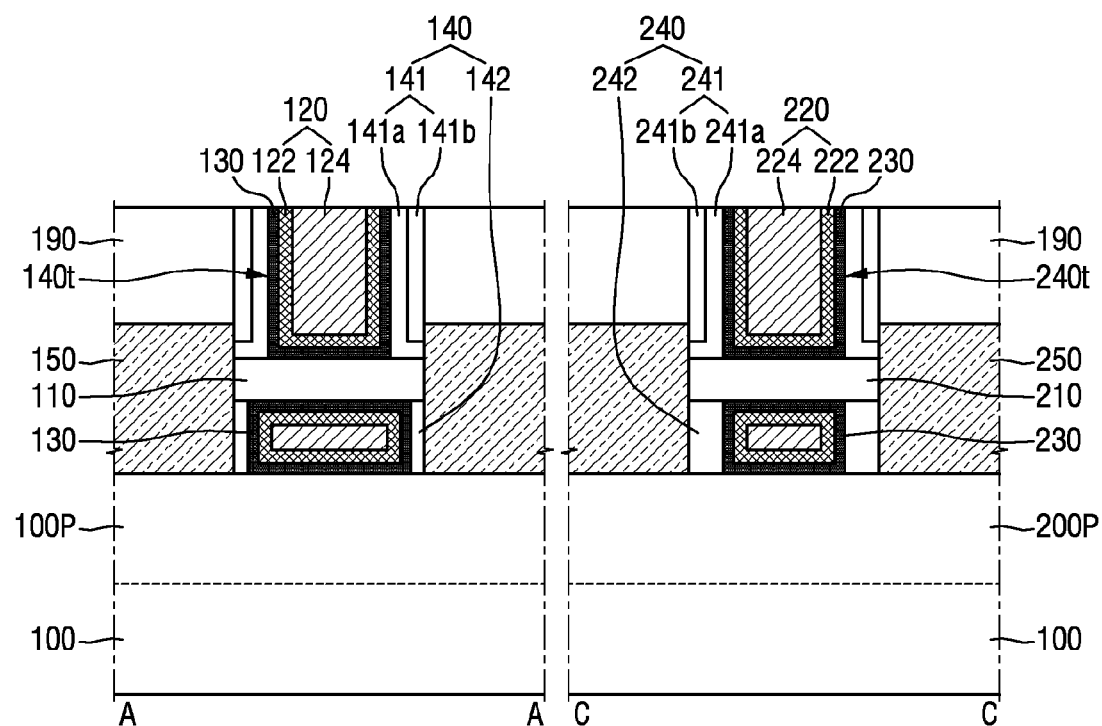
FIG. 28 shows views provided to explain a semiconductor device according to some example embodiments of the present disclosure.

FIG. 26 is a view of a semiconductor device according to some embodiments of the present disclosure. FIG. 27 is a view of a semiconductor device according to some embodiments of the present disclosure. FIG. 28 is a view of a semiconductor device according to some embodiments of the present disclosure. For convenience of explanation, differences that are not explained above with reference to FIGS. 22 to 25 will be mainly explained below.

Referring to FIG. 26, in a semiconductor device according to some embodiments of the present disclosure, a first inner spacer 142 may be further formed on the first wire pattern 110, and a second inner spacer 242 may be further formed on the second wire pattern 210.

For example, a width of the first inner spacer 142 on the first wire pattern 110 may be identical to a width of the first inner spacer 142 between the first wire pattern 110 and the substrate 100.

Furthermore, a width of the second inner spacer 242 on the second wire pattern 210 may be identical to a width of the second inner spacer 242 between the second wire pattern 210 and the substrate 100.

The first wire pattern 110 may include a first side and a second side that face each other. The first side of the first wire pattern 110 may be closer to the substrate 100 than the second side of the first wire pattern 110.

In FIG. 26, a width W11 of the first side of the first wire pattern 110 and the first gate electrode 120 overlapping each other may be substantially identical to a width W12 of the second side of the first wire pattern 110 and the first gate electrode 120 overlapping each other.

In the case where the width of the first inner spacers 142 on the first wire pattern 110 is different from the width of the first inner spacer 142 between the first wire pattern 110 and the substrate 100, the width W11 by which the first side of the first wire pattern 110 and the first gate electrode 120 overlap each other may be different from the width W12 by which the second side of the first wire pattern 110 and the first gate electrode 120 overlap each other.

Referring to FIG. 27, in a semiconductor device according to some embodiments of the present disclosure, the first inner spacer 142 may contain a material different from the first outer spacer 141. Furthermore, the second inner spacer 242 may contain a material different from the second outer spacer 241.

Each of the first outer spacer 141 and the second outer spacer 241 may contain at least one of, for example, silicon nitride (SiN), silicon oxynitride (SiON), silicon oxide (SiO2), silicon oxycarbonitride (SiOCN), and a combination thereof.

Each of the first inner spacer 142 and the second inner spacer 242 may contain at least one of a low-k dielectric material, silicon nitride (SiN), silicon oxy-nitride (SiON), silicon oxide (SiO2), silicon oxycarbonitride (SiOCN), silicon boron nitride (SiBN), silicon oxy-boronnitride (SiOBN), silicon oxy-carbide (SiOC), and a combination thereof. The low-k dielectric material may be, for example, a material having a lower dielectric constant than silicon oxide.

Otherwise, each of the first inner spacer 142 and the second inner spacer 242 may contain a material made of silicon (Si), and at least one element selected from the group consisting of carbon (C), nitrogen (N), oxygen (O), and hydrogen (H).

For example, assuming that the dielectric constant of the material included in the first outer spacer 141 is a first dielectric constant and the dielectric constant of the material included in the first inner spacer 142 is a second dielectric constant, the first dielectric constant and the second dielectric constant may be different from each other.

For example, the first dielectric constant of the material included in the first outer spacer 141 may be greater than the second dielectric constant of the material included in the first inner spacer 142. By adjusting the second dielectric constant to be smaller than the first dielectric constant, it is possible to reduce the fringing capacitance between the first gate electrode 120 and the first source/drain region 150.

Referring to FIG. 28, in a semiconductor device according to some embodiments of the present disclosure, the first outer spacer 141 may include a first spacer film 141a and a second spacer film 141b, and the second outer spacer 241 may include a third spacer film 241a and a fourth spacer film 241b.

However, each of the first inner spacer 142 and the second inner spacer 242 may be a single-layered film.

For example, each of the first spacer film 141a and the third spacer film 241a may have a letter 'L' form. For example, at least one film of the first outer spacer 141 and the second outer spacer 241 that are made of multiple films may have the letter 'L' form.

Furthermore, at least one film of the first outer spacer 141 and the second outer spacer 241 made of multiple-layered films may contain a silicon oxy-carbonitride.

Unlike the illustration in FIG. 28, each of the first inner spacer 142 and the second inner spacer 242 may be a multiple-layered film. In this case, the number of films constituting the first outer spacer 141 and the number of films constituting the first inner spacer 142 may be different from each other. Furthermore, the number of the films constituting the second outer spacer 241 and the number of the films constituting the second inner spacer 242 may be different from each other.

Figure 29:
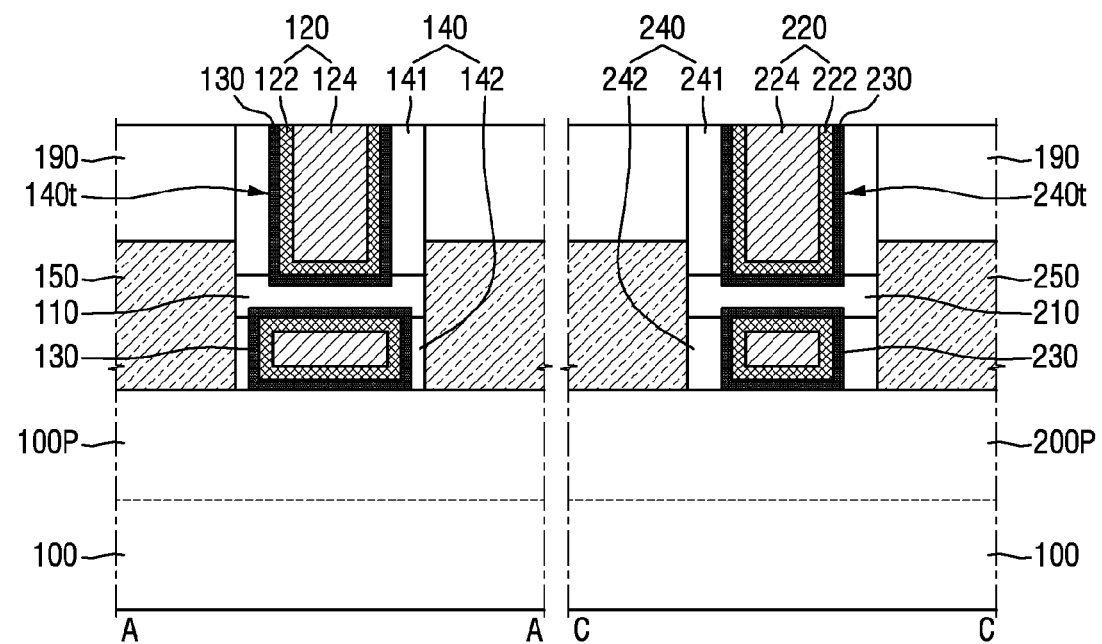
FIG. 29 shows views provided to explain a semiconductor device according to some example embodiments of the present disclosure.
Figure 30A:
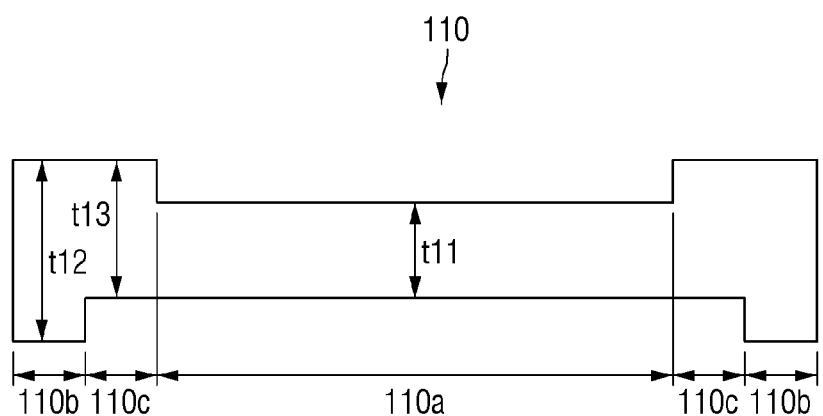
FIGS. 30A and 30B are example views of a first wire pattern of FIG. 29.
Figure 30B:
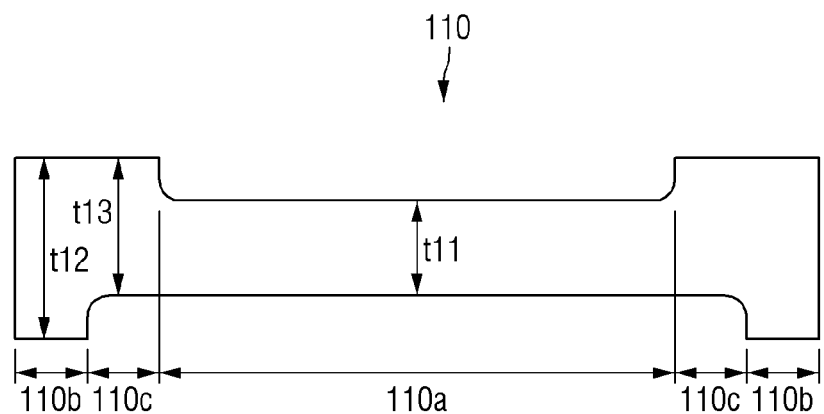
Figure 31:
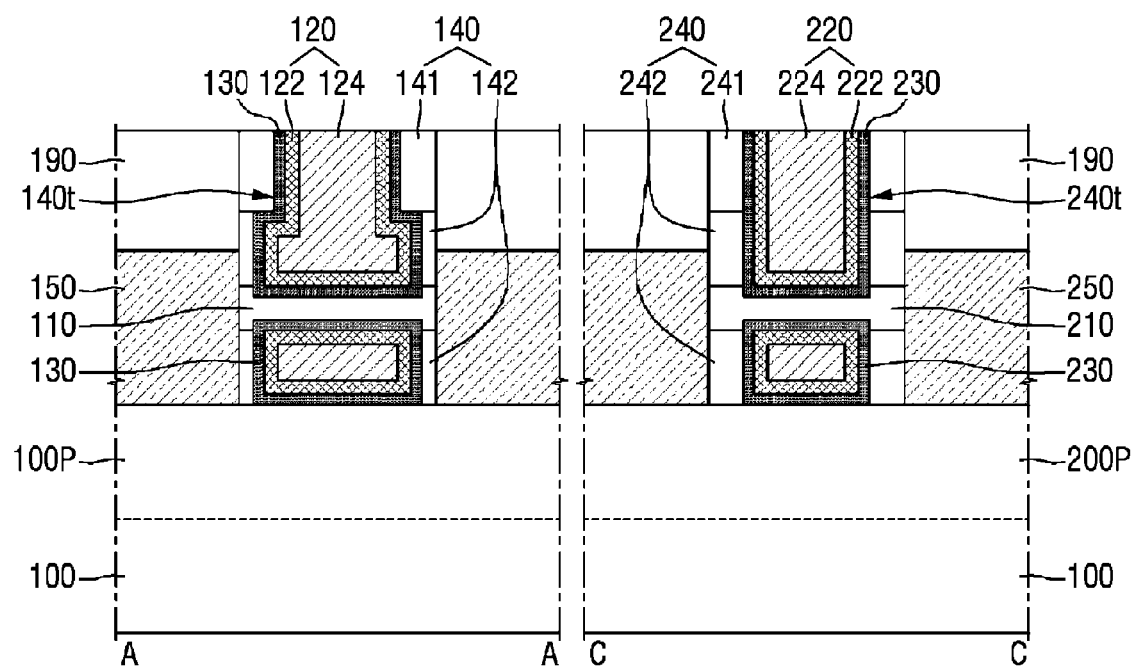
FIG. 31 shows views provided to explain a semiconductor device according to some example embodiments of the present disclosure.
Figure 32:
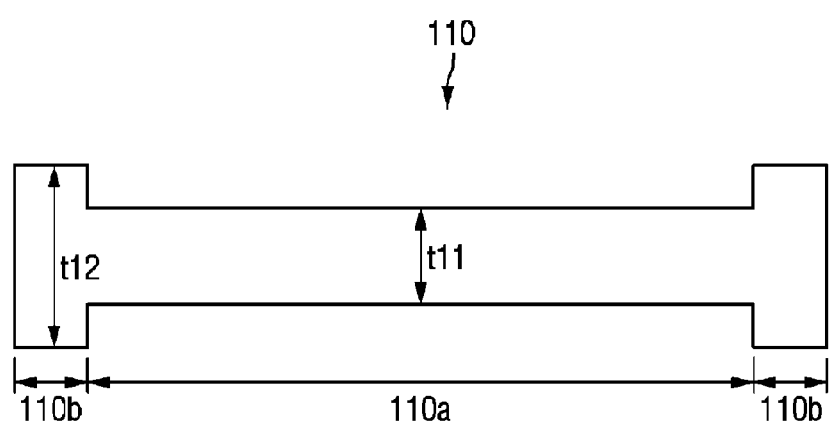
FIG. 32 is example views of a first wire pattern of FIG. 31.

FIG. 29 shows views provided to explain a semiconductor device according to some example embodiments of the present disclosure. FIGS. 30A and 30B are example views of a first wire pattern of FIG. 29. FIG. 31 shows views provided to explain a semiconductor device according to some example embodiments of the present disclosure. FIG. 32 is example views of a first wire pattern of FIG. 31.

For reference, FIG. 30A, FIG. 30B and FIG. 32 are longitudinal cross-sectional views of FIG. 22 taken on A-A.

Referring to FIGS. 29 to 30B, in a semiconductor device according to some embodiments of the present disclosure, each of the first wire pattern 110 and the second wire pattern 210 may be a trimmed wire pattern.

Furthermore, referring to FIG. 29, the first wire pattern 110 may include a first side and a second side facing each other. The first side of the first wire pattern 110 may be closer to the substrate 100 than the second side of the first wire pattern 110. In this case, a width of the first gate spacer 140 disposed between the first side of the first wire pattern 110 and the substrate 100 may be different from a width of the first gate spacer 140 on the second side of the first wire pattern 110.

For example, the first wire pattern 110 may include a first portion 110a, a second portion 110b and a third portion 110c.

The second portion 110b of the first wire pattern may be disposed at both sides of the first portion 110a of the first wire pattern. The third portion 110c of the first wire pattern may be disposed at both sides of the first portion 110a of the first wire pattern. The third portion 110c of the first wire pattern may be disposed between the first portion 110a of the first wire pattern and the second portion 110b of the first wire pattern.

A thickness t13 of the third portion 110c of the first wire pattern is greater than a thickness t11 of the first portion 110a of the first wire pattern and smaller than a thickness t12 of the second portion 110b of the first wire pattern.

FIG. 30B is a view showing that a connection portion between the third portion 110c of the first wire pattern and the second portion 110b of the first wire pattern may be rounded, and that a connection portion of the third portion 110c of the first wire pattern and the first portion 110a of the first wire pattern may be rounded.

In FIGS. 30A and 30B, it is illustrated that the first portion 110a of the first wire pattern has a fixed width regardless of the location of the width, but this is for convenience sake, and thus there is no limitation thereto. For example, the width of the first portion 110a of the first wire pattern may, of course, vary as in FIG. 6B and FIG. 6C.

In FIG. 29 and FIG. 31, depending on a width of the second gate spacer 240 that is disposed on an upper portion and a lower portion of the second wire pattern 210, the trimmed shape of the second wire pattern 210 may be similar to FIG. 30A and FIG. 30B, or to FIG. 32 that will be explained hereinafter.

Referring to FIG. 31 and FIG. 32, in a semiconductor device according to some embodiments, each of the first wire pattern 110 and the second wire pattern 210 may be a trimmed wire pattern.

Furthermore, in FIG. 31, the first wire pattern 110 may include the first side and the second side facing each other. The first side of the first wire pattern 110 may be closer to the substrate 100 than the second side of the first wire pattern 110. In this case, a width of the first gate spacer 140 disposed between the first side of the first wire pattern 110 and the substrate 100 may be substantially identical to a width of the first gate spacer 140 on the second side of the first wire pattern 110.

The second portion 110b of the first wire pattern may be disposed at both sides of the first portion 110a of the first wire pattern.

The thickness t12 of the second portion 110b of the first wire pattern is greater than the thickness t11 of the first portion 110a of the first wire pattern.

Unlike as illustrated in FIG. 32, a connection portion between the second portion 110b of the first wire pattern and the first portion 110a of the first wire pattern may, of course, be rounded.

Furthermore, in FIG. 32, it is illustrated that the width of the first portion 110a of the first wire pattern is constant irrespective of its location, but this is for convenience sake, and thus without limitation thereto. For example, the width of the first portion 110a of the first wire pattern may, of course, vary as in FIG. 6B or FIG. 6C.

Figure 33:
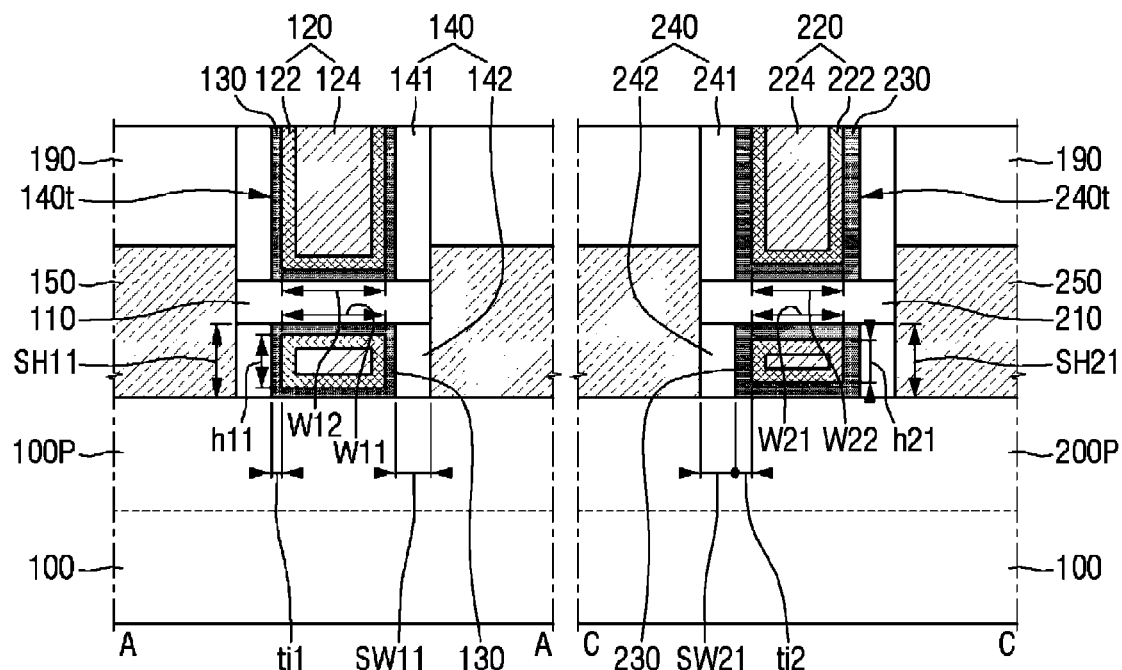
FIG. 33 shows views provided to explain a semiconductor device according to some example embodiments of the present disclosure.
Figure 34:
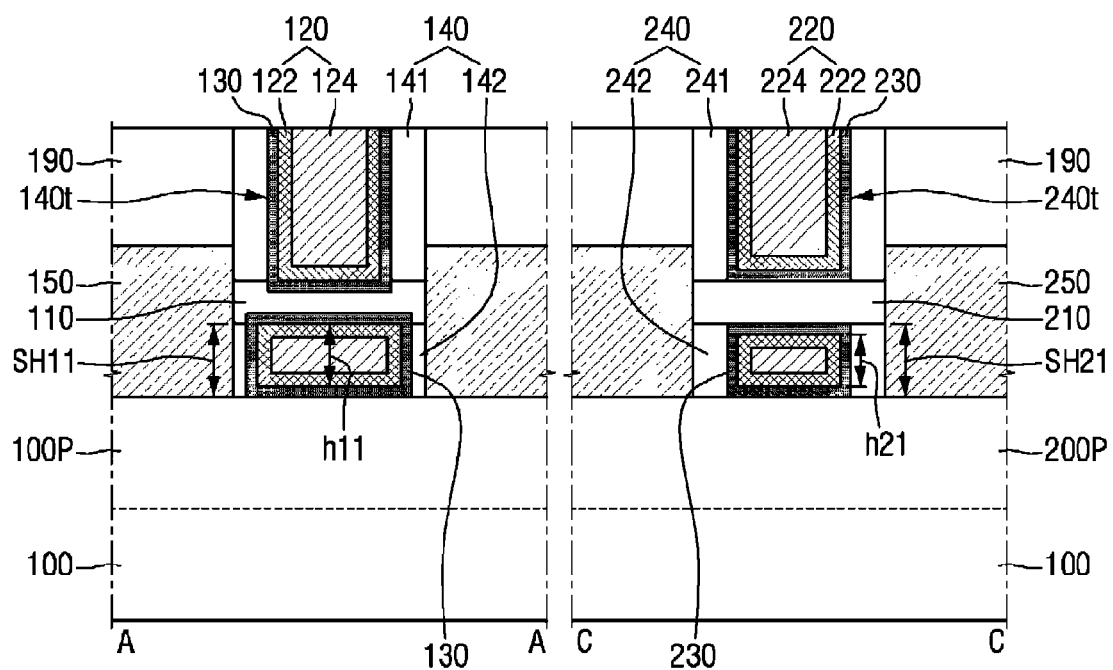
FIG. 34 shows views provided to explain a semiconductor device according to some example embodiments of the present disclosure.

FIG. 33 is a view of a semiconductor device according to some embodiments of the present disclosure. FIG. 34 is a view of a semiconductor device according to some embodiments of the present disclosure. For convenience of explanation, differences that are not explained above with reference to FIGS. 22 to 25 will be mainly explained below.

Referring to FIG. 33, in a semiconductor device according to some embodiments of the present disclosure, a thickness ti1 of the first gate insulating film 130 may be different from a thickness ti2 of the second gate insulating film 230.

For example, the thickness ti1 of the first gate insulating film 130 may be smaller than the thickness ti2 of the second gate insulating film 230.

A height SH11 of the first inner spacers 142 between the first wire pattern 110 and the substrate 100 may be substantially identical to a height SH21 of the second inner spacers 242 between the second wire pattern 210 and the substrate 100.

The first gate electrode 120 and the first gate insulating film 130 may be formed between the first wire pattern 110 and the substrate 100, and the second gate electrode 220 and the second gate insulating film 230 may be formed between the second wire pattern 210 and the substrate 100.

More specifically, between the first wire pattern 110 and the substrate 100, the first gate insulating film 130 is formed between the first wire pattern 110 and the first gate electrode 120 and between the substrate 100 and the first gate electrode 120.

Between the second wire pattern 210 and the substrate 100, the second gate insulating film 230 is formed between the second wire pattern 210 and the second gate electrode 220, and between the substrate 100 and the second gate electrode 220.

Since the height SH11 of the first inner spacers 142 is substantially identical to the height SH21 of the second inner spacers 242, and the thickness ti1 of the first gate insulating film 130 is different from the thickness ti2 of the second gate insulating film 230, a height h11 of the first gate electrodes 120 between the first wire pattern 110 and the substrate 100 may be different from a height h21 of the second gate electrodes 220 between the second wire pattern 210 and the substrate 100

When the thickness ti1 of the first gate insulating film 130 is smaller than the thickness ti2 of the second gate insulating film 230, the height h11 of the first gate electrodes 120 between the first wire pattern 110 and the substrate 100 may be greater than the height h21 of the second gate electrodes 220 between the second wire pattern 210 and the substrate 100.

The width SW11 of the first inner spacer 142 between the first wire pattern 110 and the substrate 100 may be substantially identical to the width SW21 of the second inner spacer 242 between the second wire pattern 210 and the substrate 100.

Between the first wire pattern 110 and the substrate 100, the first gate insulating film 130 is formed between the first gate spacer 140 and the first gate electrode 120. Between the second wire pattern 210 and the substrate 100, the second gate insulating film 230 is formed between the second gate spacer 240 and the second gate electrode 220.

In this case, since the thickness ti1 of the first gate insulating film 130 is different from the thickness ti2 of the second gate insulating film 230, the width W11 of the first gate electrode 120 between the first wire pattern 110 and the substrate 100 may be different from the width W21 of the second gate electrode 220 between the second wire pattern 210 and the substrate 100.

For example, the width W11 of the first gate electrode 120 and the first wire pattern 110 overlapping each other between the first wire pattern 110 and the substrate 100 may be different from the width W21 of the second gate electrode 220 and the second wire pattern 210 overlapping each other between the second wire pattern 210 and the substrate 100.

When the thickness ti1 of the first gate insulating film 130 is smaller than the thickness ti2 of the second gate insulating film 230, the width W11 of the first gate electrode 120 between the first wire pattern 110 and the substrate 100 may be greater than the width W21 of the second gate electrode 220 between the second wire pattern 210 and the substrate 100.

Unlike as above, when the width SW11 of the first inner spacer 142 between the first wire pattern 110 and the substrate 100 is smaller than the width SW21 of the second inner spacer 242 between the second wire pattern 210 and the substrate 100, depending on the relationship between the thickness ti1 of the first gate insulating film 130 and the thickness ti2 of the second gate insulating film 230, the width W11 of the first gate electrode 120 between the first wire pattern 110 and the substrate 100 may be identical to or different from the width W21 of the second gate electrode 220 between the second wire pattern 210 and the substrate 100.

Referring to FIG. 34, in a semiconductor device according to some embodiments of the present disclosure, the first wire pattern 110 may be a trimmed wire pattern, and the second wire pattern 210 may be an untrimmed wire pattern.

As illustrated in FIG. 30A, FIG. 30B and FIG. 32, the trimmed first wire pattern 110 may include the first portion 110*a* of the first wire pattern and the second portion 110*b* of the first wire pattern, the first portion 110*a* and the second portion 110*b* having different thicknesses. The second portion 110*b* of the first wire pattern may be disposed at both sides of the first portion 110*a* of the first wire pattern.

Meanwhile, since the second wire pattern 210 is not trimmed, the thickness of the second wire pattern 210 may be kept constant as it gets farther away from the second gate spacer 240.

The height SH11 of the first gate spacer 140 between the first wire pattern 110 and the substrate 100 may be substantially identical to the height SH21 of the second gate spacers 240 between the second wire pattern 210 and the substrate 100. For example, the height SH11 of the first inner spacer 142 between the first wire pattern 110 and the substrate 100 may be substantially identical to the height SH21 of the second inner spacers 242 between the second wire pattern 210 and the substrate 100.

On the other hand, since the first wire pattern 110 is trimmed and the second wire pattern 210 is not trimmed, a space between the first wire pattern 110 and the substrate 100, where the first gate electrode 120 is formed, may be greater than a space between the second wire pattern 210 and the substrate 100, where the second gate electrode 220 is formed.

Accordingly, the height h11 of the first gate electrode 120 between the first wire pattern 110 and the substrate 100 may be greater than the height h21 of the second gate electrodes between the second wire pattern 210 and the substrate 100.

Figure 35:
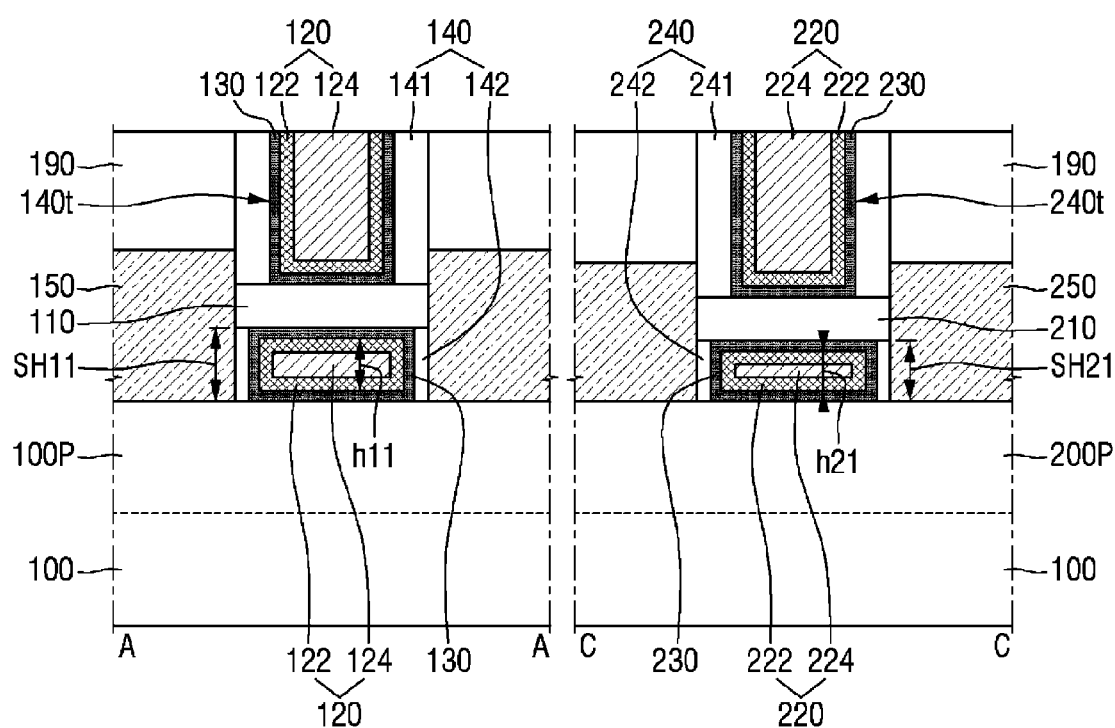
FIG. 35 shows views provided to explain a semiconductor device according to some example embodiments of the present disclosure.

FIG. 35 is a view of a semiconductor device according to some embodiments of the present disclosure. For convenience of explanation, differences that are not explained above with reference to FIGS. 22 to 25 will be mainly explained below.

Referring to FIG. 35, in a semiconductor device according to some embodiments of the present disclosure, the height SH11 of the first gate spacers 140 between the first wire pattern 110 and the substrate 100 may be different from the height SH21 of the second gate spacers 240 between the second wire pattern 210 and the substrate 100.

For example, the height SH11 of the first inner spacers 142 between the first wire pattern 110 and the substrate 100 may be different from the height SH21 of the second inner spacers 242 between the second wire pattern 210 and the substrate 100.

For example, in FIG. 35, the height SH11 of the first gate spacers 140 between the first wire pattern 110 and the substrate 100 may be greater than the height SH21 of the second gate spacers 240 between the second wire pattern 210 and the substrate 100.

For example, the space between the first wire pattern 110 and the substrate 100, where the first gate electrode 120 is formed, may be different from the space between the second wire pattern 210 and the substrate 100, where the second gate electrode 220 is formed.

Since the height SH11 of the first gate spacers 140 between the first wire pattern 110 and the substrate 100 is different from the height SH21 of the second gate spacers 240 between the second wire pattern 210 and the substrate 100, the height h11 of the first gate electrodes 120 between the first wire pattern 110 and the substrate 100 may be different from the height h21 of the second gate electrodes 220 between the second wire pattern 210 and the substrate 100.

When the height SH11 of the first inner spacers 142 is greater than the height SH21 of the second inner spacers 242, the height h11 of the first gate electrodes 120 between the first wire pattern 110 and the substrate 100 may be greater than the height h21 of the second gate electrodes 220 between the second wire pattern 210 and the substrate 100.

The first gate electrode 120 may include the first lower gate electrode 122 and the first upper gate electrode 124, and the second gate electrode 220 may include the second lower gate electrode 222 and the second upper gate electrode 224.

The first gate electrode 120 between the substrate 100 and the first wire pattern 110 may include the first lower gate electrode 122 and the first upper gate electrode 124.

As illustrated in FIG. 35, the space between the first wire pattern 110 and the substrate 100 may be greater than the space between the second wire pattern 210 and the substrate 100, but the second gate electrode 220 between the substrate 100 and the second wire pattern 210 may include the second lower gate electrode 222 and the second upper gate electrode 224.

In FIG. 35, it is illustrated that the space between the first inner spacers 142 between the first wire pattern 110 and the substrate 100 is different from the space between the second inner spacers 242 between the second wire pattern 210 and the substrate 100, but without limitation thereto.

Figure 36:
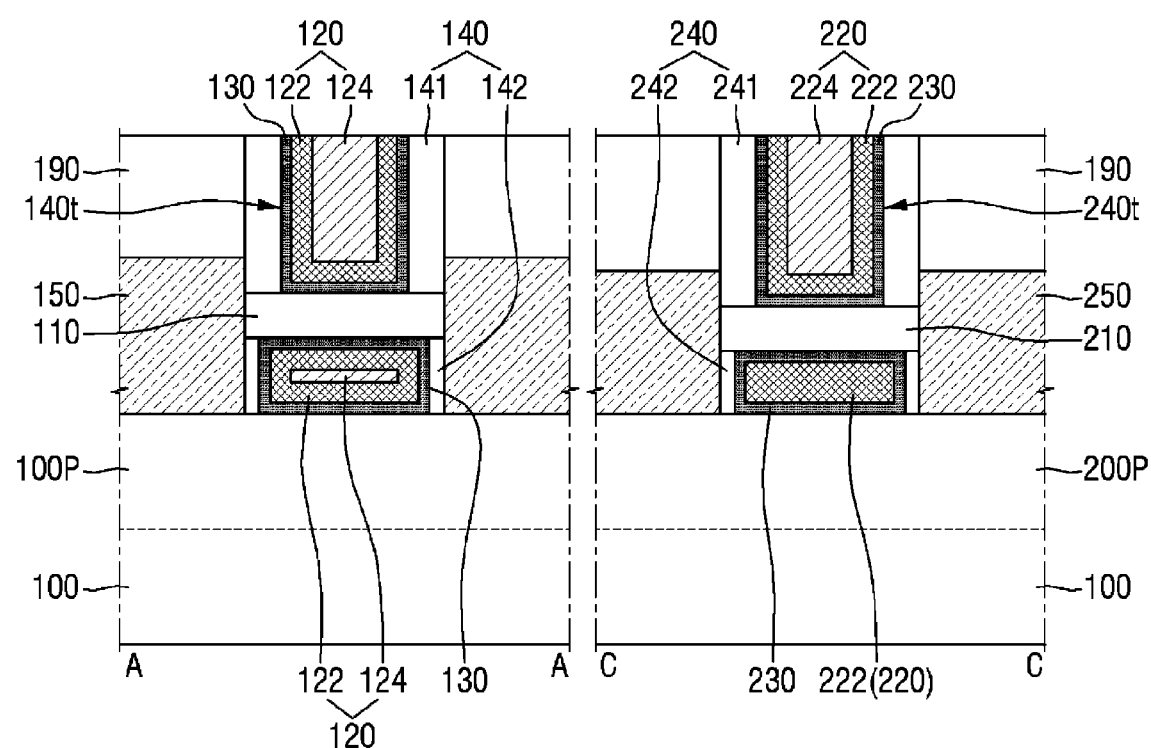
FIG. 36 shows views provided to explain a semiconductor device according to some example embodiments of the present disclosure.
Figure 37:
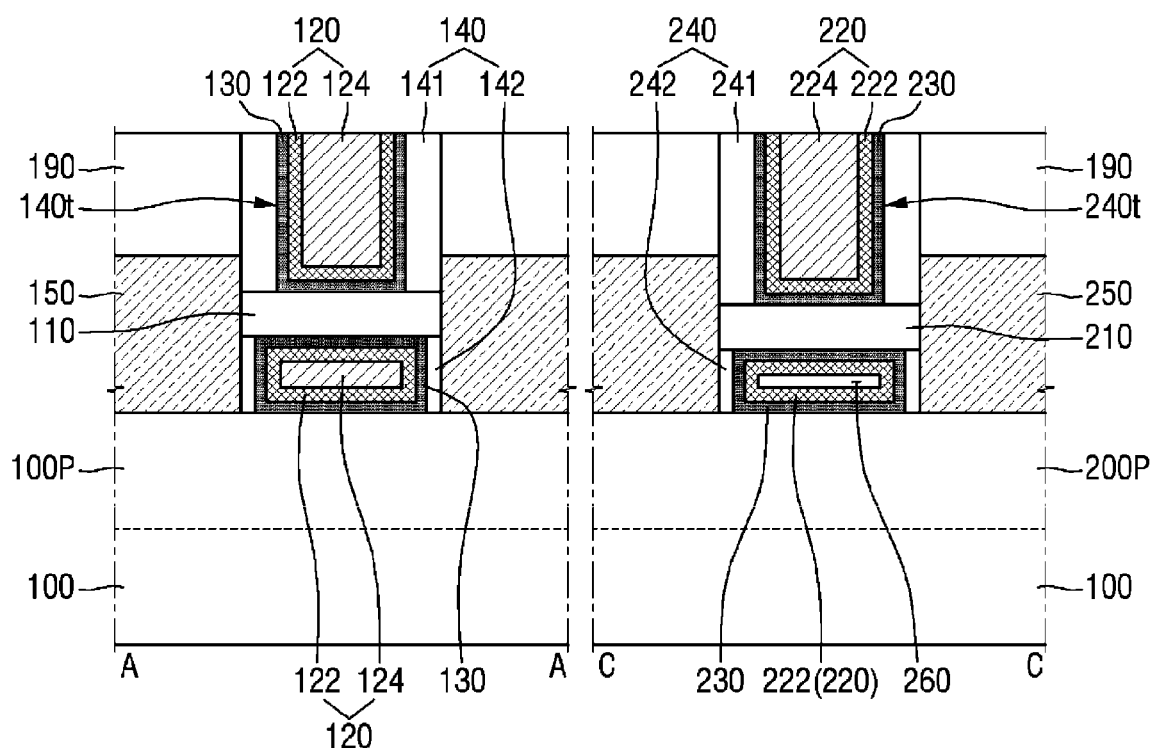
FIG. 37 shows views provided to explain a semiconductor device according to some example embodiments of the present disclosure.
Figure 38:
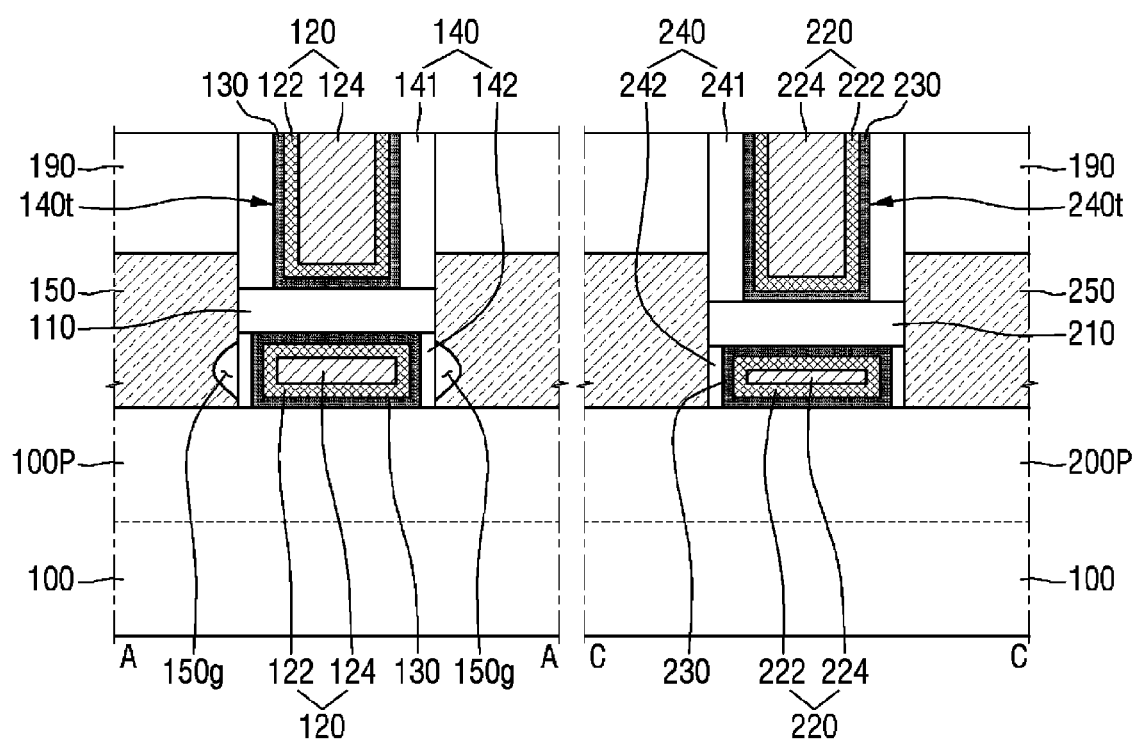
FIG. 38 shows views provided to explain a semiconductor device according to some example embodiments of the present disclosure.
Figure 39:
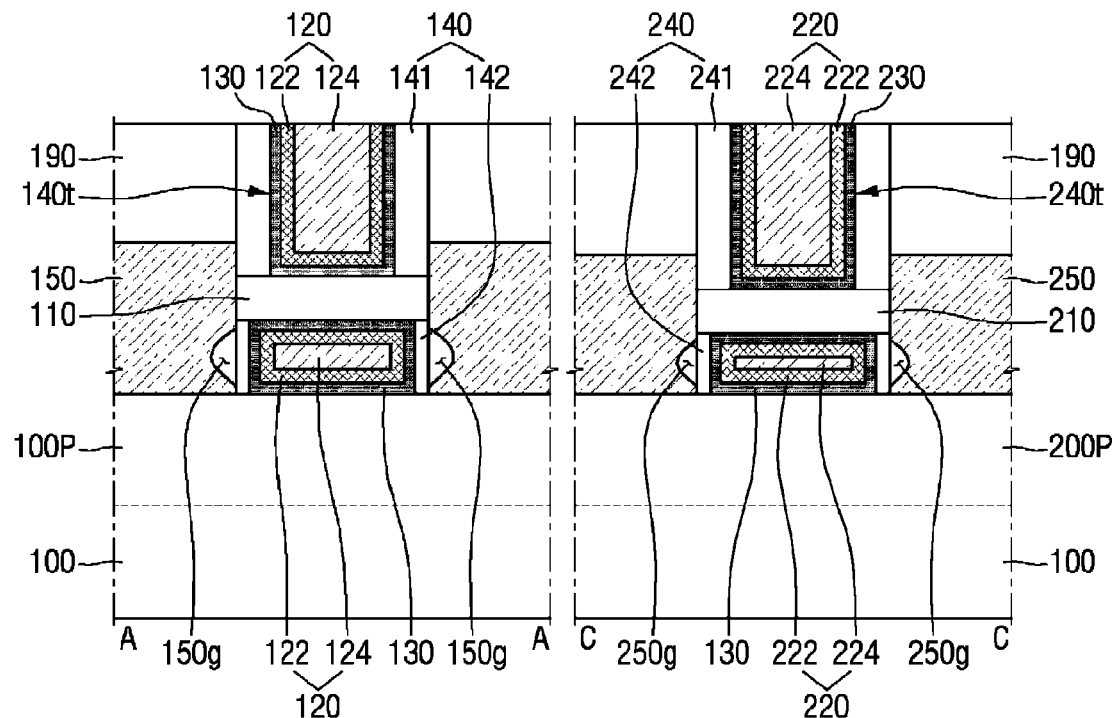
FIG. 39 shows views provided to explain a semiconductor device according to some example embodiments of the present disclosure.

FIG. 36 is a view of a semiconductor device according to some embodiments of the present disclosure. FIG. 37 is a view of a semiconductor device according to some embodiments of the present disclosure. FIG. 38 is a view of a semiconductor device according to some embodiments of the present disclosure. FIG. 39 is a view of a semiconductor device according to some embodiments of the present disclosure. For convenience of explanation, differences that are not explained above with reference to FIG. 35 will be mainly explained below.

Referring to FIG. 36, in a semiconductor device according to some embodiments of the present disclosure, the number of metal layers included in the second gate electrode 220 may vary depending on the location of the second gate electrode 220 relative to the second wire pattern 210.

More specifically, the second gate electrode 220 may include the second lower gate electrode 222 and the second upper gate electrode 224. However, the second gate electrode 220 between the second wire pattern 210 and the substrate 100 may include the second lower gate electrode 222 but not the second upper gate electrode 224.

For example, not the second upper gate electrode 224 but only the second lower gate electrode 222 may be formed between the second wire pattern 210 and the substrate 100.

When using FIG. 24, the second upper gate electrode 224 may be formed on the field insulating film 105 but not between the second wire pattern 210 and the second fin-type protruding portion 200P Meanwhile, the first gate electrode 120 may include the first lower gate electrode 122 and the first upper gate electrode 124. Furthermore, the first gate electrode 120 between the first wire pattern 110 and the substrate 100 may also include the first lower gate electrode 122 and the first upper gate electrode 124.

Referring to FIG. 37, in a semiconductor device according to some embodiments of the present disclosure, the first gate electrode 120 may not include an air gap, but the second gate electrode 220 may include a second gate electrode air gap 260.

More specifically, the first gate electrode 120 between the first wire pattern 110 and the substrate 100 may not include an air gap. On the other hand, the second gate electrode air gap 260 may be formed between the second wire pattern 210 and the substrate 100.

As the second upper gate electrode 224 is not formed between the second wire pattern 210 and the substrate 100, the second gate electrode air gap 260 may be formed between the second wire pattern 210 and the substrate 100, but this is a mere example, and thus without limitation thereto.

When using FIG. 24, the second gate electrode air gap 260 may be formed between the second wire pattern 210 and the second fin-type protruding portion 200P.

Referring to FIG. 38, in a semiconductor device according to some embodiments of the present disclosure, a first source/drain air gap 150g may be formed between the first source/drain region 150 and the first gate spacer 140.

However, an air gap may not be formed between the second source/drain region 250 and the second gate spacer 240.

The first source/drain air gap 150g may be formed between the first inner spacer 142 and the first source/drain region 150.

Referring to FIG. 39, in a semiconductor device according to some embodiments of the present disclosure, the first source/drain air gap 150g may be formed between the first source/drain region 150 and the first gate spacer 140.

Furthermore, between the second source/drain region 250 and the second gate spacer 240, a second source/drain air gap 250g may be formed.

The first source/drain air gap 150g may be formed between the first inner spacer 142 and the first source/drain region 150, and the second source/drain air gap 250g may be formed between the second inner spacer 242 and the second source/drain region 250.

The size of the first source/drain air gap 150g may be influenced by the height of the first inner spacer 142, and the size of the second source/drain air gap 250g may be influenced by the height of the second inner spacer 242.

Furthermore, the size of the first source/drain air gap 150g may be influenced by what type of material the first source/drain region 150 contains, and the size of the second source/drain air gap 250g may be influenced by what type of material the second source/drain region 250 contains.

Figure 40:
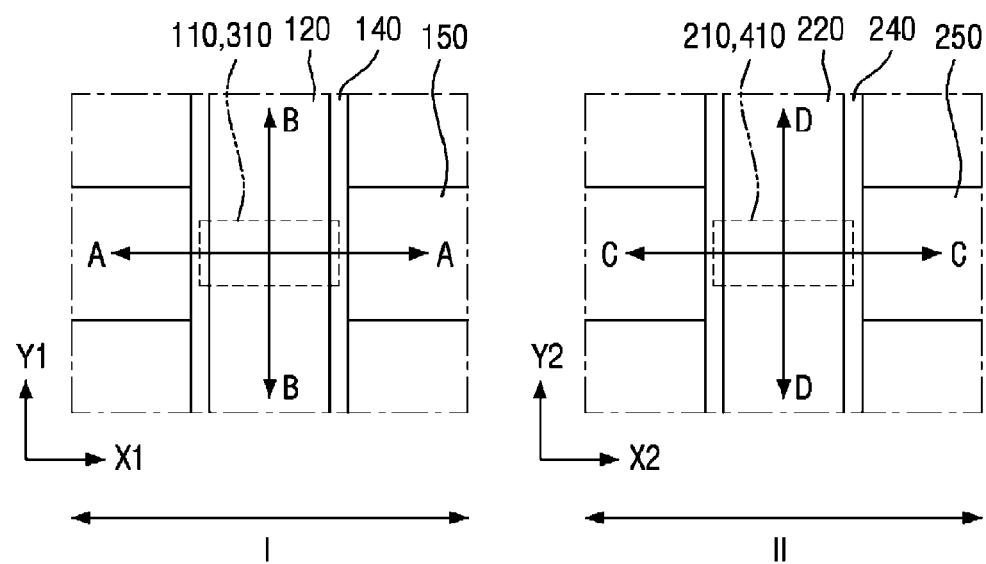
FIG. 40 shows schematic top views provided to explain a semiconductor device according to some example embodiments of the present disclosure.
Figure 41:
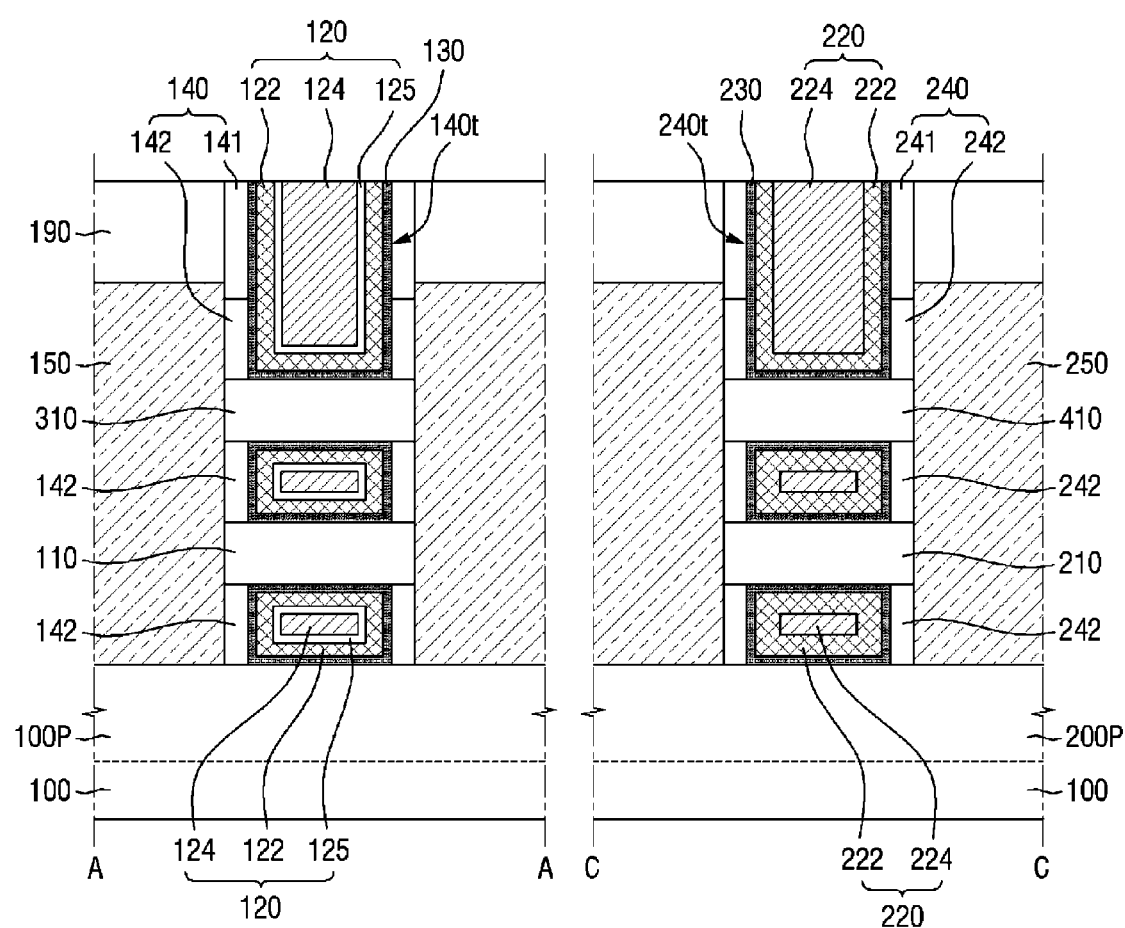
FIG. 41 shows cross sectional views taken on lines A-A and C-C of FIG. 40.
Figure 42:
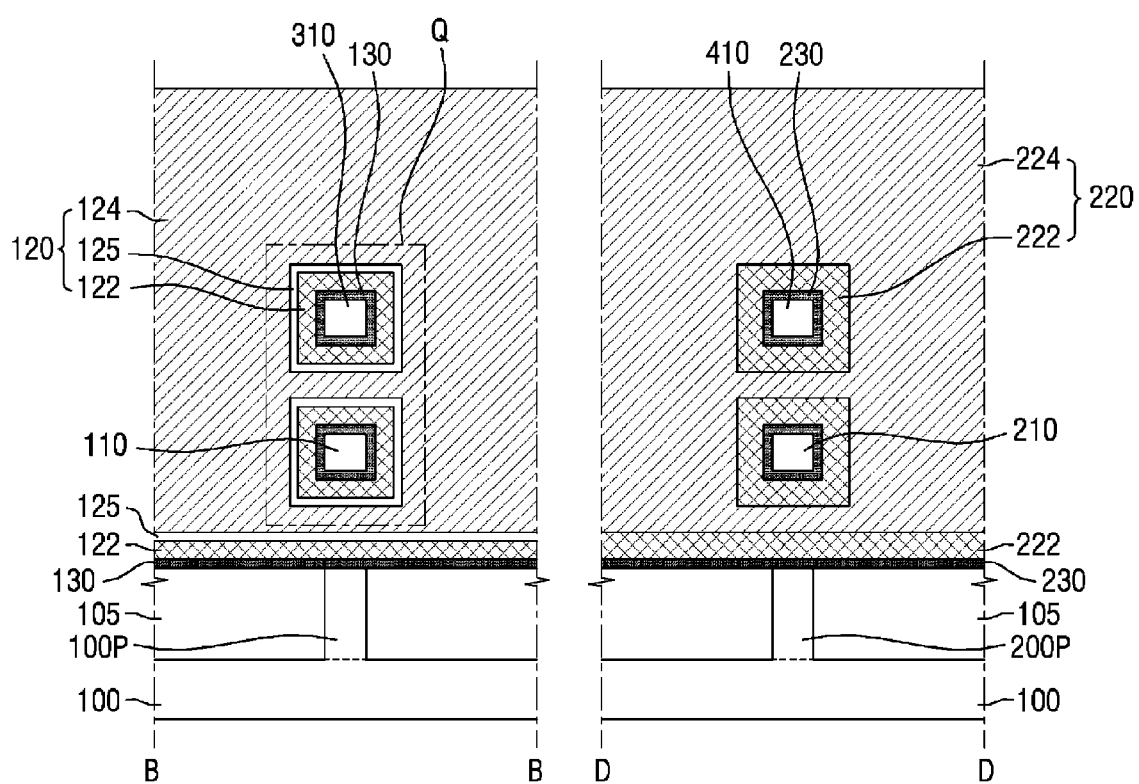
FIG. 42 shows cross sectional views taken on lines B-B and D-D of FIG. 40.
Figure 43:
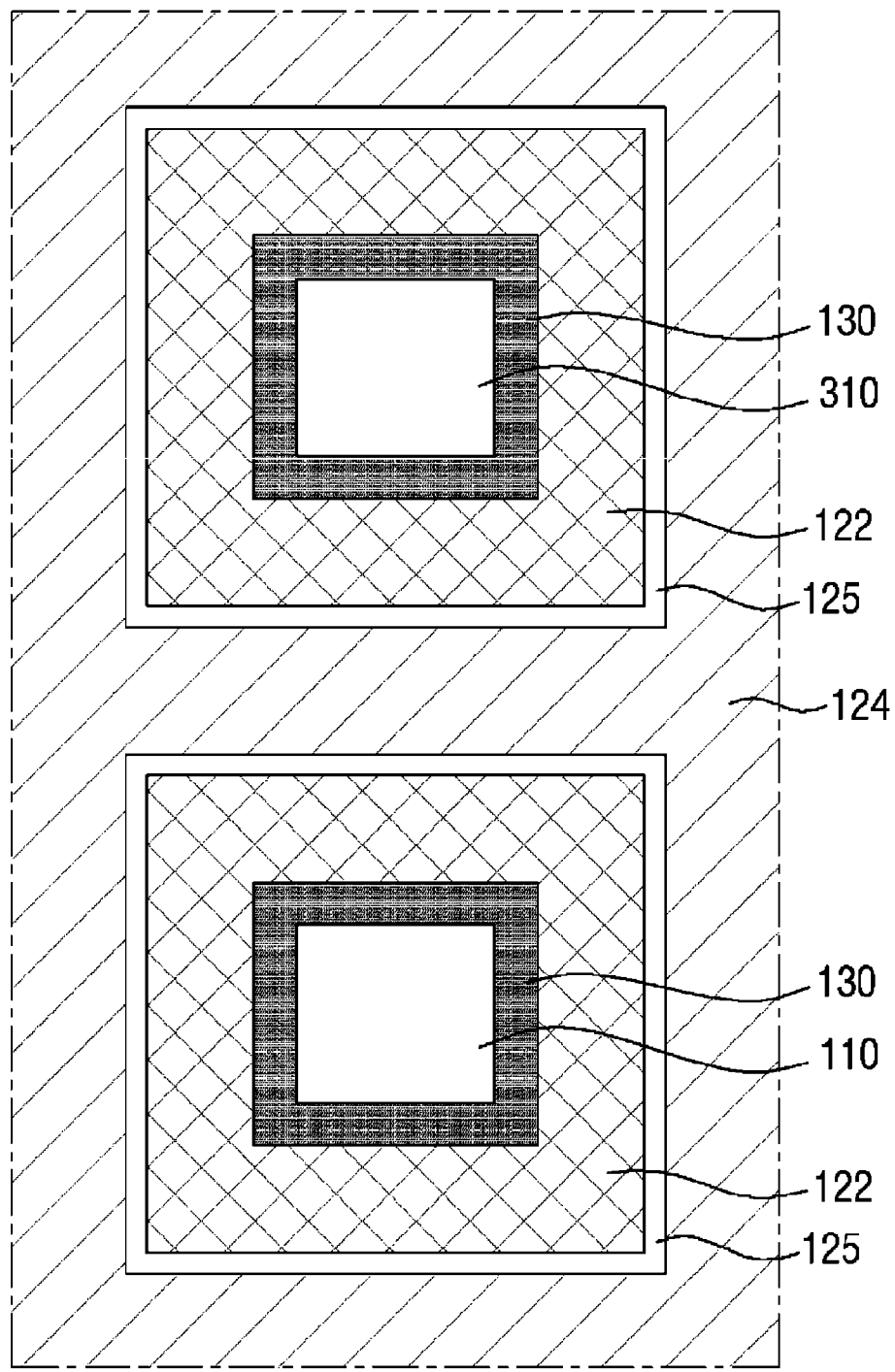
FIG. 43 is an enlarged view of the encircled area Q of FIG. 42.

FIG. 40 shows schematic top views provided to explain a semiconductor device according to some example embodiments of the present disclosure. FIG. 41 shows cross sectional views taken on lines A-A and C-C of FIG. 40. FIG. 42 shows cross sectional views taken on lines B-B and D-D of FIG. 40. FIG. 43 is an enlarged view of the encircled area Q of FIG. 42. For convenience of explanation, differences that are not explained above with reference to FIGS. 1 to 6C will be mainly explained below.

Referring to FIGS. 40 to 43, a semiconductor device according to some example embodiments may further include a third wire pattern 310 formed in the first region I, and a fourth wire pattern 410 formed in the second region II.

The third wire pattern 310 may be formed on the first wire pattern 110. The third wire pattern 310 may be formed with spacing from the first wire pattern 110. The third wire pattern 310 may extend in the first direction X1. The third wire pattern 310 may be perpendicularly overlapped with the first wire pattern 110.

The fourth wire pattern 410 may be formed on the second wire pattern 210. The fourth wire pattern 410 may be formed with spacing from the second wire pattern 210. The fourth wire pattern 410 may extend in the second direction X2. The fourth wire pattern 410 may be perpendicularly overlapped with the second wire pattern 210.

In FIGS. 41 and 42, it is illustrated that two wire patterns are consecutively formed on the substrate 100 in the first region I in the thickness direction of the substrate 100, and that two wire patterns are consecutively formed on the substrate 100 in the second region II in the thickness direction of the substrate 100, but this is for convenience sake, and thus without limitation thereto.

Three or more wire patterns may, of course, be consecutively formed on the substrate 100 of the first region I in the thickness direction of the substrate 100, and three or more wire patterns may, of course, be consecutively formed on the substrate 100 of the second region II in the thickness direction of the substrate 100.

The first gate spacer 140 defining the first trench 140t may be formed on both sides of the first wire pattern 110 and the third wire pattern 310. The first wire pattern 110 and the third wire pattern 310 may be passed through the first gate spacer 140. The first gate spacer 140 may entirely contact perimeters of the end of the first wire pattern 110 and the end of the third wire pattern 310.

A first inner spacer 142 may be disposed between the first fin-type protruding portion 100P and the first wire pattern 110, and between the first wire pattern 110 and the third wire pattern 310.

A second gate spacer 240 defining the second trench 240t may be formed on both sides of the second wire pattern 210 and the fourth wire pattern 410. The second wire pattern 210 and the fourth wire pattern 410 may be passed through the second gate spacer 240. The second gate spacer 240 may entirely contact perimeters of the end of the second wire pattern 210 and the end of the fourth wire pattern 410.

A second inner spacer 242 may be disposed between the second fin-type protruding portion 200P and the second wire pattern 210, and between the second wire pattern 210 and the fourth wire pattern 410.

The first gate insulating film 130 may be formed along the perimeter of the first wire pattern 110, and the perimeter of the third wire pattern 310. The first gate insulating film 130 may each surround the first wire pattern 110 and the third wire pattern 310.

For example, the portion of the first gate insulating film 130 being formed along the perimeter of the first wire pattern 110, and the portion of the first gate insulating film 130 being formed along the perimeter of the third wire pattern 310 may be perpendicularly spaced apart from each other.

The first gate insulating film 130 may extend along the sidewall and the bottom surface of the first trench 140t, the perimeter of the first wire pattern 110, and the perimeter of the third wire pattern 310.

The second gate insulating film 230 may be formed along the perimeter of the second wire pattern 210, and the perimeter of the fourth wire pattern 410. The second gate insulating film 230 may surround each of the second wire pattern 210 and the fourth wire pattern 410.

For example, the portion of the second gate insulating film 230 being formed along the perimeter of the second wire pattern 210, and the portion of the second gate insulating film 230 being formed along the perimeter of the fourth wire pattern 410 may be perpendicularly spaced apart from each other.

The second gate insulating film 230 may extend along the sidewall and the bottom surface of the second trench 240t, the perimeter of the second wire pattern 210, and the perimeter of the fourth wire pattern 410.

The first gate electrode 120 may be formed on the first gate insulating film 130. The first gate electrode 120 may surround the first wire pattern 110 and the third wire pattern 310. The first gate electrode 120 may intersect with the first wire pattern 110 and the third wire pattern 310.

The first lower gate electrode 122 may be formed on the first gate insulating film 130. The first lower gate electrode 122 may be formed along the profile of the first gate insulating film 130.

The first lower gate electrode 122 may be formed along the perimeter of the first wire pattern 110, and the perimeter of the third wire pattern 310. The first lower gate electrode 122 may surround the first gate insulating film 130 that is formed along outer circumferences of the first wire pattern 110 and the third wire pattern 310.

In FIGS. 42 and 43, the portion of the first lower gate electrode 122 surrounding the first wire pattern 110, and the portion of the first lower gate electrode 122 surrounding the third wire pattern 310 may be spaced apart from each other.

The first metal oxide film 125 may be formed on the first gate insulating film 130 and the first lower gate electrode 122. The first metal oxide film 125 may be formed along the profile of the first lower gate electrode 122.

Further, the first metal oxide film 125 may be formed along at least a portion of the profile of the first gate insulating film 130. In FIGS. 41 and 42, the first metal oxide film 125 may extend along the entire profile of the first gate insulating film 130.

The first upper gate electrode 124 may be formed on the first metal oxide film 125. The first upper gate electrode 124 may fill the first trench 140t in which the first lower gate electrode 122 and the first metal oxide film 125 are formed.

The first upper gate electrode 124 may be interposed between the first wire pattern 110 and the third wire pattern 310, and between the first wire pattern 110 and the first fin-type protruding portion 100P.

For example, with respect to each of the first wire pattern 110 and the third wire pattern 310, the first gate insulating film 130, the first lower gate electrode 122, and the first metal oxide film 125 may be disposed in a sequential order. Further, the first upper gate electrode 124 may surround the first wire pattern 110 and the third wire pattern 310 each having the first gate insulating film 130, the first lower gate electrode 122, and the first metal oxide film 125 disposed in a sequential order.

The first metal oxide film 125 may be positioned in a boundary between the first lower gate electrode 122 and the first upper gate electrode 124, for example. Further, also between the first wire pattern 110 and the third wire pattern 310, the first metal oxide film 125 may be positioned in a boundary between the first lower gate electrode 122 and the first upper gate electrode 124.

The second gate electrode 220 may be formed on the second gate insulating film 230. The second gate electrode 220 may surround the second wire pattern 210 and the fourth wire pattern 410. The second gate electrode 220 may intersect with the second wire pattern 210 and the fourth wire pattern 410.

The second lower gate electrode 222 may be formed on the second gate insulating film 230. The second lower gate electrode 222 may be formed along the profile of the second gate insulating film 230.

The second lower gate electrode 222 may be formed along the perimeter of the second wire pattern 210, and the perimeter of the fourth wire pattern 410. The second lower gate electrode 222 may surround the second gate insulating film 230 that is formed along outer circumferences of the second wire pattern 210 and the fourth wire pattern 410.

In FIGS. 42 and 43, the portion of the second lower gate electrode 222 surrounding the second wire pattern 210, and the portion of the second lower gate electrode 222 surrounding the fourth wire pattern 410 may be spaced apart from each other.

The second upper gate electrode 224 may be formed on the second lower gate electrode 222. The second upper gate electrode 224 may fill the second trench 240t in which the second lower gate electrode 222 is formed.

The second upper gate electrode 224 may be interposed between the second wire pattern 210 and the fourth wire pattern 410, and between the second wire pattern 210 and the second fin-type protruding portion 200P.

The second gate electrode 220 may not include the second metal oxide film 225 positioned inside the second gate electrode 220, and may not include a metal oxide that does not contact the second gate insulating film 230.

The first source/drain region 150 may be disposed at both sides of the first wire pattern 110 and the third wire pattern 310, and may be connected to each of the first wire pattern 110 and the third wire pattern 310.

The second source/drain region 250 may be disposed at both sides of the second wire pattern 210 and the fourth wire pattern 410, and may be connected to each of the second wire pattern 210 and the fourth wire pattern 410.

Figure 44:
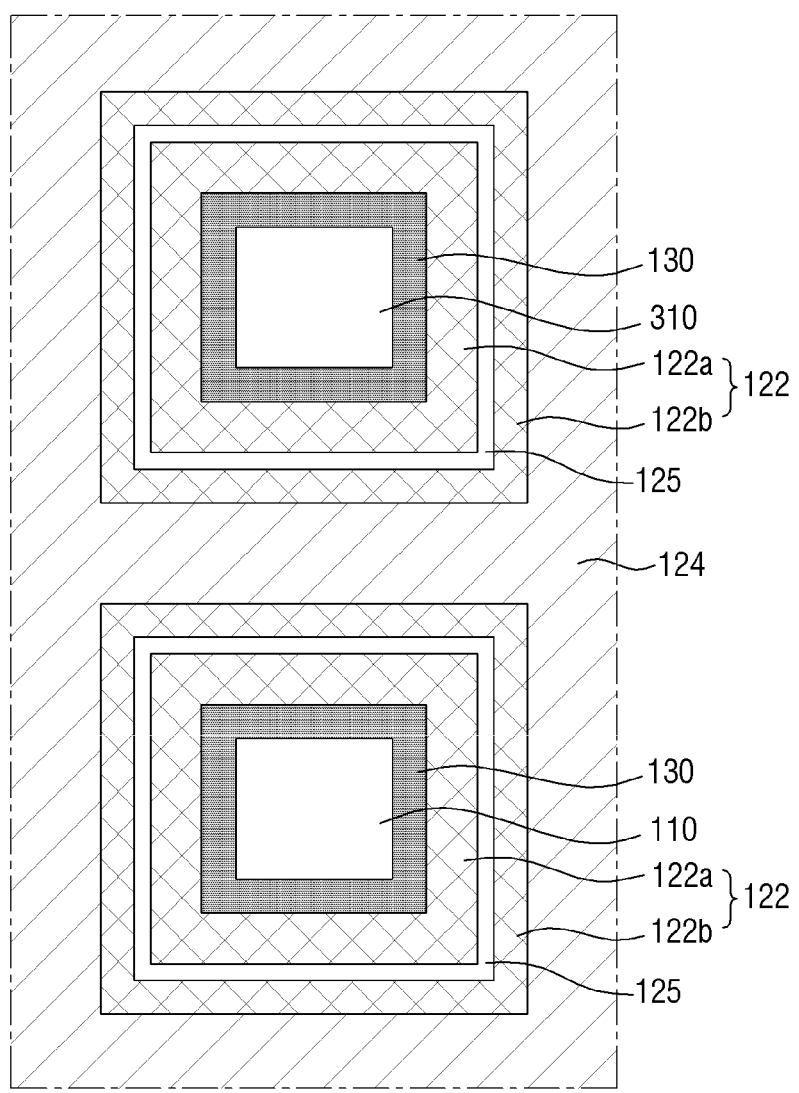
FIG. 44 is a view provided to explain a semiconductor device according to some example embodiments of the present disclosure.

FIG. 44 is a view provided to explain a semiconductor device according to some example embodiments of the present disclosure. For convenience of explanation, differences from the example embodiments explained above with reference to FIGS. 40 to 43 will be mainly explained below.

For reference, FIG. 44 is an enlarged view of the encircled area Q of FIG. 42. Additionally, it is of course possible that those skilled in the art can easily envisage the cross sectional views as shown in FIGS. 41 and 42, using the shapes illustrated in FIG. 44.

Referring to FIG. 44, the first metal oxide film 125 may be positioned inside the first lower gate electrode 122.

More specifically, by the first metal oxide film 125, the first lower gate electrode 122 may be divided into a first portion 122a of the first lower gate electrode and a second portion 122b of the first lower gate electrode.

The first metal oxide film 125 and the first gate insulating film 130 may be spaced apart from each other, as the first portion 122a of the first lower gate electrode is positioned between the first metal oxide film 125 and the first gate insulating film 130.

Further, the first metal oxide film 125 and the first upper gate electrode 124 may be spaced apart from each other, as the second portion 122b of the first lower gate electrode is positioned between the first metal oxide film 125 and the first upper gate electrode 124.

With respect to each of the first wire pattern 110 and the third wire pattern 310, the first portion 122a of the first lower gate electrode, the first metal oxide film 125, and the second portion 122b of the first lower gate electrode may be disposed in a sequential order.

The second portion 122b of the first lower gate electrode being formed on the perimeter of the first wire pattern 110, and the second portion 122b of the first lower gate electrode being formed on the perimeter of the third wire pattern 310 may be spaced apart from each other.

Further, the first upper gate electrode 124 may be interposed between the second portion 122b of the first lower gate electrode being formed on the perimeter of the first wire pattern 110, and the second portion 122b of the first lower gate electrode being formed on the perimeter of the third wire pattern 310.

Figure 45:
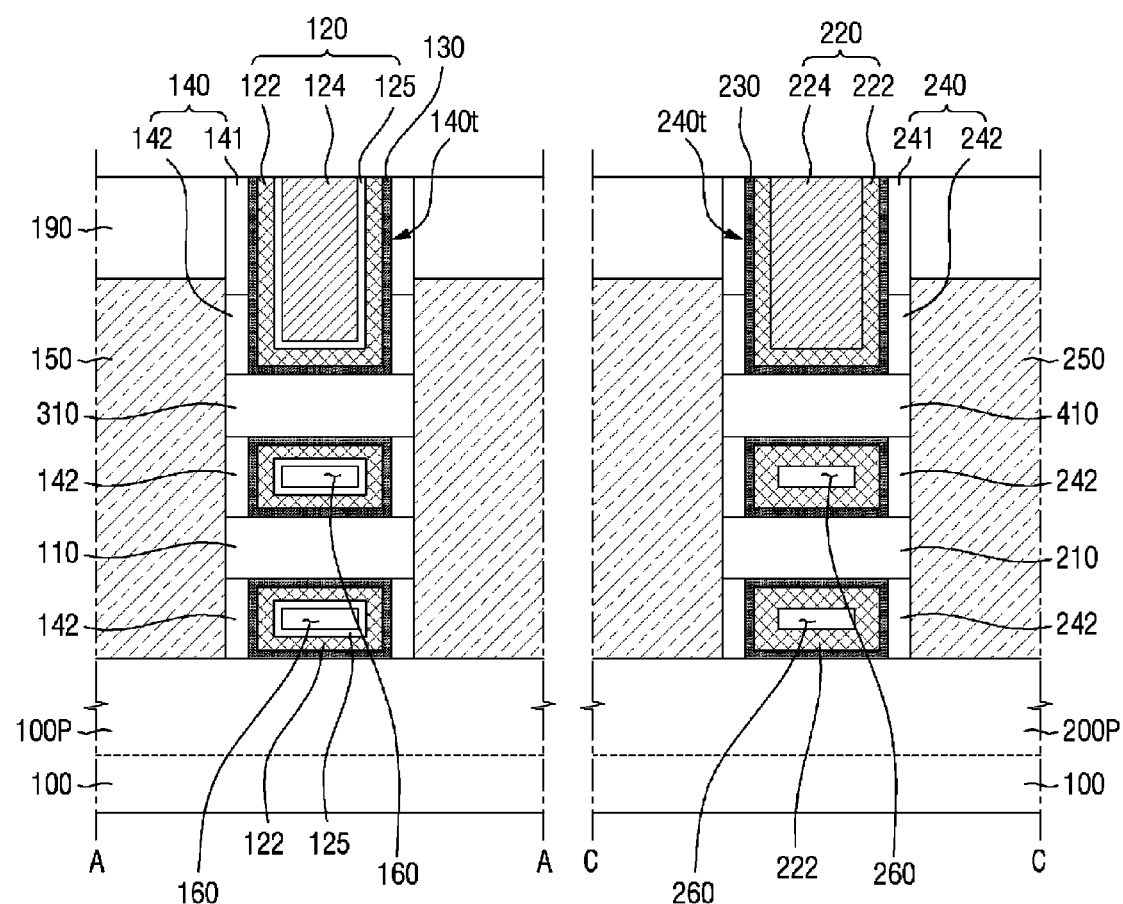
FIGS. 45 and 46 are views provided to explain a semiconductor device according to some example embodiments of the present disclosure.
Figure 46:
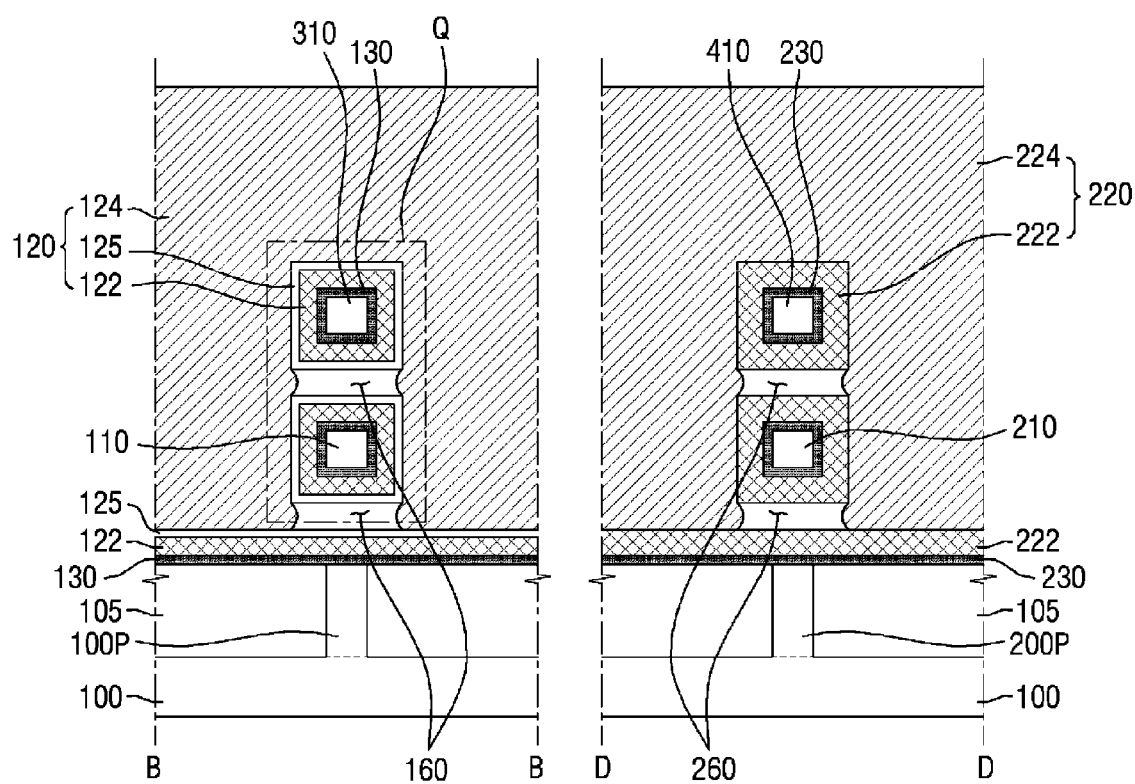
Figure 47:
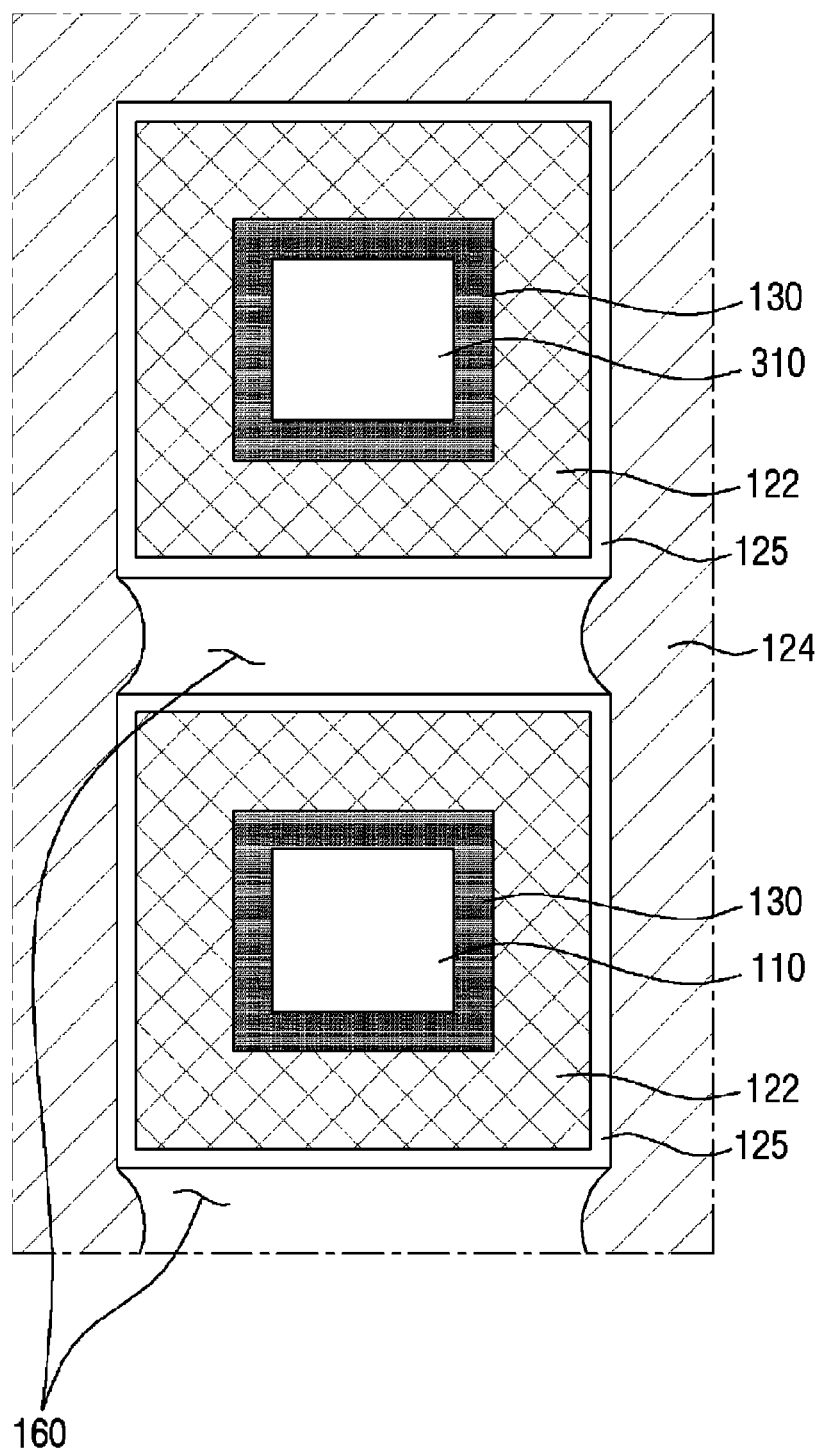
FIG. 47 is an enlarged view of the encircled area Q of FIG. 46.

FIGS. 45 and 46 are views provided to explain a semiconductor device according to some example embodiments of this present disclosure. FIG. 47 is an enlarged view of the encircled area Q of FIG. 46. For convenience of explanation, differences that are not explained above with reference to FIGS. 40 to 43 will be mainly explained below.

Referring to FIGS. 45 to 47, in a semiconductor device according to some example embodiments, the first gate electrode 120 may further include a first gate electrode air gap 160 formed between the first wire pattern 110 and the third wire pattern 310, and between the first wire pattern 110 and the first fin-type protruding portion 100P.

The first gate electrode air gap 160 may be defined by the first metal oxide film 125 and the first upper gate electrode 124. For example, the first metal oxide film 125 may contact the first gate electrode air gap 160.

Further, the second gate electrode 220 may further include a second gate electrode air gap 260 formed between the second wire pattern 210 and the fourth wire pattern 410, and between the second wire pattern 210 and the second fin-type protruding portion 200P.

The second gate electrode air gap 260 may be defined by the second lower gate electrode 222 and the second upper gate electrode 224.

For example, the first upper gate electrode 124 may not be interposed between the first wire pattern 110 and the third wire pattern 310, nor between the first wire pattern 110 and the first fin-type protruding portion 100P.

Additionally, the second upper gate electrode 224 may not be interposed between the second wire pattern 210 and the fourth wire pattern 410, nor between the second wire pattern 210 and the second fin-type protruding portion 200P.

Figure 48:
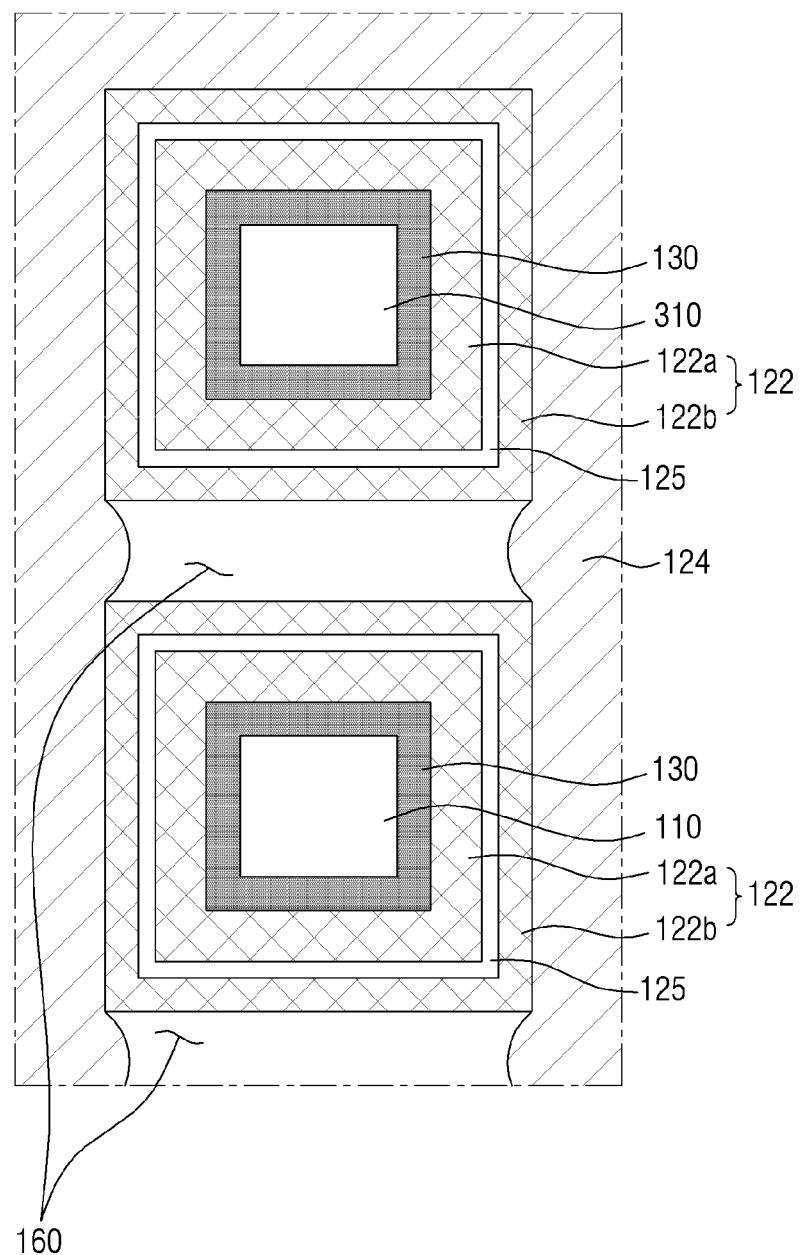
FIG. 48 is a view provided to explain a semiconductor device according to some example embodiments of the present disclosure.

FIG. 48 is a view provided to explain a semiconductor device according to some example embodiments. For convenience of explanation, differences from the example embodiments explained above with reference to FIGS. 45 to 47 will be mainly explained below.

Referring to FIG. 48, the first metal oxide film 125 may be positioned inside the first lower gate electrode 122. By the first metal oxide film 125, the first lower gate electrode 122 may be divided into the first portion 122a of the first lower gate electrode and the second portion 122b of the first lower gate electrode.

Further, the first gate electrode 120 may further include the first gate electrode air gap 160 formed between the first wire pattern 110 and the third wire pattern 310, and between the first wire pattern 110 and the first fin-type protruding portion 100P.

The first gate electrode air gap 160 may be defined by the second portion 122b of the first lower gate electrode and the first upper gate electrode 124. Accordingly, the first metal oxide film 125 may not contact the first gate electrode air gap 160.

Figure 49:
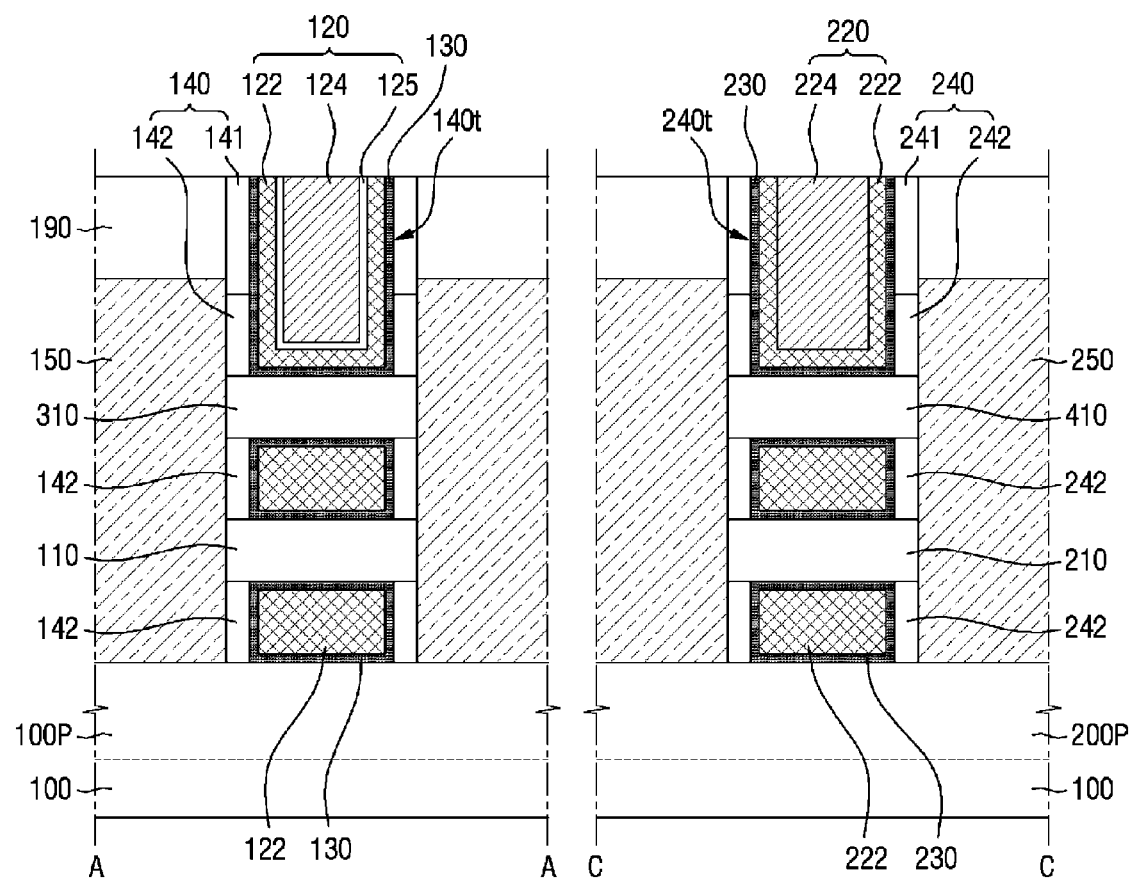
FIGS. 49 and 50 are views provided to explain a semiconductor device according to some example embodiments of the present disclosure.
Figure 50:
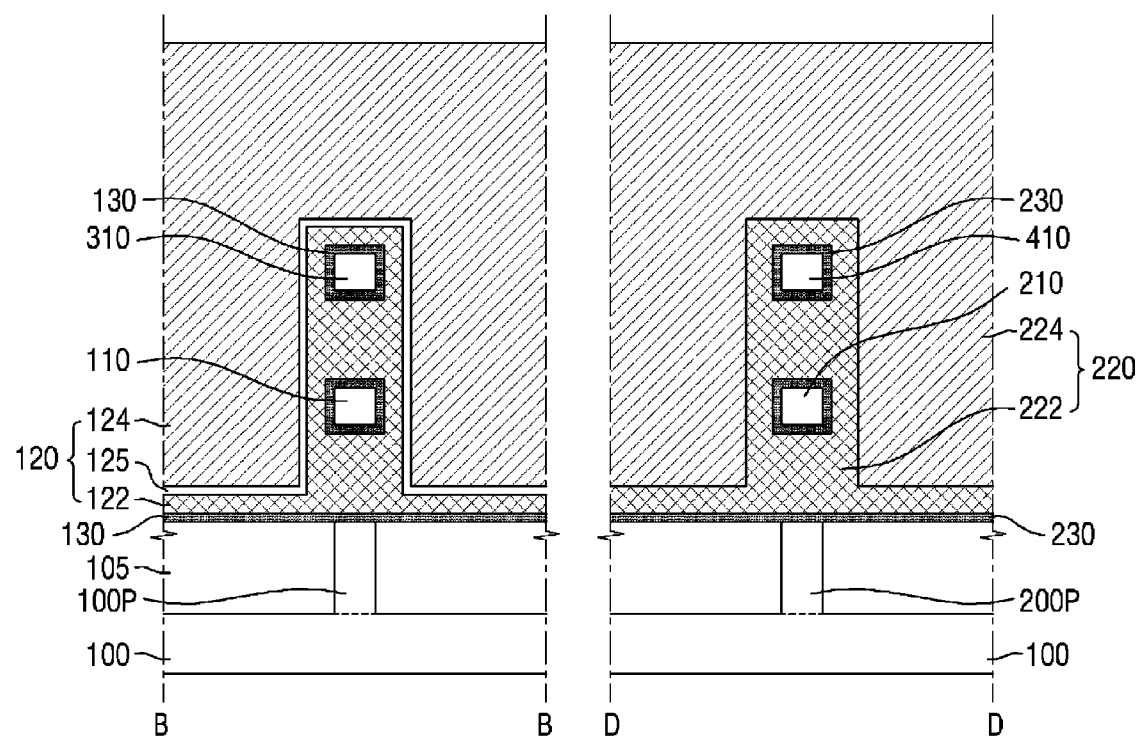

FIGS. 49 and 50 are views provided to explain a semiconductor device according to some example embodiments. For convenience of explanation, differences that are not explained above with reference to FIGS. 40 to 43 will be mainly explained below.

Referring to FIGS. 49 and 50, in a semiconductor device according to some example embodiments, the portion of the first lower gate electrode 122 surrounding the first wire pattern 110, and the portion of the first lower gate electrode 122 surrounding the third wire pattern 310 may contact each other. The first lower gate electrode 122 may entirely surround the first wire pattern 110 and the third wire pattern 310.

Accordingly, the first upper gate electrode 124 may not be interposed between the first wire pattern 110 and the third wire pattern 310, nor between the first wire pattern 110 and the first fin-type protruding portion 100P.

The first metal oxide film 125 may be positioned in a boundary between the first upper gate electrode 124 and the first lower gate electrode 122. The first metal oxide film 125 is not formed along the entire profile of the first gate insulating film 130.

Further, the first metal oxide film 125 also may not be positioned between the first wire pattern 110 and the third wire pattern 310, nor between the first wire pattern 110 and the first fin-type protruding portion 100P.

Additionally, the portion of the second lower gate electrode 222 surrounding the second wire pattern 210, and the portion of the second lower gate electrode 222 surrounding the fourth wire pattern 410 may contact each other.

Accordingly, the second upper gate electrode 224 may not be interposed between the second wire pattern 210 and the fourth wire pattern 410, nor between the second wire pattern 210 and the second fin-type protruding portion 200P.

Figure 51:
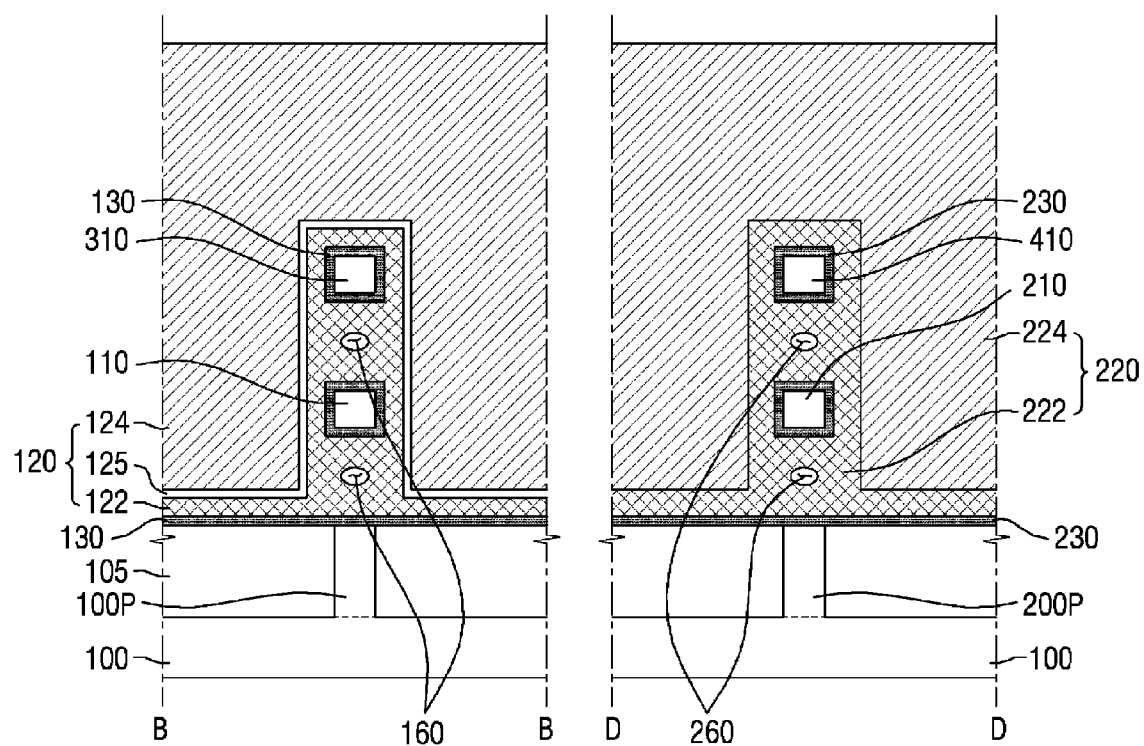
FIG. 51 shows views provided to explain a semiconductor device according to some example embodiments of the present disclosure.

FIG. 51 shows views provided to explain a semiconductor device according to some example embodiments. For convenience of explanation, differences that are not explained above with reference to FIGS. 49 and 50 will be mainly explained below.

Referring to FIG. 51, in a semiconductor device according to some example embodiments, the first gate electrode 120 may include a first gate electrode air gap 160 defined by the first lower gate electrode 122.

The first gate electrode air gap 160 may not contact the first metal oxide film 125.

Further, the second gate electrode 220 may include a second gate electrode air gap 260 defined by the second lower gate electrode 222.

Figure 52:
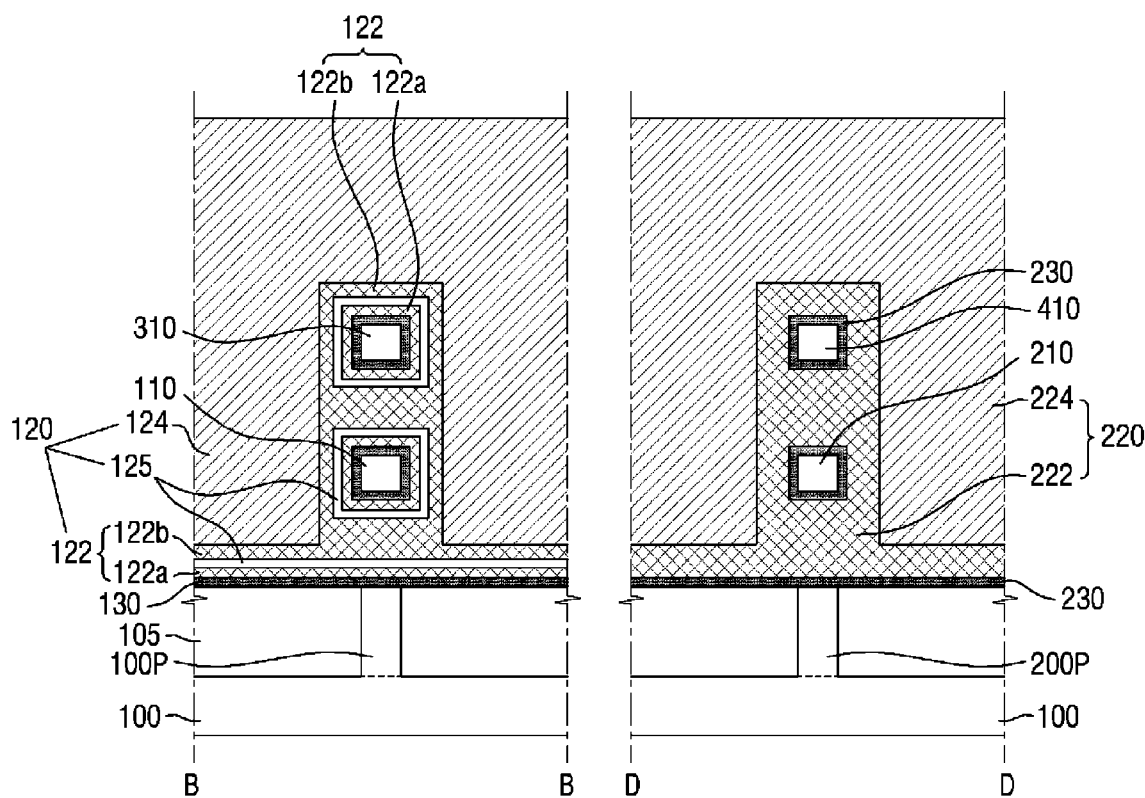
FIG. 52 shows views provided to explain a semiconductor device according to some example embodiments of the present disclosure.

FIG. 52 shows views provided to explain a semiconductor device according to some example embodiments. For convenience of explanation, differences that are not explained above with reference to FIGS. 49 and 50 will be mainly explained below.

Referring to FIG. 52, in a semiconductor device according to some example embodiments, the first lower gate electrode 122 may include the first portion 122a of the first lower gate electrode and the second portion 122b of the first lower gate electrode, which are divided by the first metal oxide film 125.

With respect to each of the first wire pattern 110 and the third wire pattern 310, the first gate insulating film 130, the first portion 122a of the first lower gate electrode, and the first metal oxide film 125 may be formed in a sequential order.

The second portion 122b of the first lower gate electrode may entirely surround the first wire pattern 110 and the third wire pattern 310 that have the first metal oxide film 125 formed therearound.

Since the first metal oxide film 125 is formed with respect to the first wire pattern 110 and the third wire pattern 310, respectively, the first metal oxide film 125 may be formed along the entire profile of the first gate insulating film 130.

Figure 53A:
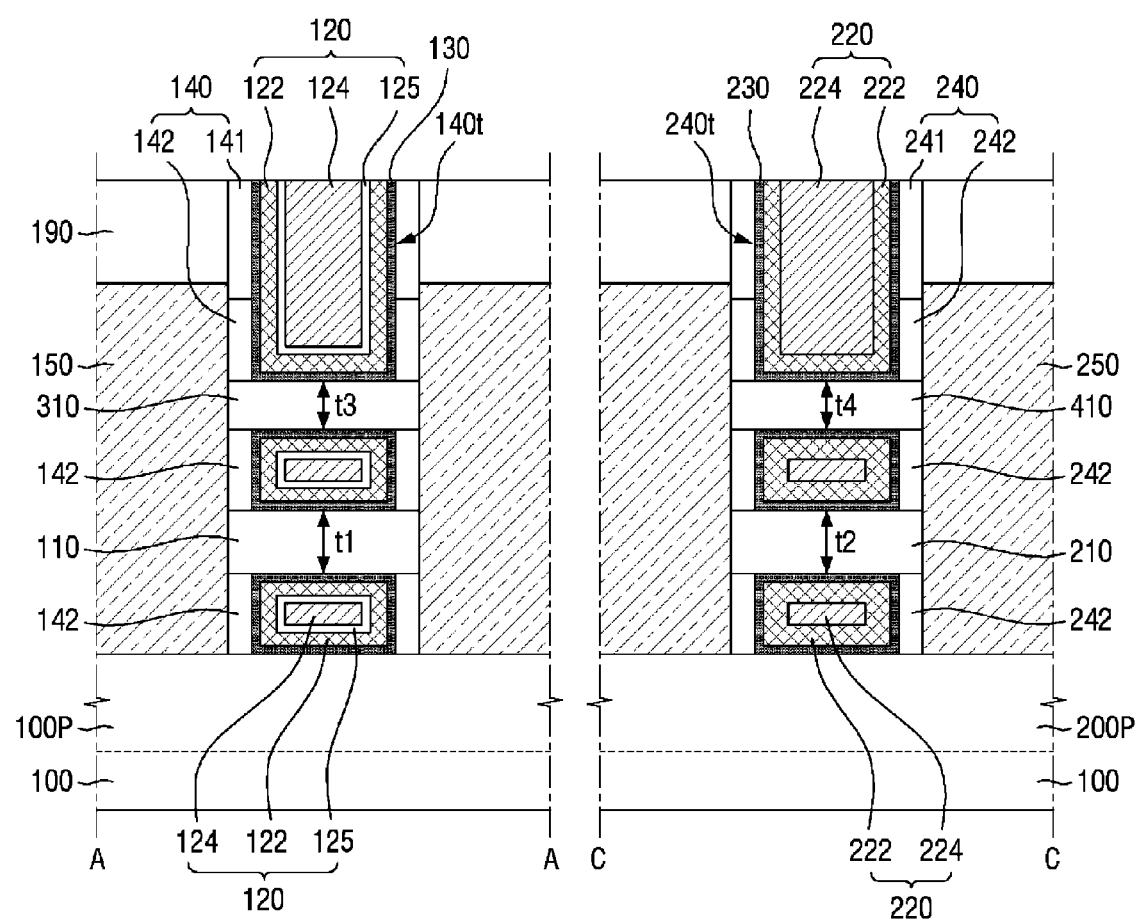
FIGS. 53A to 53C are views provided to explain a semiconductor device according to some example embodiments of the present disclosure.
Figure 53B:
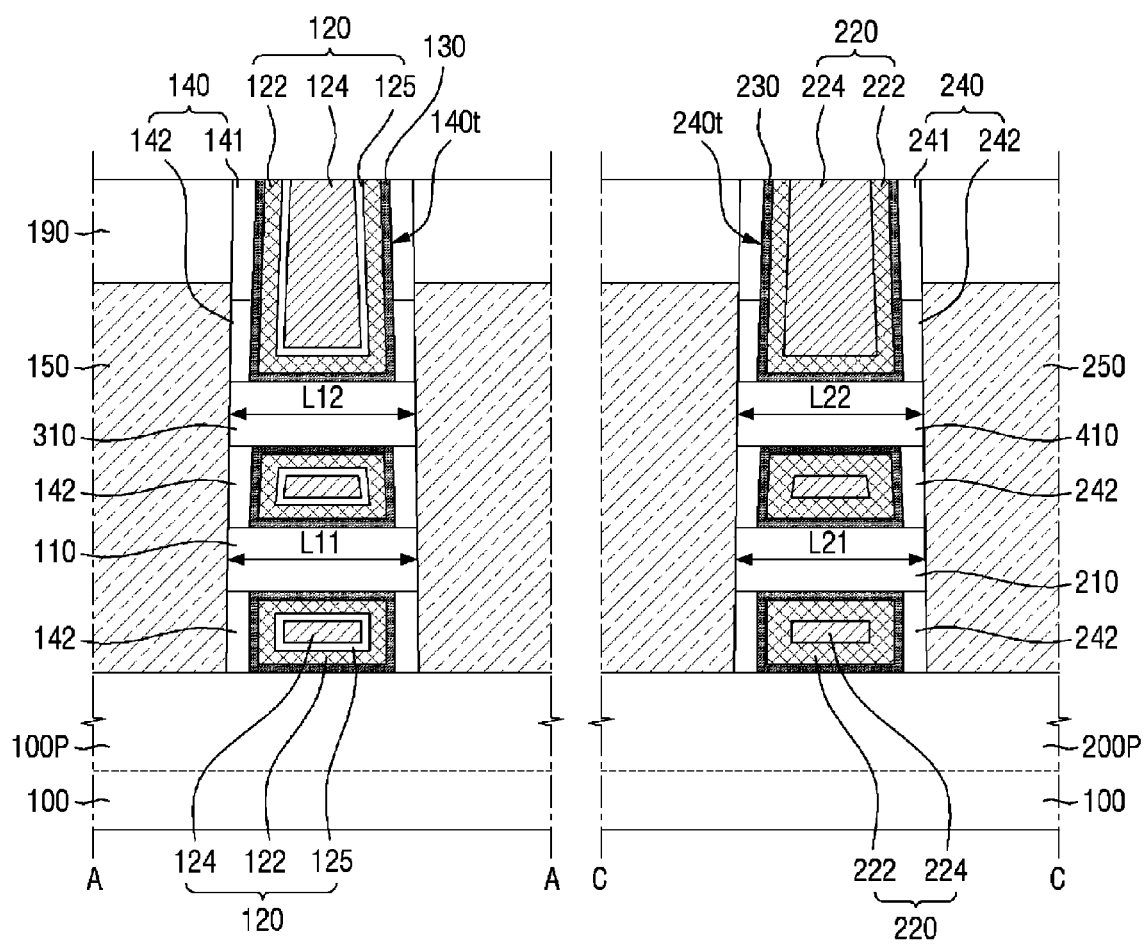
Figure 53C:
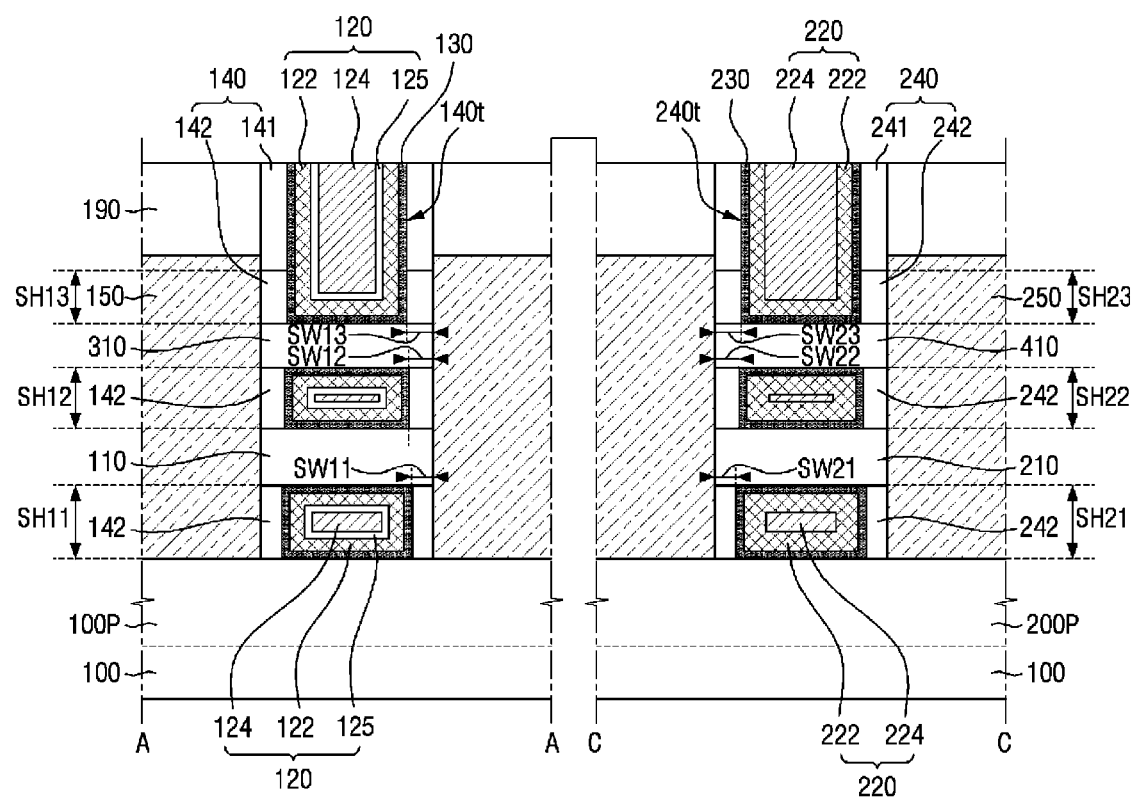

FIGS. 53A to 53C are views provided to explain a semiconductor device according to some example embodiments. For convenience of explanation, differences from the description provided with reference to FIGS. 40 to 43 will be mainly described with reference to FIGS. 53A and 53B, and differences from the description provided with reference to FIG. 53A will be mainly described with reference to FIG. 53C.

Referring to FIG. 53A, in the semiconductor device according to some example embodiments, the thickness t1 of the first wire pattern 110 may be different from the thickness t3 of the third wire pattern 310, and the thickness t2 of the second wire pattern 210 may be different from the thickness t4 of the fourth wire pattern 410.

The thicknesses of the first wire pattern 110 and the third wire pattern 310 stacked on the substrate 100 in the first region I may be different from each other, and the thicknesses of the second wire pattern 210 and the fourth wire pattern 410 stacked on the substrate 100 in the second region II may be different from each other.

For example, the thickness t1 of the first wire pattern 110 may be greater than the thickness t3 of the third wire pattern 310, and the thickness t2 of the second wire pattern 210 may be greater than the thickness t4 of the fourth wire pattern 410.

For example, the thickness of each of the stacked wire patterns may be decreased with the increasing distance from the upper surface of the substrate 100.

Referring to FIG. 53B, in the semiconductor device according to some example embodiments, the width L11 of the first wire pattern 110 may be different from the width L12 of the third wire pattern 310, and the width L21 of the second wire pattern 210 may be different from the width L22 of the fourth wire pattern 410.

The widths of the first wire pattern 110 and the third wire pattern 310 stacked on the substrate 100 in the first region I may be different from each other, and the widths of the second wire pattern 210 and the fourth wire pattern 410 stacked on the substrate 100 in the second region II may be different from each other.

For example, the width L11 of the first wire pattern 110 may be greater than the width L12 of the third wire pattern 310, and the width L21 of the second wire pattern 210 may be greater than the width L22 of the fourth wire pattern 410.

For example, the width of each of the stacked wire patterns may be decreased with the increasing distance from the upper surface of the substrate 100.

Referring to FIG. 53C, in a semiconductor device according to some example embodiments, the width SW11 of the first inner spacer 142 positioned between the substrate 100 and the first wire pattern 110 may be less than the width SW12 of the first inner spacer 142 positioned between the first wire pattern 110 and the third wire pattern 310.

Further, the width SW12 of the first inner spacer 142 positioned between the first wire pattern 110 and the third wire pattern 310 may be less than the width SW13 of the first inner spacer 142 positioned between the third wire pattern 310 and the first outer spacer 141.

In contrast, the height SH11 of the first inner spacer 142 positioned between the substrate 100 and the first wire pattern 110 may be greater than the height SH12 of the first inner spacer 142 positioned between the first wire pattern 110 and the third wire pattern 310.

Further, the height SH12 of the first inner spacer 142 positioned between the first wire pattern 110 and the third wire pattern 310 may be greater than the height SH13 of the first inner spacer 142 positioned between the third wire pattern 310 and the first outer spacer 141.

For example, the width of the first inner spacer 142 may increase and the height of the first inner spacer 142 may decrease, as the distance from the substrate 100 increases.

Additionally, the width of the first gate electrode 120 disposed between the first inner spacers 142 may be influenced by the widths of the first inner spacers 142.

Accordingly, the width of the first gate electrode 120 positioned between the first wire pattern 110 and the third wire pattern 310 may be less than the width of the first gate electrode 120 positioned between the substrate 100 and the first wire pattern 110, but may be greater than the width of the first gate electrode 120 positioned on the third wire pattern 310.

Further, the height of the first gate electrode 120 disposed between the first inner spacers 142 may be influenced by the heights of the first inner spacers 142.

Accordingly, the height of the first gate electrode 120 positioned between the first wire pattern 110 and the third wire pattern 310 may be less than the height of the first gate electrode 120 positioned between the substrate 100 and the first wire pattern 110.

The width SW21 of the second inner spacer 242 positioned between the substrate 100 and the second wire pattern 210 may be less than the width SW22 of the second inner spacer 242 positioned between the second wire pattern 210 and the fourth wire pattern 410.

Further, the width SW22 of the second inner spacer 242 positioned between the second wire pattern 210 and the fourth wire pattern 410 may be less than the width SW23 of the second inner spacer 242 positioned between the fourth wire pattern 410 and the second outer spacer 241.

In contrast, the height SH21 of the second inner spacer 242 positioned between the substrate 100 and the second wire pattern 210 may be greater than the height SH22 of the second inner spacer 242 positioned between the second wire pattern 210 and the fourth wire pattern 410.

Further, the height SH22 of the second inner spacer 242 positioned between the second wire pattern 210 and the fourth wire pattern 410 may be greater than the height SH23 of the second inner spacer 242 positioned between the fourth wire pattern 410 and the second outer spacer 241.

For example, the width of the second inner spacer 242 may increase and the height of the second inner spacer 242 may decrease, as the distance from the substrate 100 increases.

Additionally, changes in the width and height of the second gate electrode 220 according to the increasing distance from the substrate 100 will not be redundantly described below, as this may be substantially similar to the example of the first gate electrode 120 described above.

Figure 54:
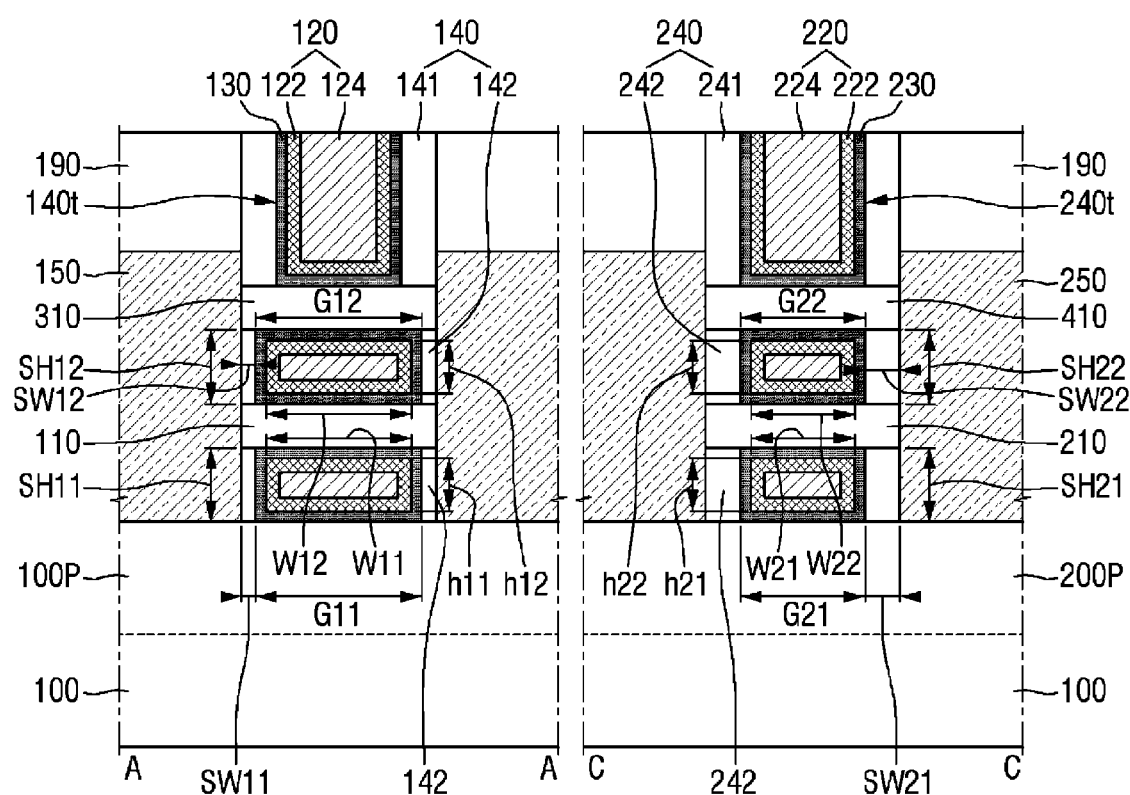
FIGS. 54 to 55B are views provided to explain a semiconductor device according to some example embodiments of the present disclosure.
Figure 55A:
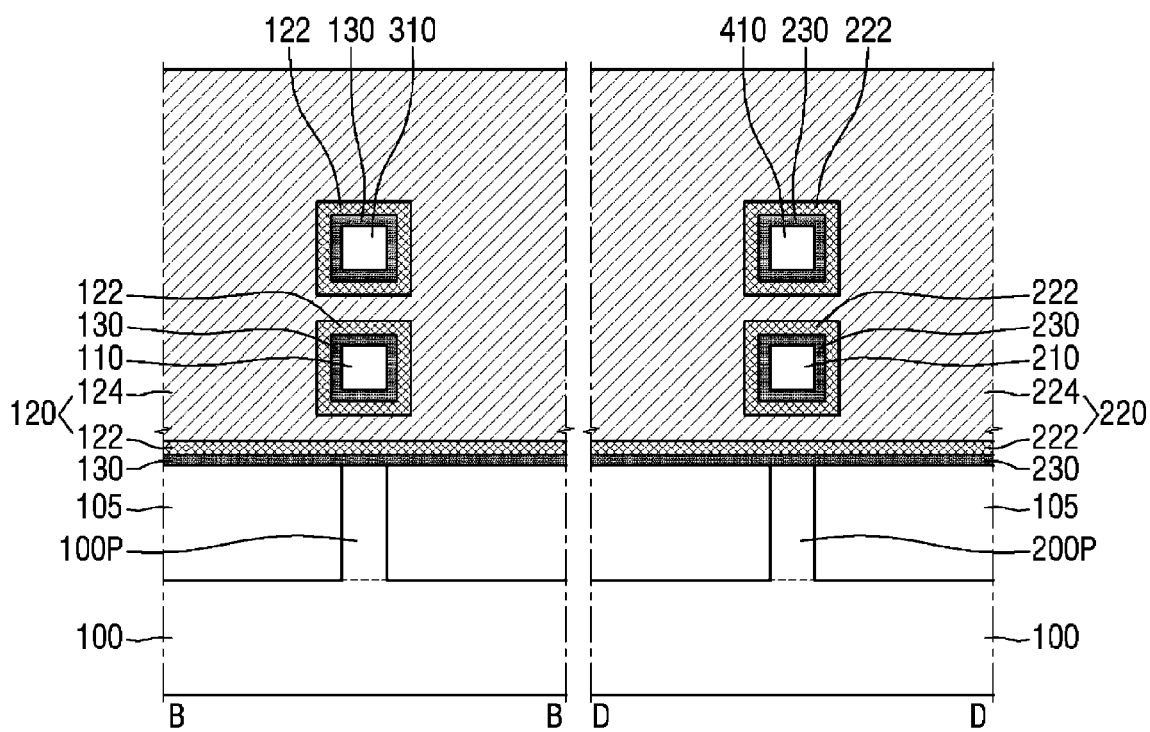
Figure 55B:
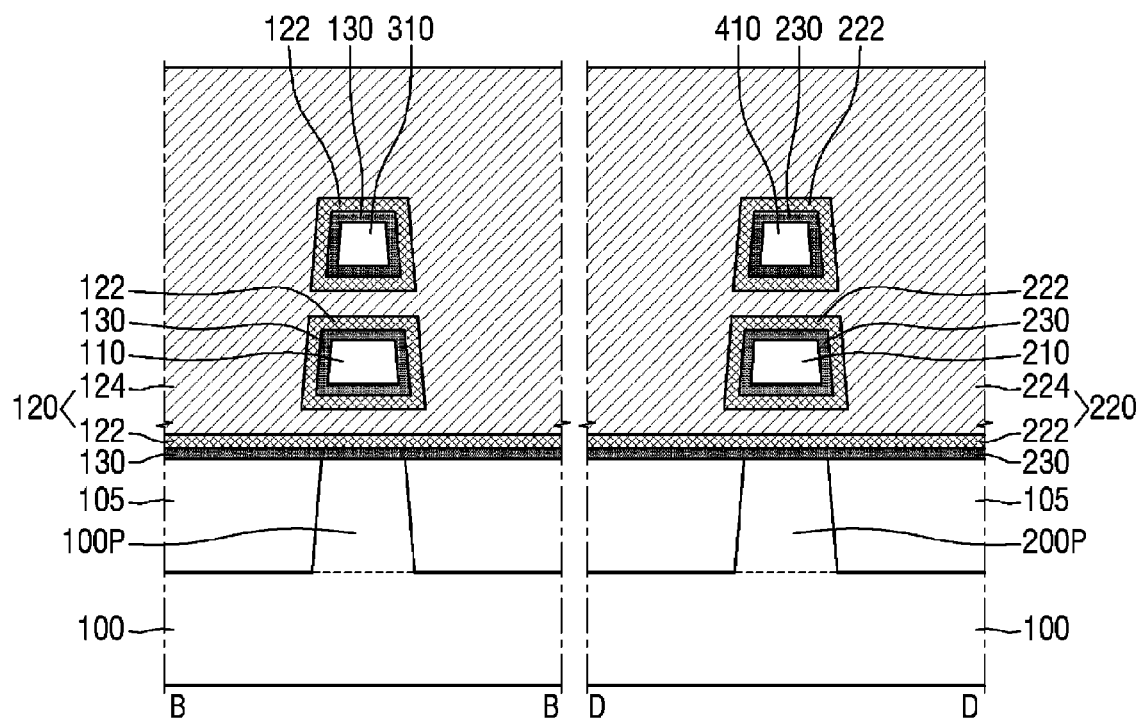

FIGS. 54 to 55B are views provided to explain a semiconductor device according to some example embodiments of the present disclosure. For convenience of explanation, differences that are not explained above with reference to FIGS. 40 to 43 will be mainly explained below.

In FIG. 54, it assumed the first inner spacer 142 is not disposed on the third wire pattern 310 between the first outer spacer 141 and the third wire pattern 310, and the second inner spacer 242 is not disposed on the fourth wire pattern 410 between the second outer spacer 241 and the fourth wire pattern 410.

Referring to FIGS. 54 to 55B, in a semiconductor device according to some example embodiments of this present disclosure, the width SW11 of the first gate spacer 140 disposed between the first gate electrode 120 and the first source/drain region 150 between the first wire pattern 110 and the substrate 100 may be smaller than the width SW21 of the second gate spacer 240 disposed between the second gate electrode 220 and the second source/drain region 250 between the second wire pattern 210 and the substrate 100.

For example, a distance G11 between the first gate spacers 140 between the first wire pattern 110 and the substrate 100 may be greater than a distance G21 of the second gate spacers 240 between the second wire pattern 210 and the substrate 100.

Since the distance G11 between the first inner spacers 142 is greater than the distance G21 between the second inner spacers 242, the width W11 of the first gate electrode 120 between the first wire pattern 110 and the substrate 100 may be greater than the width W21 of the second gate electrode 220 between the second wire pattern 210 and the substrate 100.

On the other hand, a height SH11 of the first gate spacers 140 between the first wire pattern 110 and the substrate 100 may be substantially identical to a height SH21 of the second gate spacers 240 between the second wire pattern 210 and the substrate 100.

Accordingly, a height h11 of the first gate electrodes 120 between the first wire pattern 110 and the substrate 100 may be substantially identical to a height h21 of the second gate electrodes 220 between the second wire pattern 210 and the substrate 100.

Furthermore, the width SW11 of the first gate spacer 140 disposed between the first gate electrode 120 and the first source/drain region 150 between the first wire pattern 110 and the substrate 100 may be substantially identical to the width SW12 of the first gate spacer 140 disposed between the first gate electrode 120 and the first source/drain region 150 between the first wire pattern 110 and the third wire pattern 310.

The distance G11 between the first gate spacers 140 between the first wire pattern 110 and the substrate 100 may be substantially identical to the distance G12 between the first gate spacers 140 between the first wire pattern 110 and the third wire pattern 310.

The height SH11 of the first gate spacers 140 between the first wire pattern 110 and the substrate 100 may be substantially identical to the height SH12 of the first gate spacers 140 between the first wire pattern 110 and the third wire pattern 310.

Accordingly, the width W11 of the first gate electrode 120 between the first wire pattern 110 and the substrate 100 may be substantially identical to the width W12 of the first gate electrode 120 between the first wire pattern 110 and the third wire pattern 310.

For example, a width W11 of the first gate electrode 120 and the first wire pattern 110 overlapping each other between the first wire pattern 110 and the substrate 100 may be substantially identical to a width W12 of the first gate electrode 120 and the first wire pattern 110 overlapping each other between the first wire pattern 110 and the third wire pattern 310.

The height h11 of the first gate electrodes 120 between the first wire pattern 110 and the substrate 100 may be substantially identical to the height h12 of the first gate electrodes 120 between the first wire pattern 110 and the third wire pattern 310.

Furthermore, a width SW21 of the second gate spacers 240 disposed between the second gate electrode 220 and the second source/drain region 250 between the second wire pattern 210 and the substrate 100 may be substantially identical to a width SW22 of the second gate spacers 240 disposed between the second gate electrode 220 and the second source/drain region 250 between the second wire pattern 210 and the fourth wire pattern 410.

A distance G21 between the second gate spacers 240 between the second wire pattern 210 and the substrate 100 may be substantially identical to a distance G22 between the second gate spacers 240 between the second wire pattern 210 and the fourth wire pattern 410.

A height SH21 of the second gate spacers 240 between the second wire pattern 210 and the substrate 100 may be substantially identical to a height SH22 of the second gate spacers 240 between the second wire pattern 210 and the fourth wire pattern 410.

Accordingly, a width W21 of the second gate electrode 220 between the second wire pattern 210 and the substrate 100 may be substantially identical to a width W22 of the second gate electrode 220 between the second wire pattern 210 and the fourth wire pattern 410.

For example, the width W21 of the second gate electrode 220 and the second wire pattern 210 overlapping each other between the second wire pattern 210 and the substrate 100 may be substantially identical to the width W22 of the second gate electrode 220 and the second wire pattern 210 overlapping each other between the second wire pattern 210 and the fourth wire pattern 410.

The height h21 of the second gate electrodes 220 between the second wire pattern 210 and the substrate 100 may be substantially identical to the height h22 of the second gate electrodes 220 between the second wire pattern 210 and the fourth wire pattern 410.

A distance G11 between the first gate spacers 140 between the first wire pattern 110 and the substrate 100 may be substantially identical to a distance G12 between the first gate spacers 140 between the first wire pattern 110 and the third wire pattern 310, and a distance G21 between the second gate spacers 240 between the second wire pattern 210 and the substrate 100 may be substantially identical to a distance G22 between the second gate spacers 240 between the second wire pattern 210 and the fourth wire pattern 410.

Accordingly, the distance G12 between the first gate spacers 140 between the first wire pattern 110 and the third wire pattern 310 may be greater than the distance G22 between the second gate spacers 240 between the second wire pattern 210 and the fourth wire pattern 410.

Furthermore, a width SW12 of the first gate spacers 140 disposed between the first gate electrode 120 and the first source/drain region 150 between the first wire pattern 110 and the third wire pattern 310 may be smaller than a width SW22 of the second gate spacers 240 disposed between the second gate electrode 220 and the second source/drain region 250 between the second wire pattern 210 and the fourth wire pattern 410.

Accordingly, a width W12 of the first gate electrodes 120 between the first wire pattern 110 and the third wire pattern 310 may be greater than a width W22 of the second gate electrode 220 between the second wire pattern 210 and the fourth wire pattern 410.

In FIG. 55B, a width of the first wire pattern 110 in the third direction Y1 may be different from a width of the third wire pattern 310 in the third direction Y1, unlike in FIG. 55A.

Likewise, a width of the second wire pattern 210 in the fourth direction Y2 may be different from a width of the fourth wire pattern 410 in the fourth direction Y2.

In a semiconductor device according to some embodiments of the present disclosure, explanation will be made on based on an assumption that when the wire pattern includes an upper surface and a lower surface that are parallel to the upper surface of the substrate 100, a width of the wire pattern means a width of the lower surface of the wire pattern.

For example, a width of the first wire pattern 110 in the third direction Y1 may be greater than a width of the third wire pattern 310 in the third direction Y1. Furthermore, a width of the second wire pattern 210 in the fourth direction Y2 may be greater than a width of the fourth wire pattern 410 in the fourth direction Y2.

For example, the width of the wire pattern may decrease as it gets farther away from the upper surface of the substrate 100.

Likewise, in the semiconductor device according to some example embodiments of this present disclosure explained with reference to FIGS. 40 to 43, a width of the first wire pattern 110 in the third direction Y1 may be greater than a width of the third wire pattern 310 in the third direction Y1.

Figure 56:
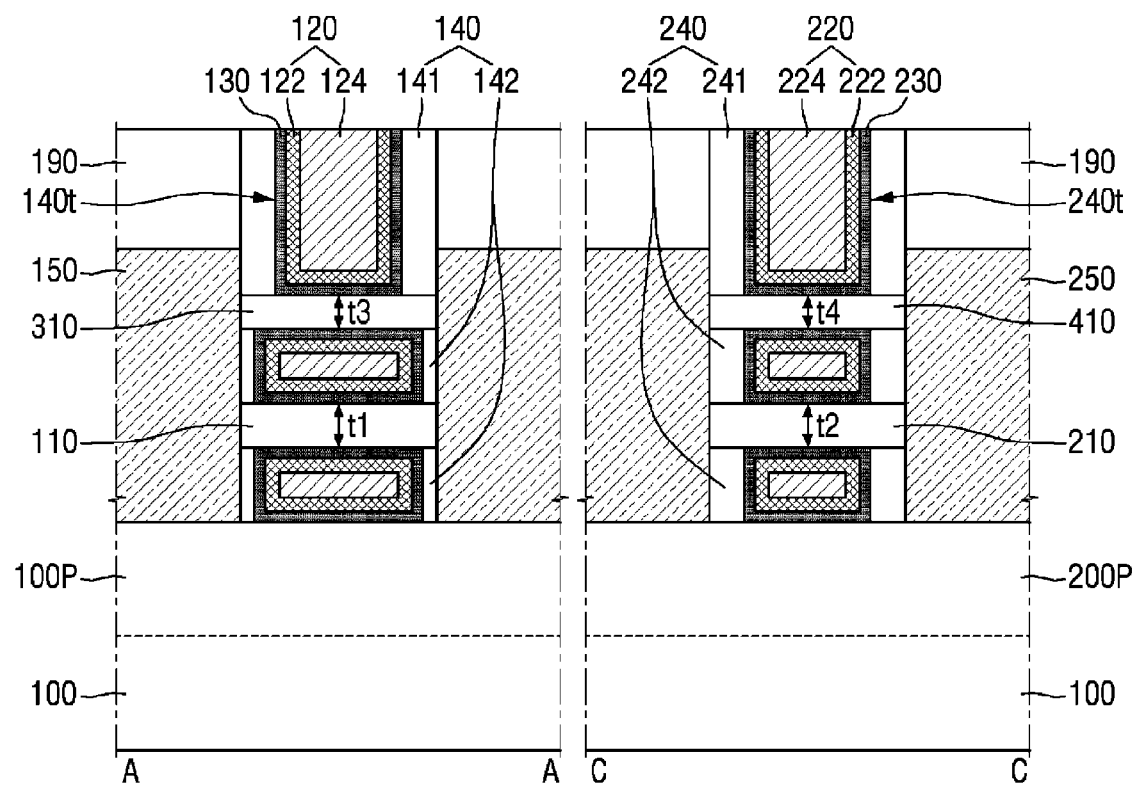
FIG. 56 shows views provided to explain a semiconductor device according to some example embodiments of the present disclosure.
Figure 57:
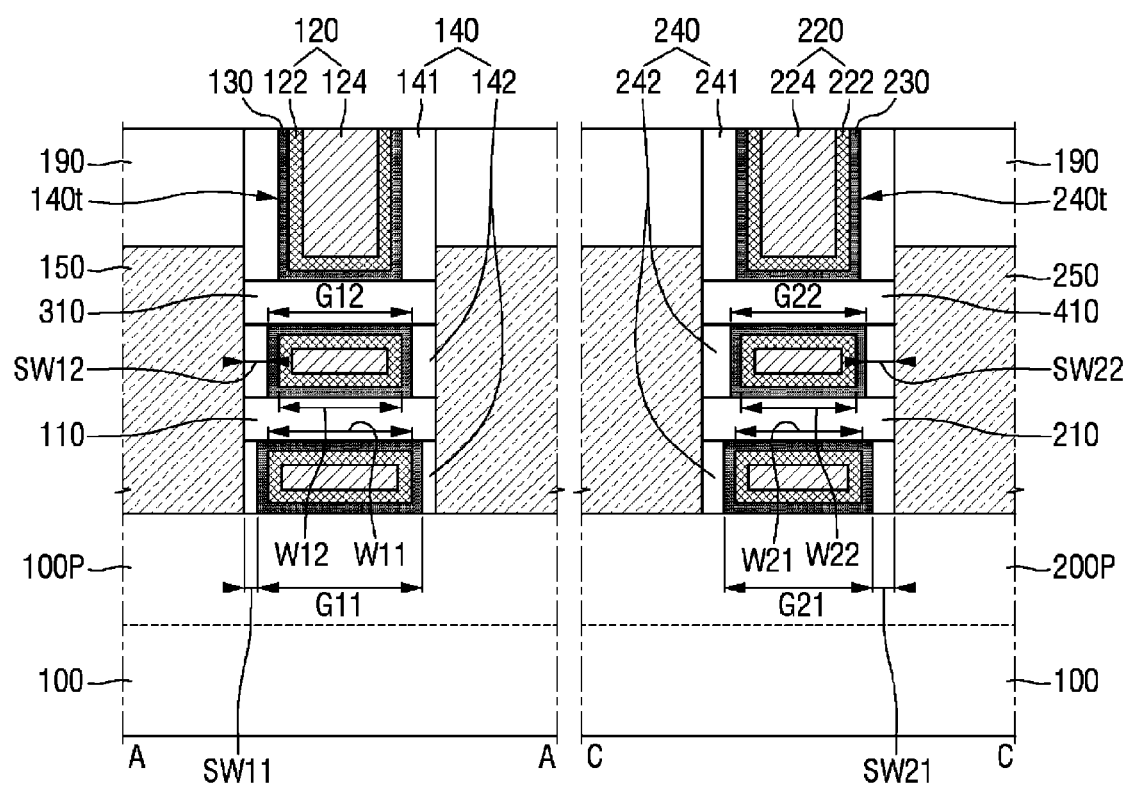
FIG. 57 shows views provided to explain a semiconductor device according to some example embodiments of the present disclosure.
Figure 58:
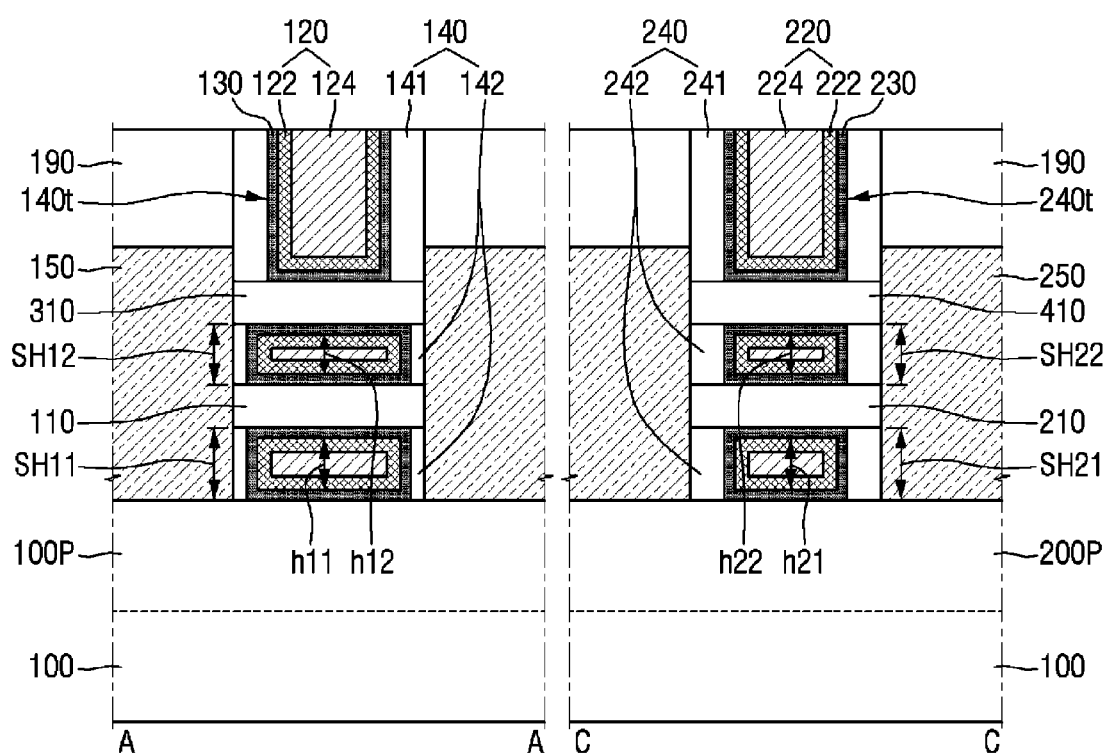
FIG. 58 shows views provided to explain a semiconductor device according to some example embodiments of the present disclosure.

FIG. 56 is a view of a semiconductor device according to some embodiments of the present disclosure. FIG. 57 is a view of a semiconductor device according to some embodiments of the present disclosure. FIG. 58 is a view of a semiconductor device according to some embodiments of the present disclosure. For convenience of explanation, differences that are not explained above with reference to FIGS. 54 to 55B will be mainly explained below.

Referring to FIG. 56, in a semiconductor device according to some embodiments of the present disclosure, a thickness t1 of the first wire pattern 110 may be different from a thickness t3 of the third wire pattern 310, and a thickness t2 of the second wire pattern 210 may be different from a thickness t4 of the fourth wire pattern 410.

The thicknesses of the first wire pattern 110 and the third wire pattern 310 stacked on the substrate 100 in the first region I may be different from each other, and the thicknesses of the second wire pattern 210 and the fourth wire pattern 410 stacked on the substrate 100 in the second region II may be different from each other.

For example, a thickness t1 of the first wire pattern 110 may be greater than a thickness t3 of the third wire pattern 310, and a thickness t2 of the second wire pattern 210 may be greater than a thickness t4 of the fourth wire pattern 410.

For example, as it gets farther away from the upper surface of the substrate 100, the thickness of each of the laminated wire pattern may decrease.

Referring to FIG. 57, in a semiconductor device according to some embodiments of the present disclosure, a distance G11 between the first gate spacers 140 between the first wire pattern 110 and the substrate 100 may be greater than a distance G12 between the first gate spacers 140 between the first wire pattern 110 and the third wire pattern 310.

A width SW11 of the first gate spacer 140 disposed between the first gate electrode 120 and the first source/drain region 150 between the first wire pattern 110 and the substrate 100 may be smaller than a width SW12 of the first gate spacer 140 disposed between the first gate electrode 120 and the first source/drain region 150 between the first wire pattern 110 and the third wire pattern 310.

Furthermore, a distance G21 between the second gate spacers 240 between the second wire pattern 210 and the substrate 100 may be greater than a distance G22 between the second gate spacers 240 between the second wire pattern 210 and the fourth wire pattern 410.

A width SW21 of the second gate spacer 240 disposed between the second gate electrode 220 and the second source/drain region 250 between the second wire pattern 210 and the substrate 100 may be smaller than a width SW22 of the second gate spacer 240 disposed between the second gate electrode 220 and the second source/drain region 250 between the second wire pattern 210 and the fourth wire pattern 410.

Accordingly, a width W11 of the first gate electrode 120 between the first wire pattern 110 and the substrate 100 may be greater than a width W12 of the first gate electrode 120 between the first wire pattern 110 and the third wire pattern 310.

For example, a width W11 of the first gate electrode 120 and the first wire pattern 110 overlapping each other between the first wire pattern 110 and the substrate 100 may be greater than a width W12 of the first gate electrode 120 and the first wire pattern 110 overlapping each other between the first wire pattern 110 and the third wire pattern 310.

A width W21 of the second gate electrode 220 between the second wire pattern 210 and the substrate 100 may be greater than a width W22 of the second gate electrode 220 between the second wire pattern 210 and the fourth wire pattern 410.

For example, a width W21 of the second gate electrode 220 and the second wire pattern 210 overlapping each other between the second wire pattern 210 and the substrate 100 may be greater than a width W22 of the second gate electrode 220 and the second wire pattern 210 overlapping each other between the second wire pattern 210 and the fourth wire pattern 410.

For example, as it gets farther away from the upper surface of the substrate 100, each of the width of the first inner spacer 142 and the width of the second inner spacer 242 may increase.

On the other hand, as it gets farther away from the upper surface of the substrate 100, each of the distance between the first inner spacers 142 and the distance between the second inner spacers 242 may decrease.

Referring to FIG. 58, a height SH11 of the first gate spacer 140 between the first wire pattern 110 and the substrate 100 may be greater than a height SH12 of the first gate spacer 140 between the first wire pattern 110 and the third wire pattern 310.

Furthermore, a height SH21 of the second gate spacer 240 between the second wire pattern 210 and the substrate 100 may be greater than a height SH22 of the second gate spacer between the second wire pattern 210 and the fourth wire pattern 410.

For example, as it gets farther away from the upper surface of the substrate 100, the height of each of the first inner spacer 142 and the second inner spacer 242 may decrease.

Accordingly, a height h11 of the first gate electrode 120 between the first wire pattern 110 and the substrate 100 may be greater than a height h12 of the first gate electrode 120 between the first wire pattern 110 and the third wire pattern 310.

A height h21 of the second gate electrode 220 between the second wire pattern 210 and the substrate 100 may be greater than a height h22 of the second gate electrode 220 between the second wire pattern 210 and the fourth wire pattern 410.

Furthermore, a height h11 of the first gate electrode 120 between the first wire pattern 110 and the substrate 100 may be greater than a height h12 of the first gate electrode 120 between the first wire pattern 110 and the third wire pattern 310, but each of the first gate electrode 120 between the first wire pattern 110 and the substrate 100 and the first gate electrode 120 between the first wire pattern 110 and the third wire pattern 310 may each include the first lower gate electrode 122 laminated on the first wire pattern 110, and then the first upper gate electrode 124 laminated on the first lower gate electrode 122 in a sequential order.

Likewise, the second gate electrode 220 between the second wire pattern 210 and the substrate 100 and the second gate electrode 220 between the second wire pattern 210 and the fourth wire pattern 410 may each include a second lower gate electrode 222 laminated on the second wire pattern 210, and then a second upper gate electrode 224 laminated on the second lower gate electrode 222 in a sequential order.

Figure 59:
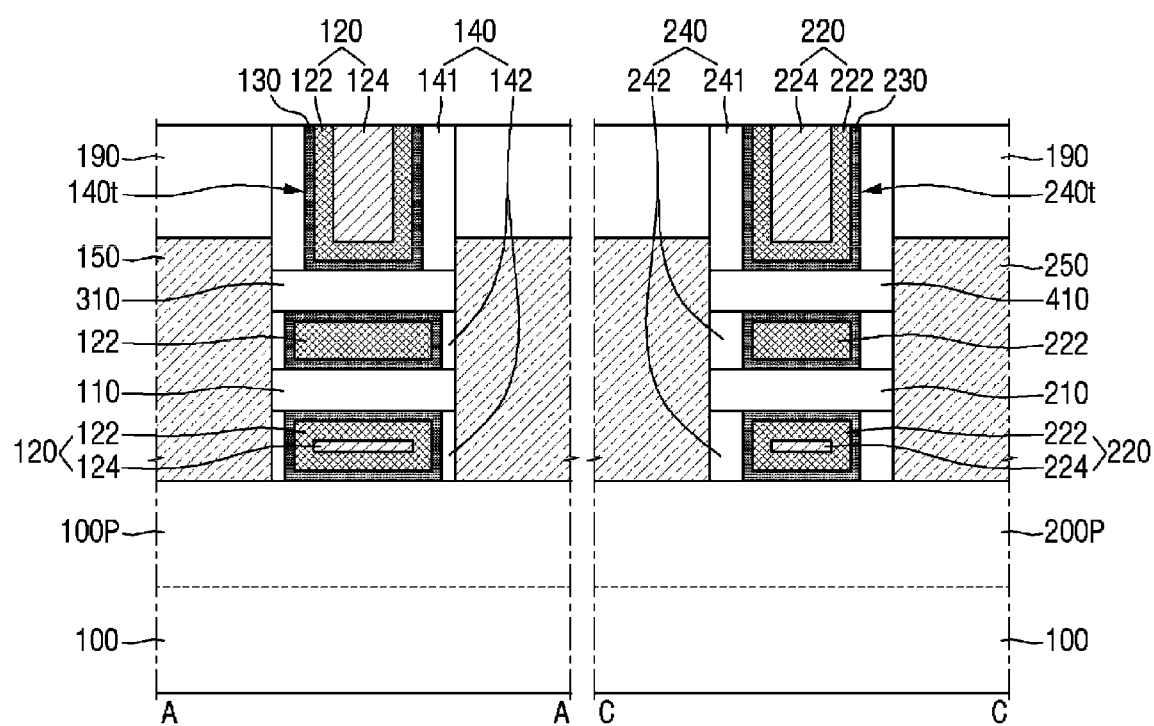
FIG. 59 shows views provided to explain a semiconductor device according to some example embodiments of the present disclosure.
Figure 60:
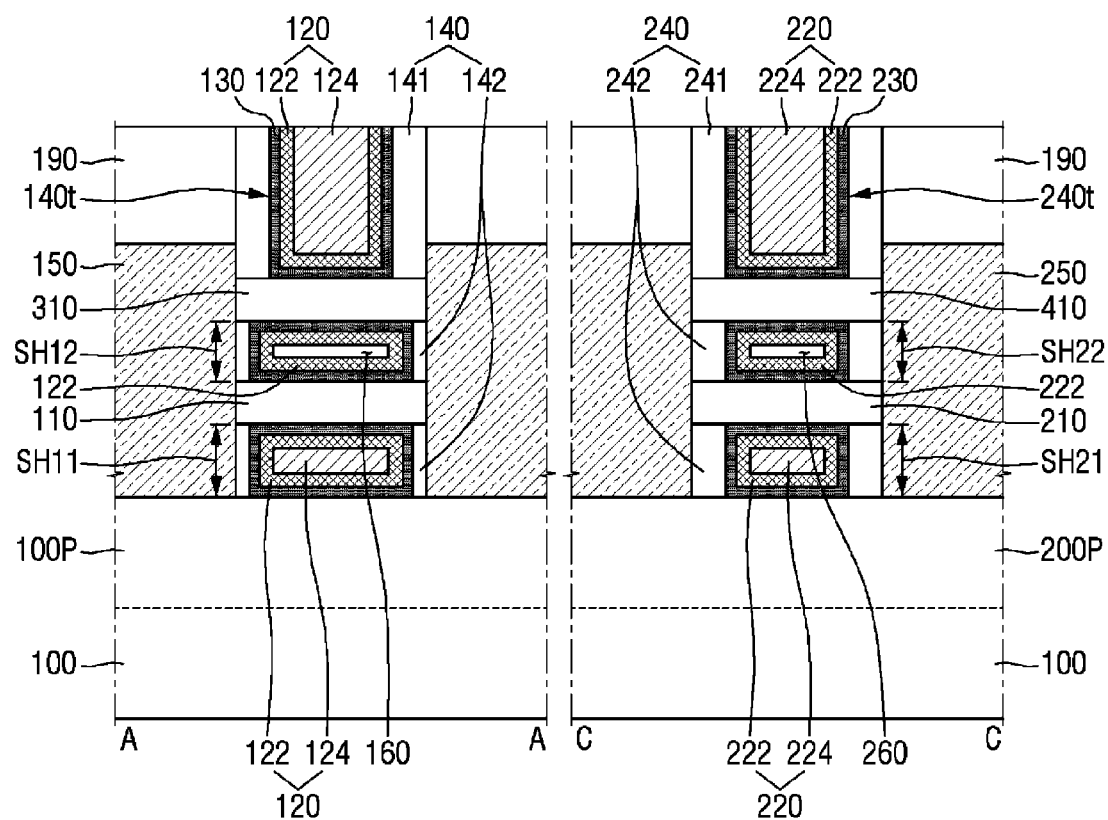
FIG. 60 shows views provided to explain a semiconductor device according to some example embodiments of the present disclosure.

FIG. 59 is a view of a semiconductor device according to some embodiments of the present disclosure. FIG. 60 shows views provided to explain a semiconductor device according to some example embodiments. For convenience of explanation, differences that are not explained above with reference to FIG. 58 will be mainly explained below.

Referring to FIG. 59, in a semiconductor device according to some embodiments of the present disclosure, the first gate electrode 120 between the first wire pattern 110 and the substrate 100 may include the first lower gate electrode 122 laminated on the first wire pattern 110, and then the first upper gate electrode 124 on the first lower gate electrode 122 in a sequential order.

However, the first gate electrode 120 between the first wire pattern 110 and the third wire pattern 310 may include the first lower gate electrode 122 but not the first upper gate electrode 124.

Likewise, the second gate electrode 220 between the second wire pattern 210 and the substrate 100 may include the second lower gate electrode 222 laminated on the second wire pattern 210, and then the second upper gate electrode 224 on the second lower gate electrode 222 in a sequential order.

However, the second gate electrode 220 between the second wire pattern 210 and the fourth wire pattern 410 may include the second lower gate electrode 222 but not the second upper gate electrode 224.

For example, between the first wire pattern 110 and the third wire pattern 310, only the first lower gate electrode 122 may be formed and not the first upper gate electrode 124. Furthermore, between the second wire pattern 210 and the fourth wire pattern 410, only the second lower gate electrode 222 may be formed and not the second upper gate electrode 224.

Using FIG. 55A, the first upper gate electrode 124 may be formed on the field insulating film 105 but not between the first wire pattern 110 and the third wire pattern 310. The second upper gate electrode 224 may be formed on the field insulating film 105 but not between the second wire pattern 210 and the fourth wire pattern 410.

Since the height SH12 of the first gate spacer 140 between the first wire pattern 110 and the third wire pattern 310 is smaller than the height SH11 of the first gate spacer 140 between the first wire pattern 110 and the substrate 100, there may be not enough space to form the first upper gate electrode 124 between the first wire pattern 110 and the third wire pattern 310.

The second upper gate electrode 224 may not be formed between the second wire pattern 210 and the fourth wire pattern 410 for the same reason mentioned above.

Referring to FIG. 60, in a semiconductor device according to some embodiments of the present disclosure, the first gate electrode 120 between the first wire pattern 110 and the substrate 100 may not include an air gap, but the first gate electrode 120 between the first wire pattern 110 and the third wire pattern 310 may include the first gate electrode air gap 160.

Furthermore, the second gate electrode 220 between the second wire pattern 210 and the substrate 100 may not include an air gap, but the second gate electrode 220 between the second wire pattern 210 and the fourth wire pattern 410 may include the second gate electrode air gap 260.

Figure 61:
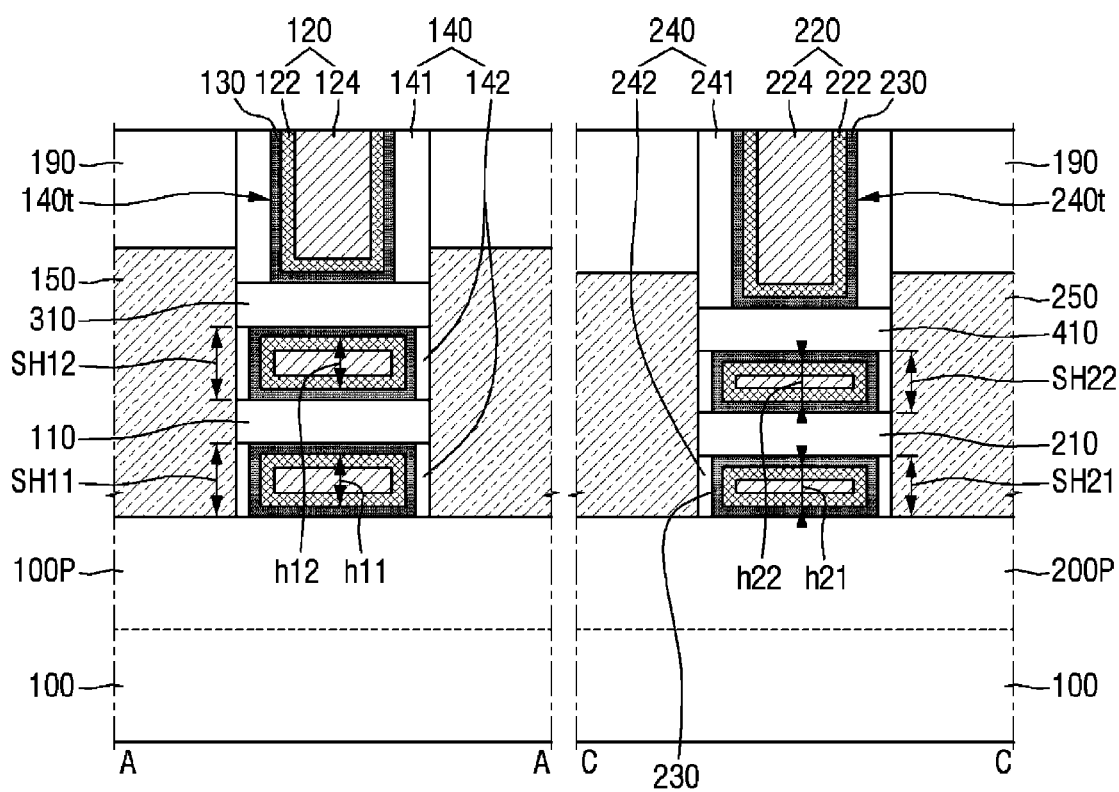
FIG. 61 shows views provided to explain a semiconductor device according to some example embodiments of the present disclosure.

FIG. 61 illustrates a semiconductor device according to some embodiments of the present disclosure. For convenience of explanation, differences that are not explained above with reference to FIG. 54 to FIG. 55B will be mainly explained below.

Referring to FIG. 61, in a semiconductor device according to some embodiments of the present disclosure, the height SH11 of the first gate spacer 140 between the first wire pattern 110 and the substrate 100 may be greater than the height SH21 of the second gate spacer 240 between the second wire pattern 210 and the substrate 100.

Furthermore, a height SH12 of the first gate spacer 140 between the first wire pattern 110 and the third wire pattern 310 may be greater than a height SH22 of the second gate spacer 240 between the second wire pattern 210 and the fourth wire pattern 410.

Accordingly, a height h11 of the first gate electrode 120 between the first wire pattern 110 and the substrate 100 is greater than a height 21 of the second gate electrode 220 between the second wire pattern 210 and the substrate 100. Furthermore, a height h12 of the first gate electrode 120 between the first wire pattern 110 and the third wire pattern 310 is greater than a height h22 of the second gate electrode 220 between the second wire pattern 210 and the fourth wire pattern 410.

Figure 62:
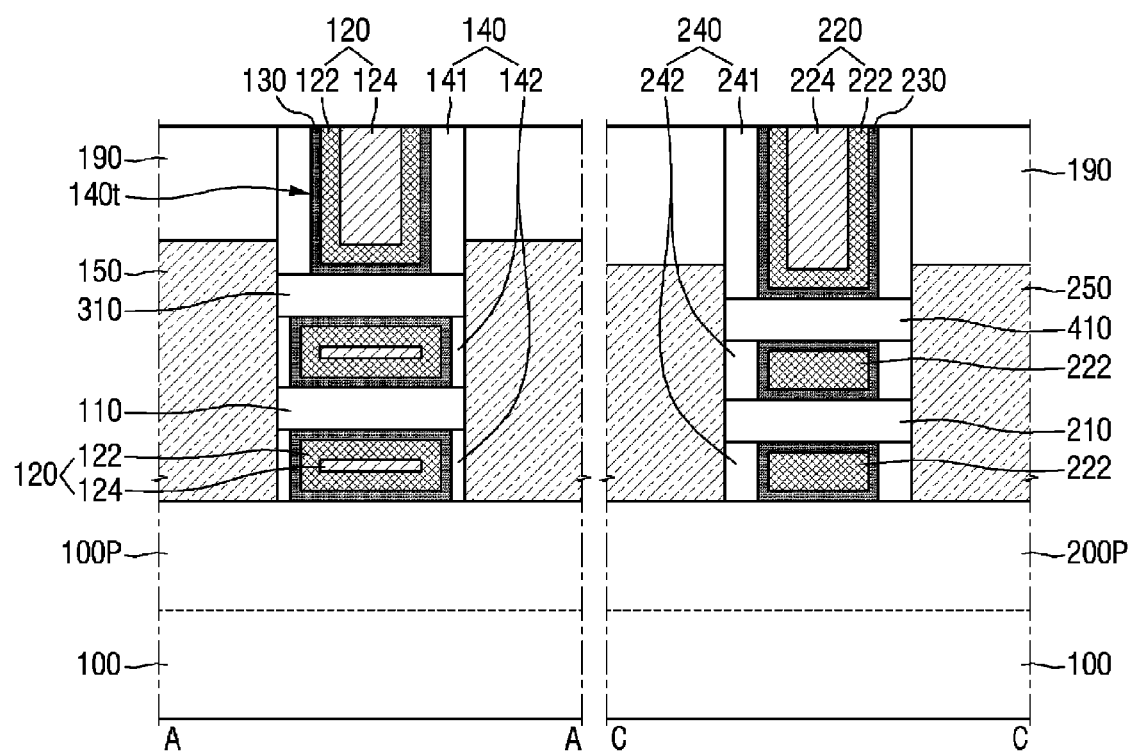
FIG. 62 shows views provided to explain a semiconductor device according to some example embodiments of the present disclosure.
Figure 63:
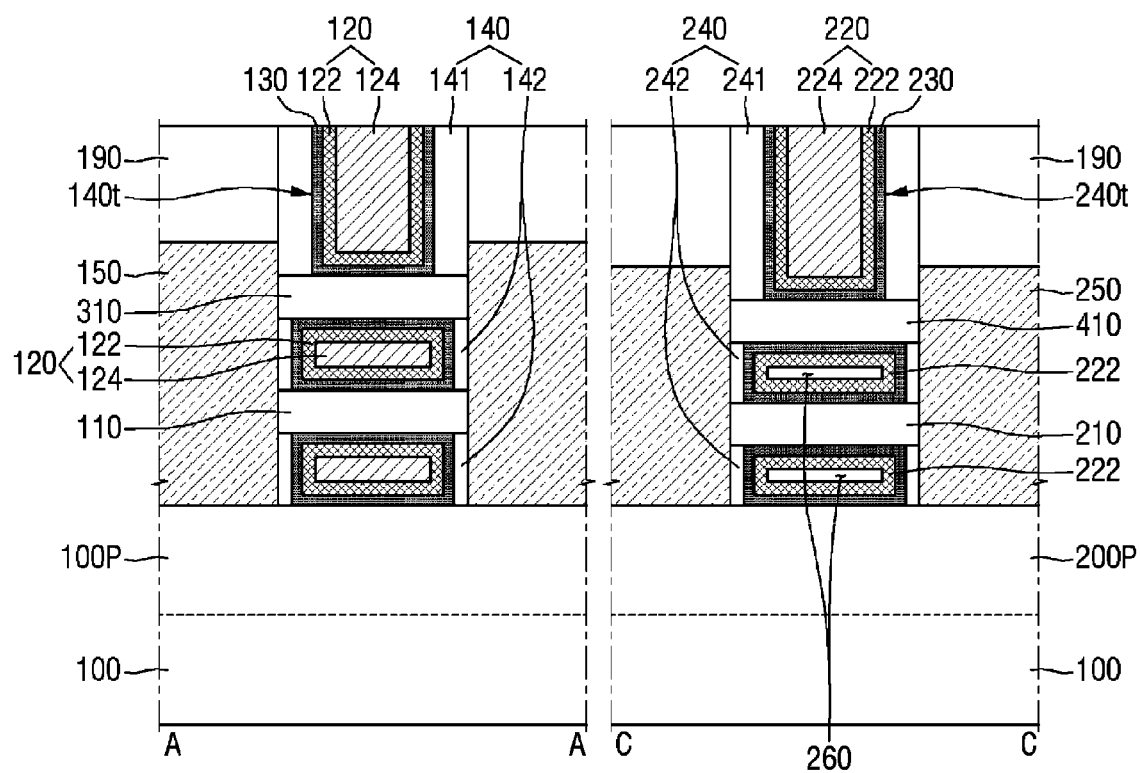
FIG. 63 shows views provided to explain a semiconductor device according to some example embodiments of the present disclosure.

FIG. 62 is a view of a semiconductor device according to some embodiments of the present disclosure. FIG. 63 is a view of a semiconductor device according to some embodiments of the present disclosure. For convenience of explanation, differences that are not explained above with reference to FIG. 61 will be mainly explained below.

Referring to FIG. 62, in a semiconductor device according to some embodiments of the present disclosure, the second gate electrode 220 may include a second lower gate electrode 222 laminated on the second gate insulating film 230, and then a second upper gate electrode 224 on the second lower gate electrode 222 in a sequential order.

However, the second gate electrode 220 between the second wire pattern 210 and the substrate 100 and the second gate electrode 220 between the second wire pattern 210 and the fourth wire pattern 410 may include the second lower gate electrode 222, but not the second upper gate electrode 224.

Meanwhile, the first gate electrode 120 may include a first lower gate electrode 122 laminated on the first gate insulating film 130, and then a first upper gate electrode 124 on the first lower gate electrode 122 in a sequential order.

The first gate electrode 120 between the first wire pattern 110 and the substrate 100 and the first gate electrode 120 between the first wire pattern 110 and the third wire pattern 310 may also include the first lower gate electrode 122 and the first upper gate electrode 124.

Referring to FIG. 63, in a semiconductor device according to some embodiments of the present disclosure, the first gate electrode 120 may not include an air gap, and the second gate electrode 220 may include the second gate electrode air gap 260.

The second gate electrode air gap 260 may be formed between the second wire pattern 210 and the substrate 100 and between the second wire pattern 210 and the fourth wire pattern 410.

As the second upper gate electrode 224 is not formed between the second wire pattern 210 and the substrate 100 and between the second wire pattern 210 and the fourth wire pattern 410, the second gate electrode air gap 260 may be formed, but this is a mere example, and thus without limitation thereto.

FIGS. 64 to 70B are views illustrating intermediate stages of fabrication, provided to explain a fabricating method of a semiconductor device according to some example embodiments of this present disclosure.

Figure 64:
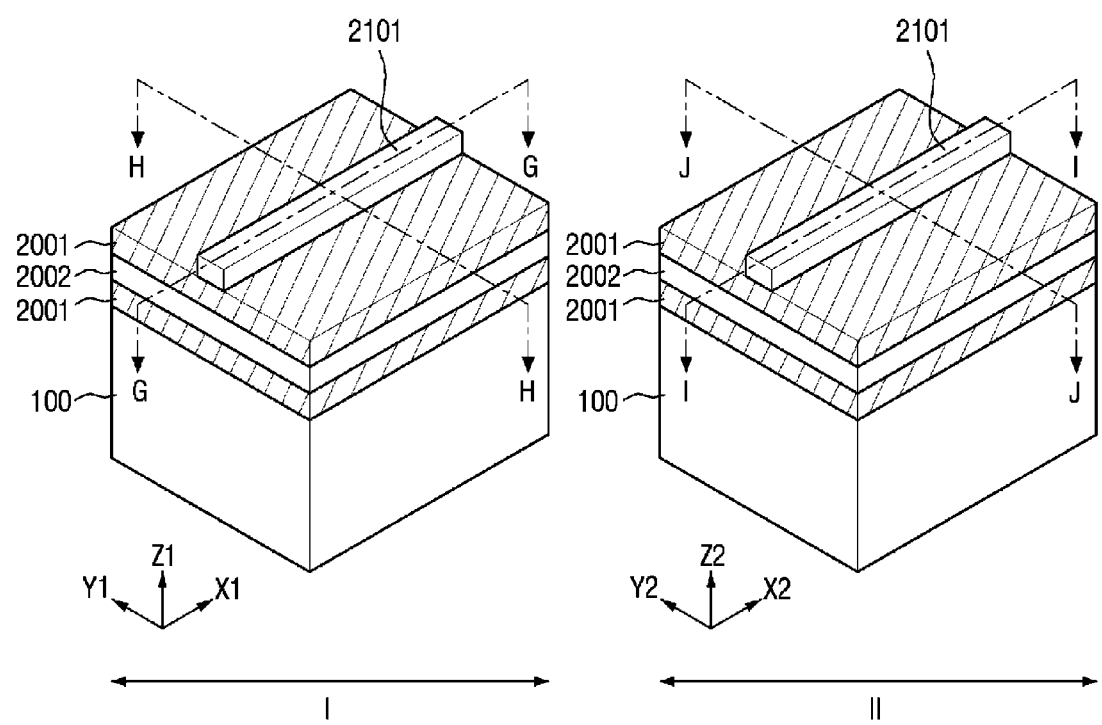
FIGS. 64 to 70B are views illustrating intermediate stages of fabrication, provided to explain a fabricating method of a semiconductor device according to some example embodiments of the present disclosure.

For reference, FIGS. 65A, 66A, 67A, 68A, 69A, and 70A are cross sectional views taken on lines G-G and I-I of FIG. 64. FIGS. 65B, 66B, 67B, 68B, 69B, and 70B are cross sectional views taken on lines H-H and J-J of FIG. 64.

Figure 65A:
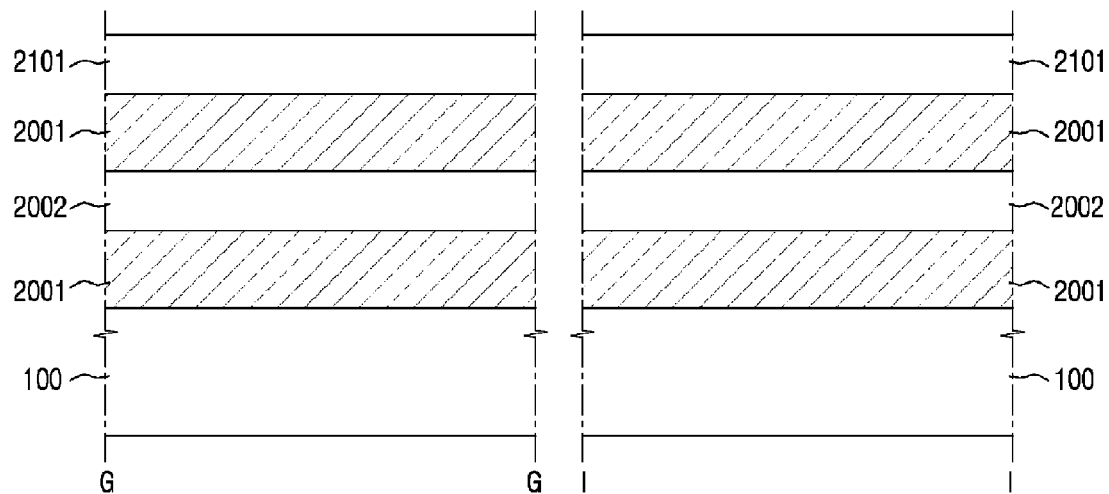
Figure 65B:
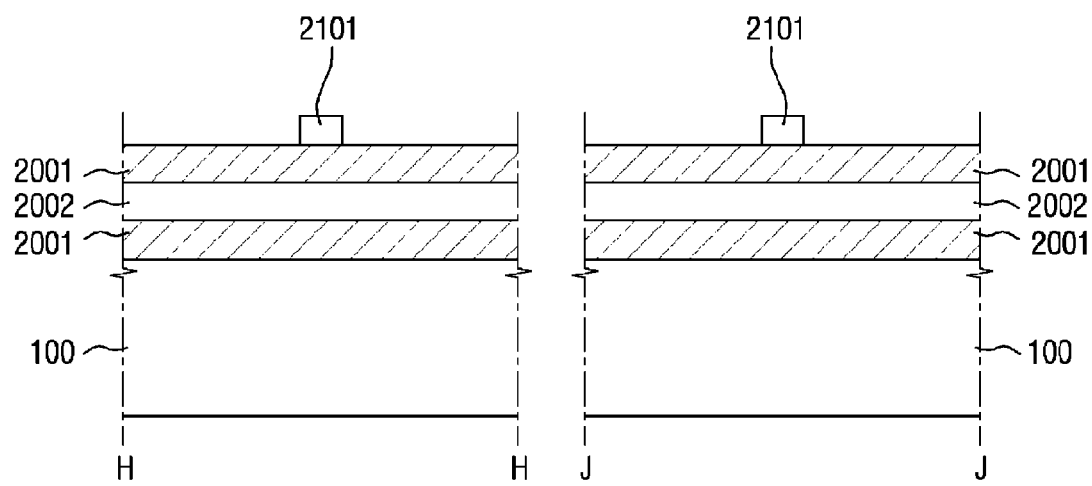

Referring to FIGS. 64 to 65B, a substrate 100 including a first region I and a second region II may be provided.

Next, a sacrificial film 2001 and an active film 2002 may be sequentially formed on the substrate 100. The sacrificial film 2001 and the active film 2002 may be formed by using epitaxial growth method, for example.

The active film 2002 may include a material with an etch selectivity with respect to the sacrificial film 2001.

FIG. 64 illustrates only one active film 2002, but this is illustrated so only for convenience of explanation and the example embodiments are not limited thereto. Further, although it is exemplified that the sacrificial film 2001 is positioned on the uppermost portion, example embodiments are not limited thereto.

Next, first mask patterns 2101 may be formed on the sacrificial films 2001 of the first region I and the second region II, respectively.

In the first region I, the first mask pattern 2101 may be elongated in a first direction X1. In the second region II, the first mask pattern 2101 may be elongated in a second direction X2.

Figure 66A:
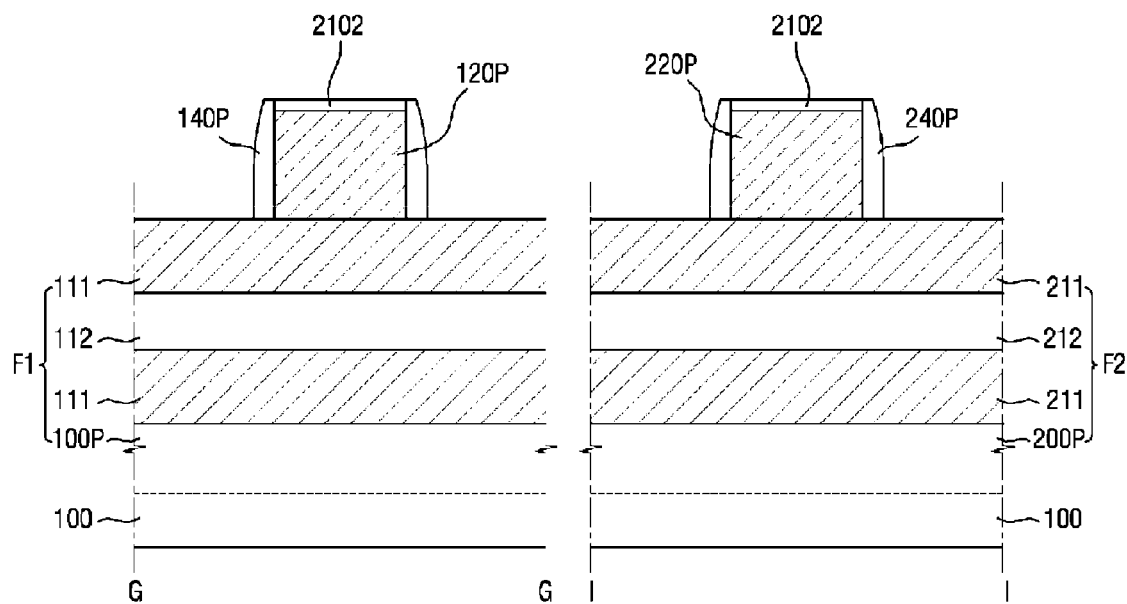
Figure 66B:
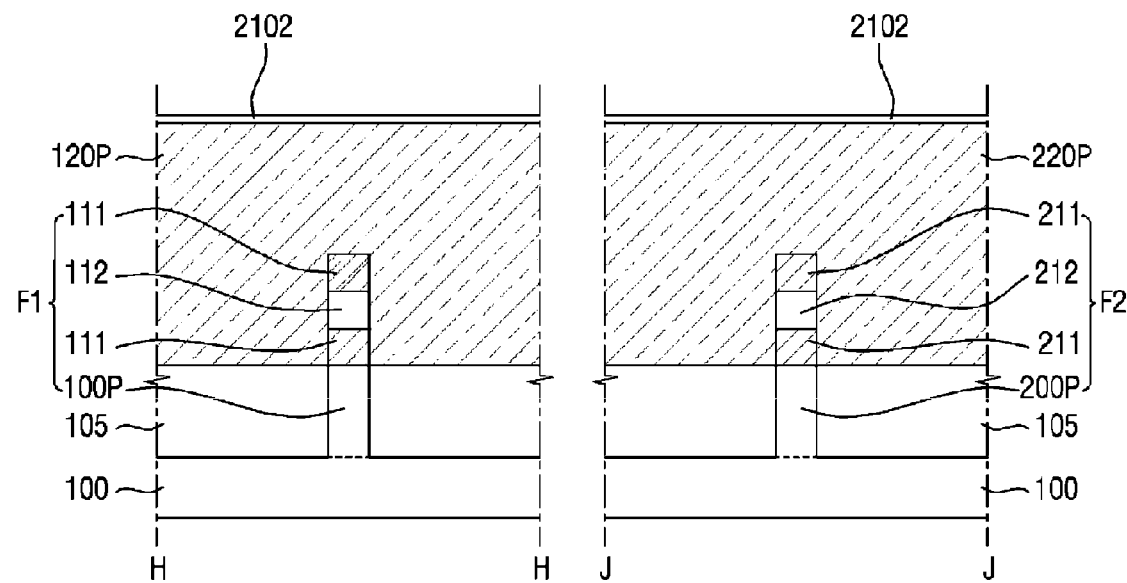

Referring to FIGS. 66A and 66B, a first fin-type structure F1 and a second fin-type structure F2 may be formed by performing etch process with the first mask patterns 2101 as a mask.

The first fin-type structure F1 may be formed in the first region I. The first fin-type structure F1 may include a first fin-type protruding portion 100P, a first sacrificial pattern 111, a first active pattern 112, and a first sacrificial pattern 111 stacked on the substrate 100 in a sequential order.

The second fin-type structure F2 may be formed in the second region I. The second fin-type structure F2 may include a second fin-type protruding portion 200P, a second sacrificial pattern 211, a second active pattern 212, and a second sacrificial pattern 211 stacked on the substrate 100 in a sequential order.

Next, a field insulating film 105, covering at least a portion of the sidewall of the first fin-type structure F1 and the sidewall of the second fin-type structure F2, may be formed on the substrate 100.

During the field insulating film 105 forming process, the first mask pattern 2101 may be removed.

Next, a first dummy gate electrode 120P, intersecting with the first fin-type structure F1 and extending in a third direction Y1, may be formed in the first region I.

Further, a second dummy gate electrode 220P, intersecting with the second fin-type structure F2 and extending in a fourth direction Y2, may be formed in the second region II.

The first dummy gate electrode 120P and the second dummy gate electrode 220P may be formed by using a second mask pattern 2102.

Although not illustrated, a dummy gate insulating film or a fin-type structure protection film may be additionally formed between the first dummy gate electrode 120P and the first fin-type structure F1, and between the second dummy gate electrode 220P and the second fin-type structure F2.

A first pre-gate spacer 140P may be formed on a sidewall of the first dummy gate electrode 120P. A second pre-gate spacer 240P may be formed on a sidewall of the second dummy gate electrode 220P.

Figure 67B:
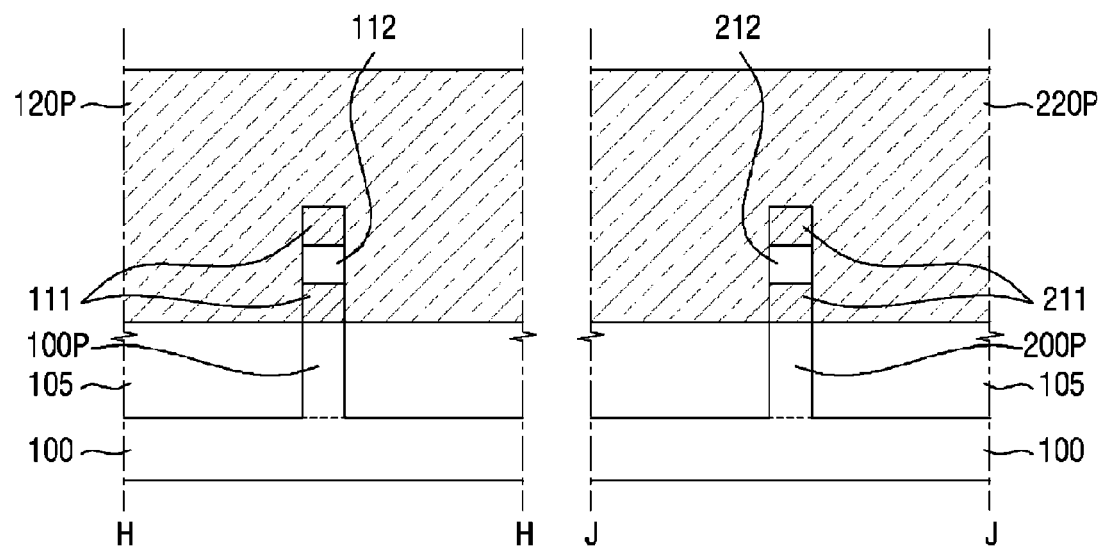

Referring to FIGS. 67A and 67B, a first source/drain region 150 may be formed on both sides of the first dummy gate electrode 120P. Further, a second source/drain region 250 may be formed on both sides of the dummy second gate electrode 220P.

More specifically, in order to form the first source/drain region 150 and the second source/drain region 250, portions of the first sacrificial pattern 111 and the first active pattern 112, and portions of the second sacrificial pattern 211 and the second active pattern 212 may be removed.

After the portions of the first sacrificial pattern 111 and the first active pattern 112, and the second sacrificial pattern 211 and the second active pattern 212 are removed, at least a portion of the first sacrificial pattern 111 overlapped with the first pre-gate spacer 140P, and at least a portion of the second sacrificial pattern 211 overlapped with the second pre-gate spacer 240P may be additionally removed.

The first inner spacer 142 and the second inner spacer 242 may be respectively formed in the places of the additionally-removed, first sacrificial pattern 111 and the second sacrificial pattern 211.

The first source/drain region 150 may be then formed on both sides of the first dummy gate electrode 120P, and the second source/drain region 250 may be formed on both sides of the second dummy gate electrode 220P.

Next, the interlayer insulating film 190 covering the first source/drain region 150 and the second source/drain region 250 may be formed on the substrate 100.

Due to the interlayer insulating film 190, the first dummy gate electrode 120P and the second dummy gate electrode 220P may be exposed.

During forming of the interlayer insulating film 190, the second mask pattern 2102 may be removed. Further, during forming of the interlayer insulating film 190, the first outer spacer 141 and the second outer spacer 241 may be formed respectively.

As a result, the first gate spacer 140 including the first inner spacer 142 and the first outer spacer 141, and the second gate spacer 240 including the second inner spacer 242 and the second outer spacer 241 may be formed.

Figure 68A:
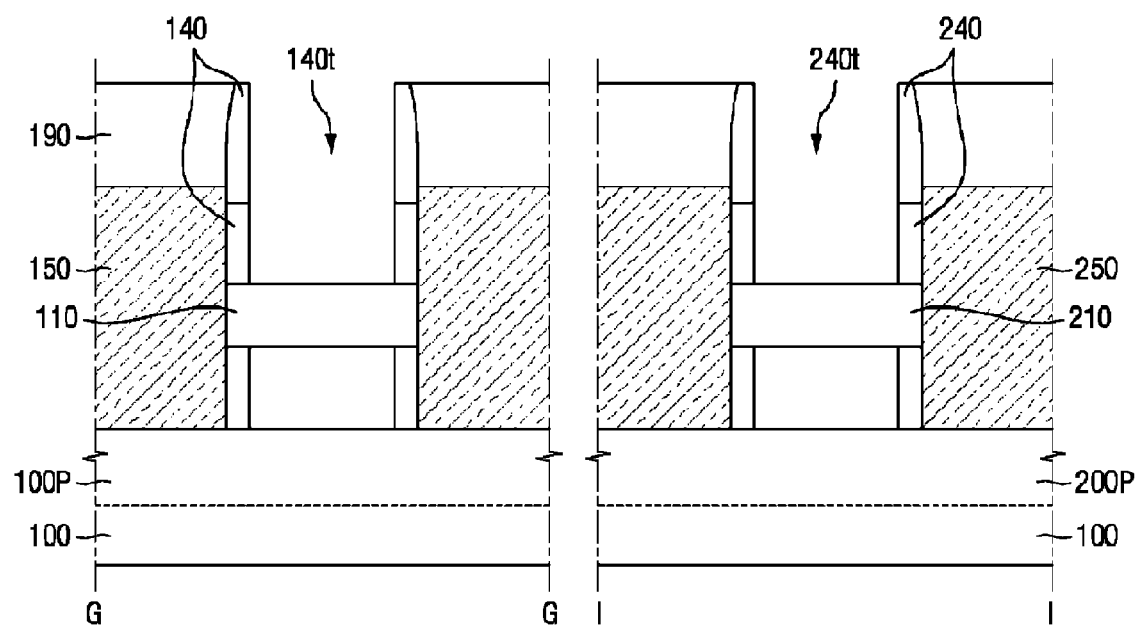
Figure 68B:
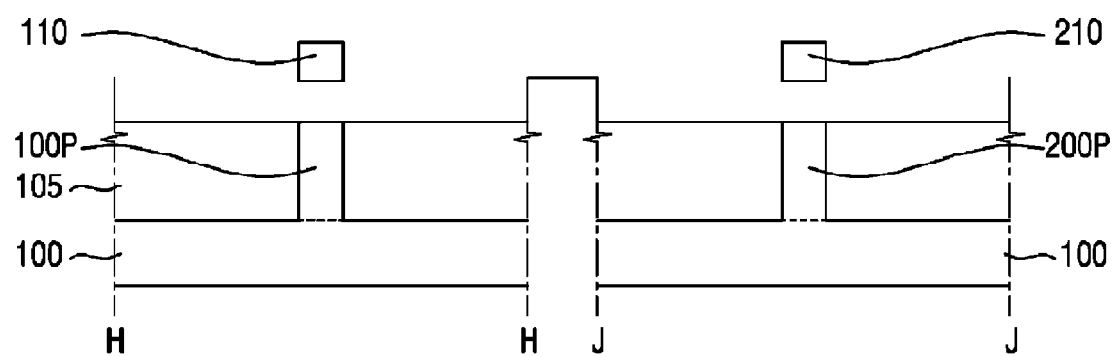

Referring to FIGS. 68A and 68B, the first wire pattern 110 may be formed on the substrate 100 of the first region I, by removing the first dummy gate electrode 120P and the first sacrificial pattern 111.

Further, the second wire pattern 210 may be formed on the substrate 100 of the second region II by removing the second dummy gate electrode 220P and the second sacrificial pattern 211.

The first wire pattern 110 may be formed with spacing from the first fin-type protruding portion 100P, and the second wire pattern 210 may be formed with spacing from the second fin-type protruding portion 200P.

Figure 69A:
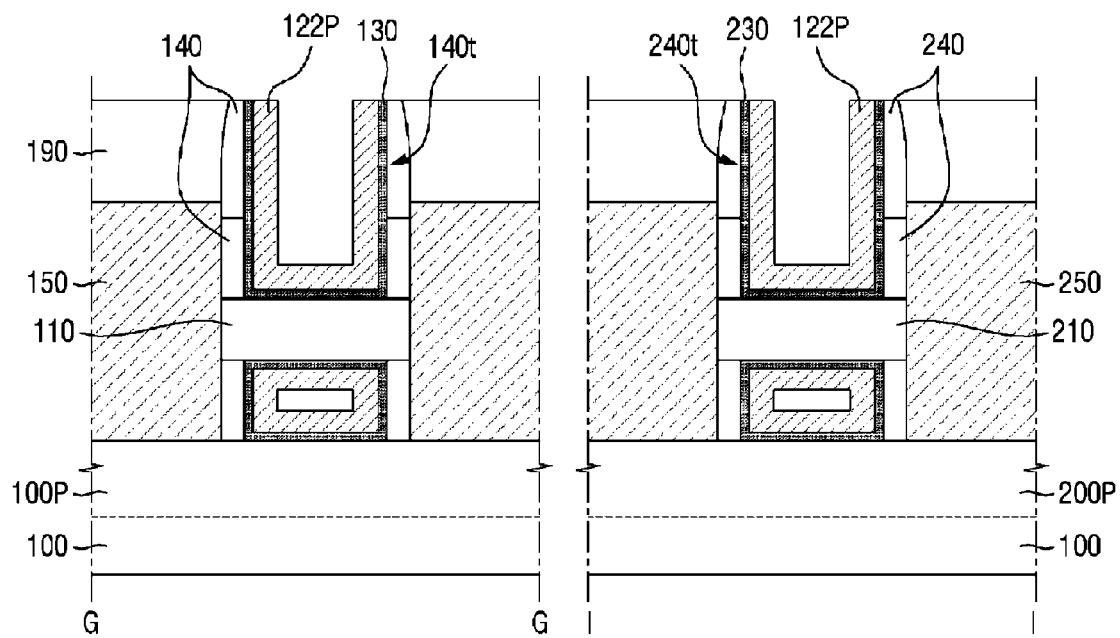
Figure 69B:
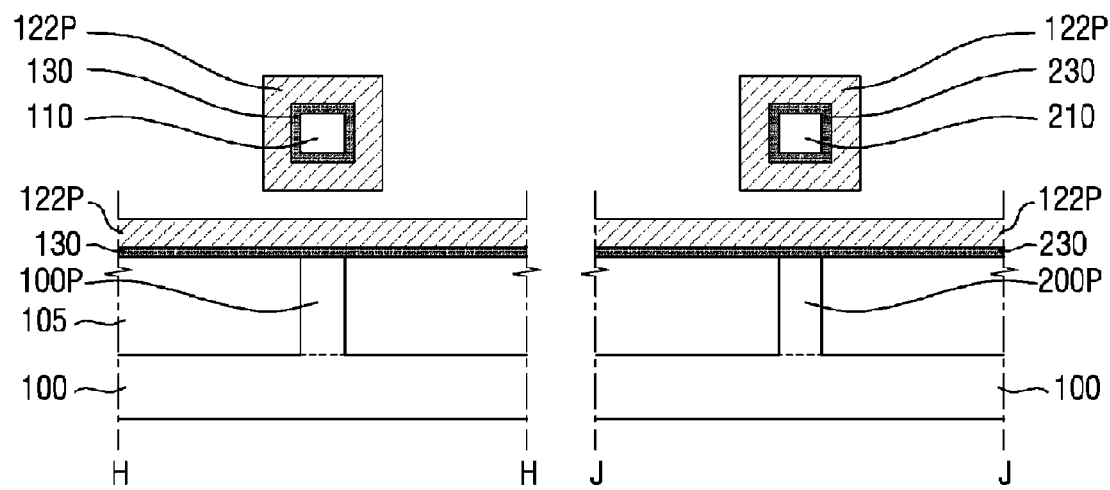

Referring to FIGS. 69A and 69B, the first gate insulating film 130 may be formed along the perimeter of the first wire pattern 110 and the sidewall and the bottom surface of the first trench 140t. Further, the second gate insulating film 230 may be formed along the perimeter of the second wire pattern 210 and the sidewall and the bottom surface of the second trench 240t.

Although not illustrated, the first gate insulating film 130 and the second gate insulating film 230 may be formed along the upper surface of the interlayer insulating film 190.

Next, on the first gate insulating film 130, there may be a lower conductive film 122P, surrounding the first wire pattern 110 and being formed along the sidewall and the bottom surface of the first trench 140t. Further, on the second gate insulating film 230, there may be a lower conductive film 122P, surrounding the second wire pattern 210 and being formed along the sidewall and the bottom surface of the second trench 240t.

Although not illustrated, the lower conductive film 122P may be formed along the upper surface of the interlayer insulating film 190.

Figure 70A:
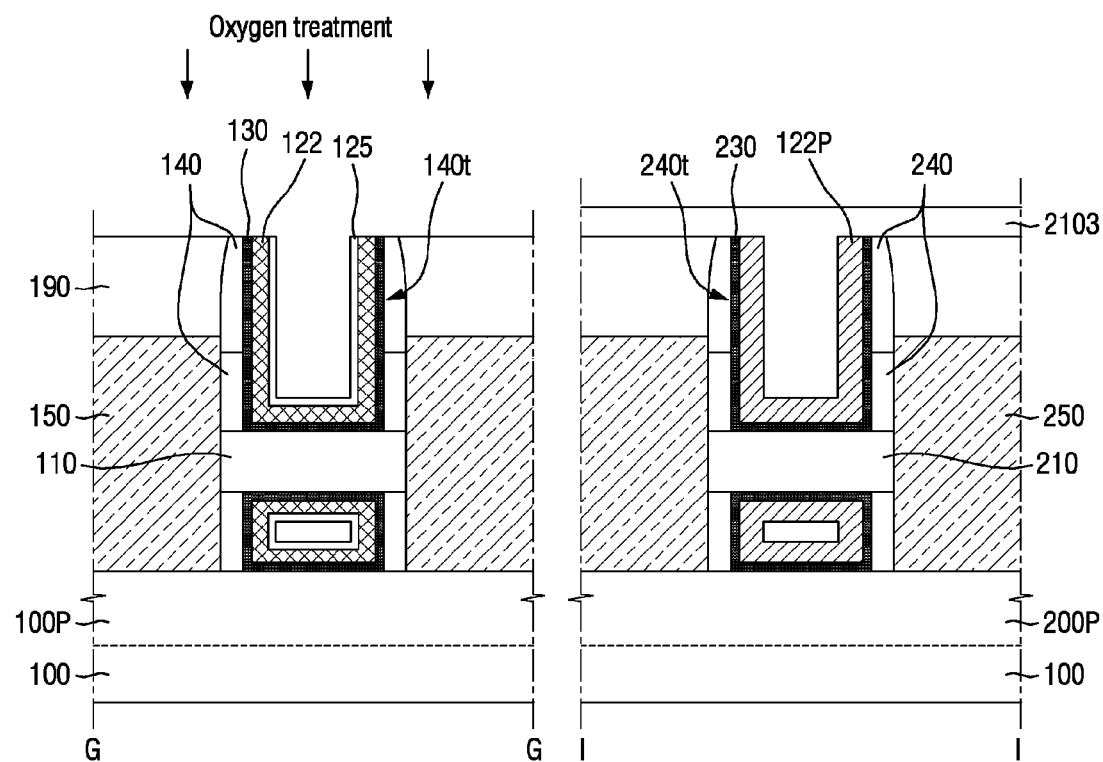
Figure 70B:
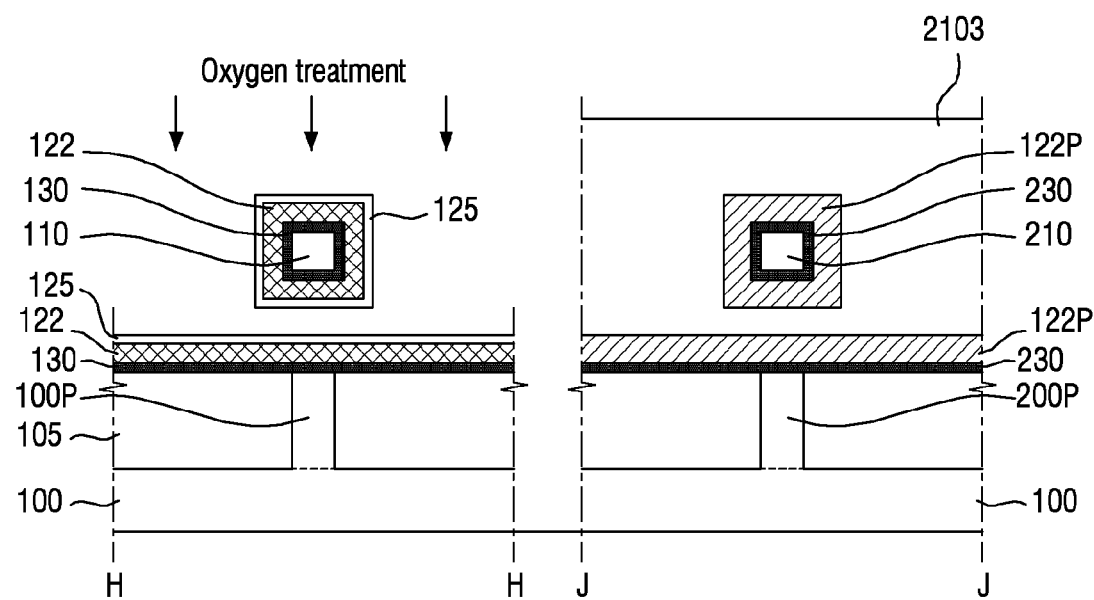

Referring to FIGS. 70A and 70B, a third mask pattern 2103 covering the second region II may be formed on the substrate 100.

The third mask pattern 2103 may cover the lower conductive film 122P formed in the second region II. The lower conductive film 122P formed in the first region I may be exposed by the third mask pattern 2103.

Next, using the third mask pattern 2103, oxygen treatment of the first region I may be performed. The oxygen treatment may allow the lower conductive film 122P formed in the first region I to be oxidized.

As a result, in the first region I, there may be formed a first metal oxide film 125 on the first lower gate electrode 122. The first metal oxide film 125 may be formed, as a portion of the lower conductive film 122P formed in the first region I is oxidized.

Additionally, through the oxygen treatment, oxygen may be introduced into the first gate insulating film 130.

However, since the third mask pattern 2103 is formed on the second region II, the lower conductive film 122P formed in the second region II may not be influenced by the oxygen treatment.

The oxygen treatment may be performed with one of methods such as plasma treatment, thermal treatment, and UV treatment, but not limited thereto.

Next, referring to FIG. 2, the second lower gate electrode 222 may be formed in the second region II by removing the third mask pattern 2103 formed in the second region II.

Further, the first upper gate electrode 124 and the second upper gate electrode 224 may be respectively formed on the first lower gate electrode 122 and the second lower gate electrode 222.

FIGS. 71 to 81 illustrate an intermediate step of a method for producing a semiconductor device according to some embodiments of the present disclosure.

For reference, the content overlapping with those describes with reference to FIGS. 64 to 70B will be omitted.

Figure 71:
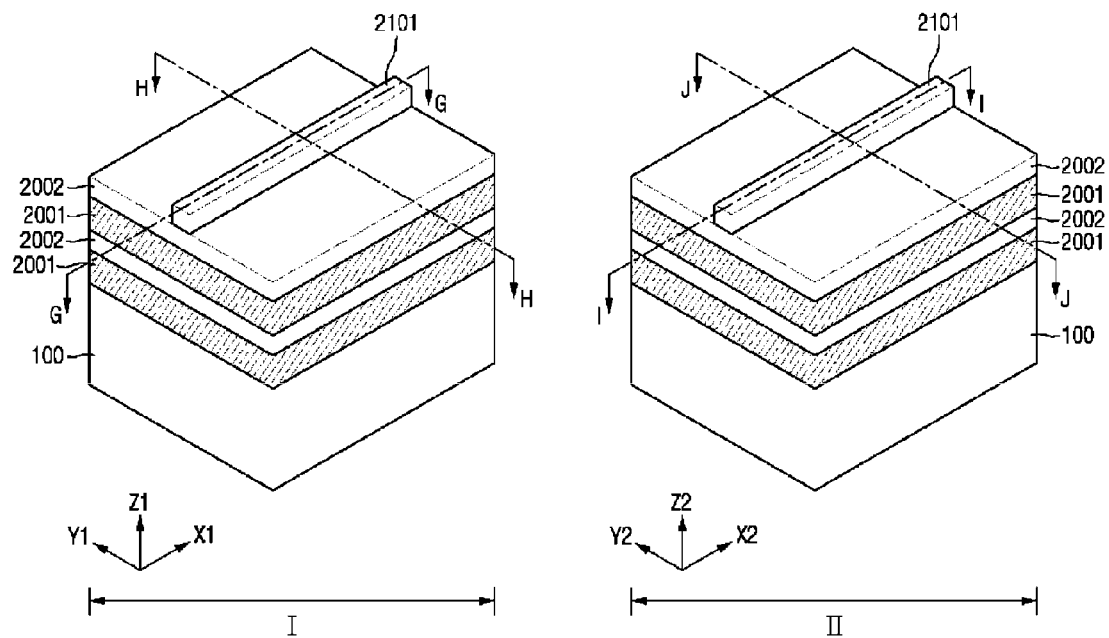
FIGS. 71 to 81 are views illustrating intermediate stages of fabrication, provided to explain a fabricating method of a semiconductor device according to some example embodiments of the present disclosure.
Figure 72A:
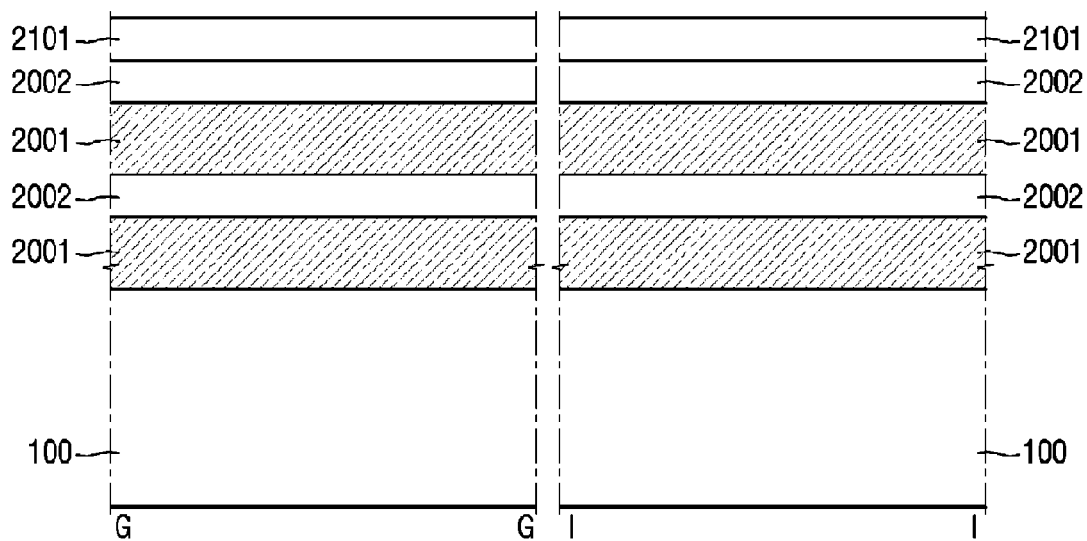
Figure 72B:
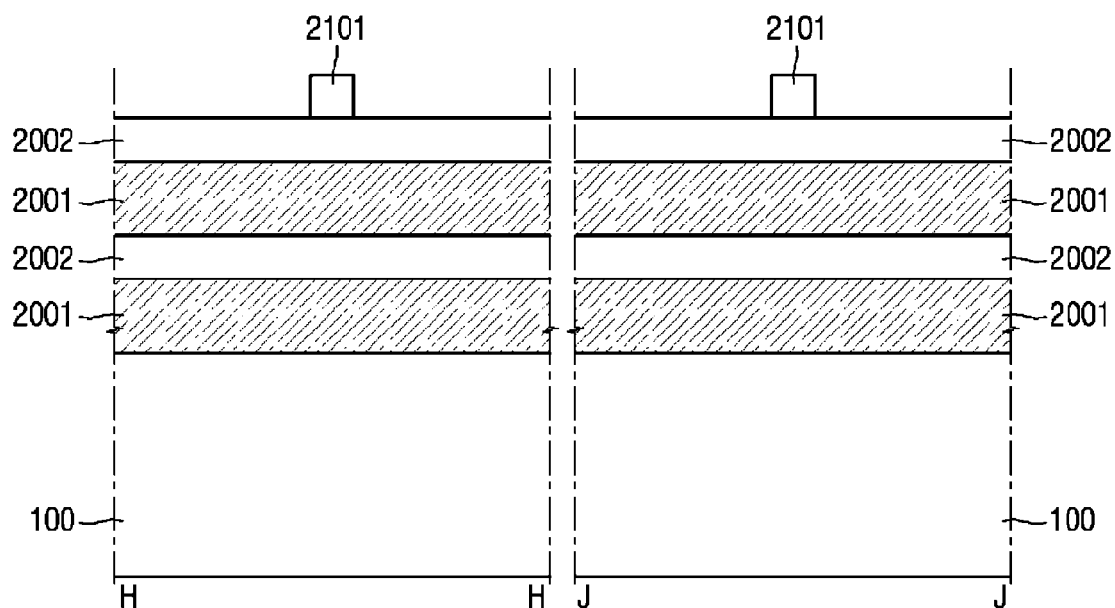

Referring to FIGS. 71 to 72B, a sacrificial film 2001 may be formed on the substrate 100, and then an active film 2002 may be formed on the sacrificial film 2001 in a sequential order.

It is illustrated that the active film 2002 is disposed on the uppermost portion, but without limitation thereto.

Then, on the active film 2002 of the first region I and the second region II, a first mask pattern 2101 may be formed, respectively.

Figure 73A:
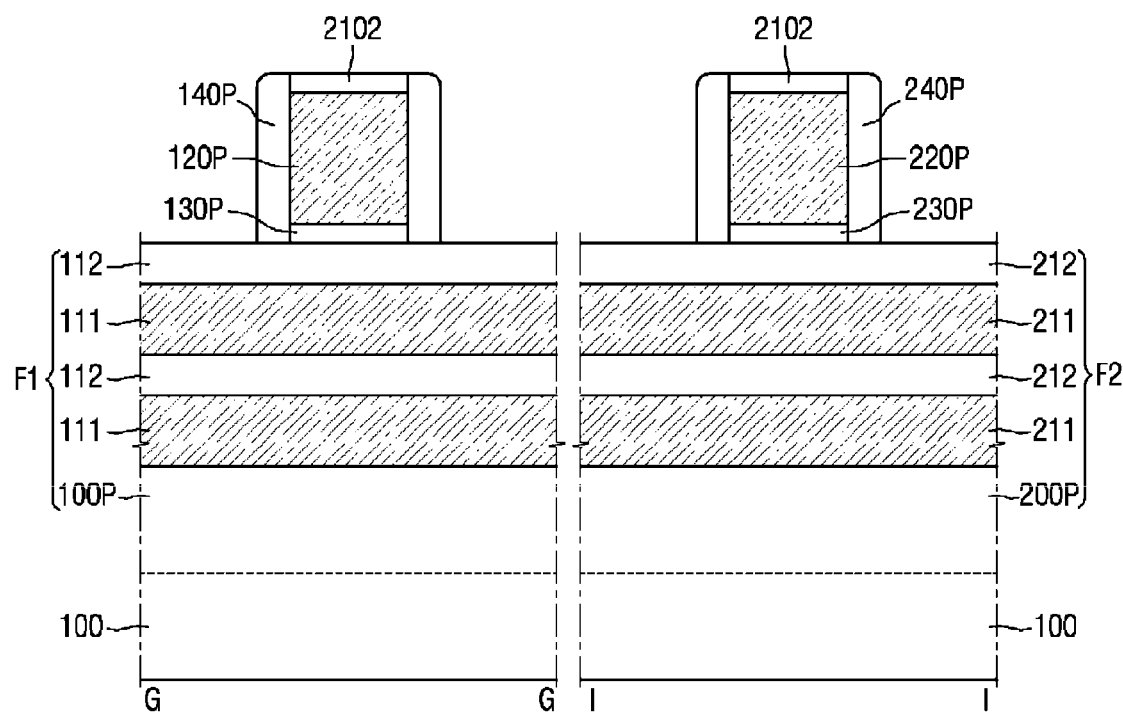
Figure 73B:
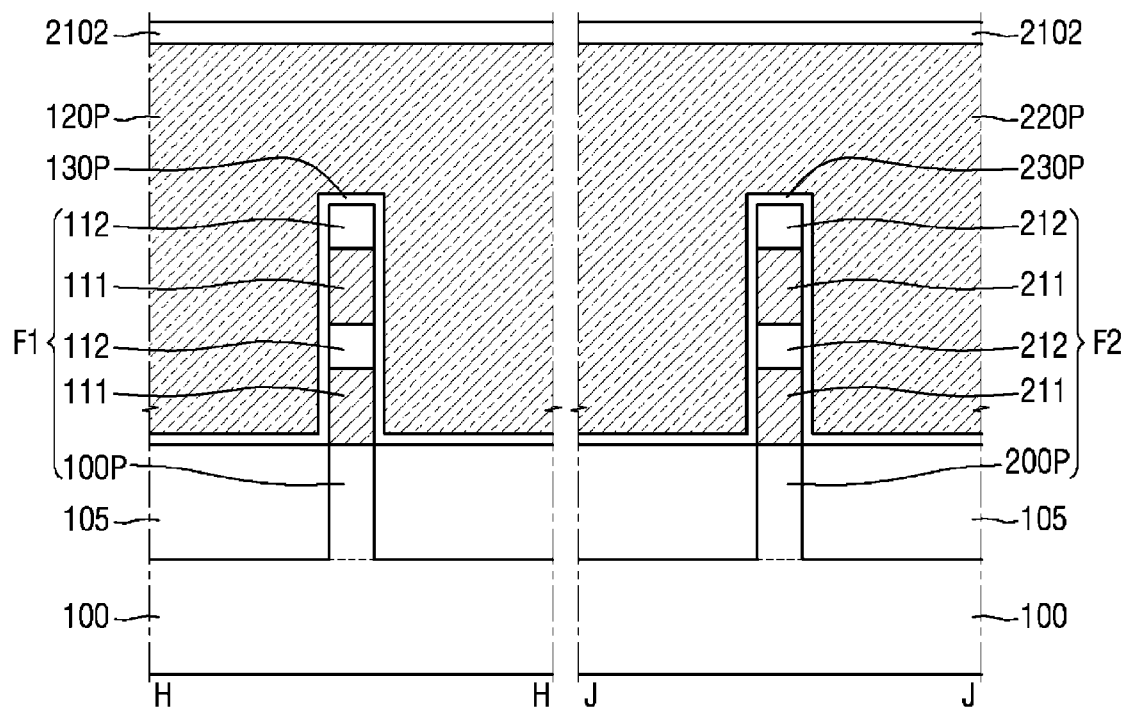

Referring to FIGS. 73A and 73B, an etching process may be performed having the first mask pattern 2101 as mask so as to form a first fin-type structure F1 and a second fin-type structure F2.

The first fin-type structure F1 may be formed in the first region I. The first fin-type structure F1 may include a first fin-type protruding portion 100P, a first sacrificial pattern 111, a first active pattern 112, a first sacrificial pattern 111, and a first active pattern 112 laminated on the substrate 100 in a sequential order.

The second fin-type structure F2 may be formed in the second region II. The second fin-type structure F2 may include a second fin-type protruding portion 200P, a second sacrificial pattern 211, a second active pattern 212, a second sacrificial pattern 211, and a second active pattern 212 laminated on the substrate 100 in a sequential order.

Then, a field insulating film 105 for surrounding at least a portion of a sidewall of the first fin-type structure F1 and a sidewall of the second fin-type structure F2 may be formed on the substrate 100.

Then, in the first region I, a first dummy gate electrode 120P may be formed that intersects the first fin-type structure F1 and extends in the third direction Y1.

Furthermore, in the second region II, a second dummy gate electrode 220P may be formed that intersects the second fin-type structure F2 and extends in the fourth direction Y2.

A first dummy gate insulating film 130P and a second dummy gate insulating film 230P may be formed between the first dummy gate electrode 120P and the first fin-type structure F1 and between the second dummy gate electrode 220P and the second fin-type structure F2, respectively.

This will be described with reference to FIG. 73A.

Figure 74:
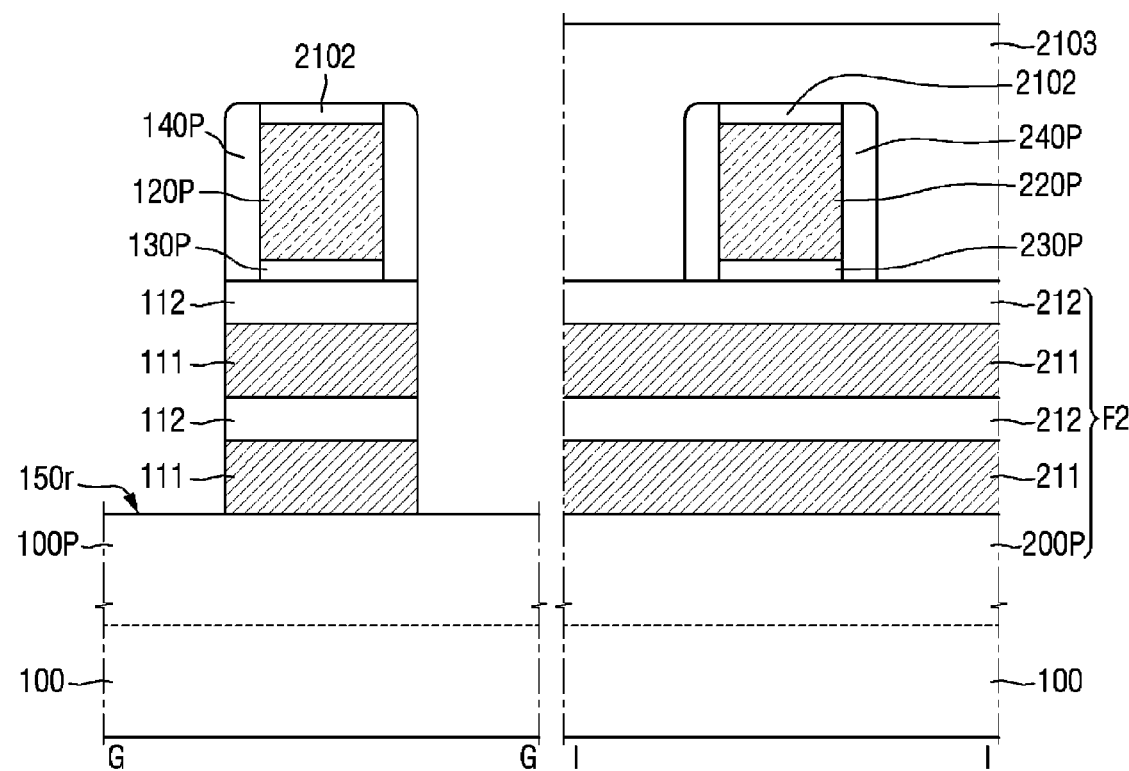

Referring to FIG. 74, a third mask pattern 2103 is formed on the second region II. The first region I not surrounded by the third mask pattern 2103 is exposed.

Unlike how it is illustrated, the third mask pattern 2103 may, of course, be formed according to the profile of the second fin-type structure F2 and the second dummy gate electrode 220P.

Then, a portion of the first fin-type structure F1 may be removed using the first dummy gate electrode 120P and the first pre gate spacer 140P as mask.

By doing this, a first recess 150r may be formed at both sides of the first dummy gate electrode 120P and the first pre gate spacer 140P.

Figure 75:
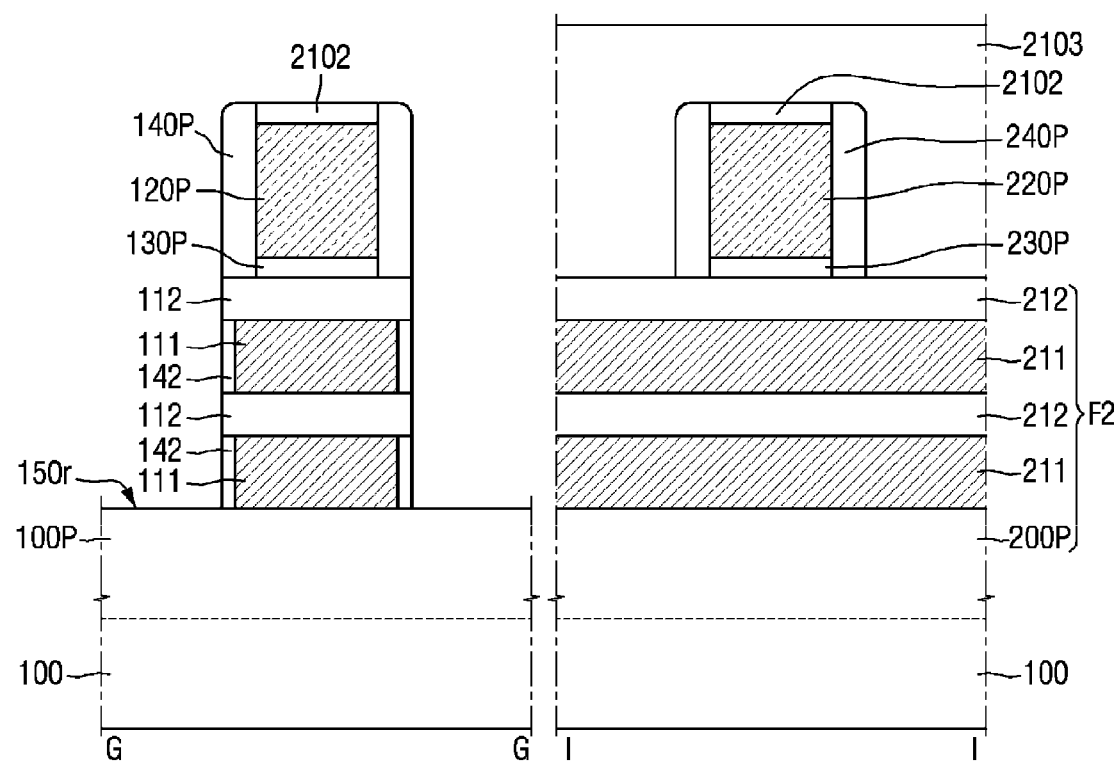

Referring to FIG. 75, a first inner spacer 142 is formed between the first active pattern 112 and the first fin-type protruding portion 100P. The first inner spacer 142 may also be formed between the first active patterns 112 on the first fin-type protruding portion 100P.

Specifically, a portion of the first sacrificial pattern 111 may be removed using an etch selectivity between the first active pattern 112 and the first sacrificial pattern 111.

Then, in the area from which a portion of the first sacrificial pattern 111 has been removed, the first inner spacer 142 may be formed.

Figure 76:
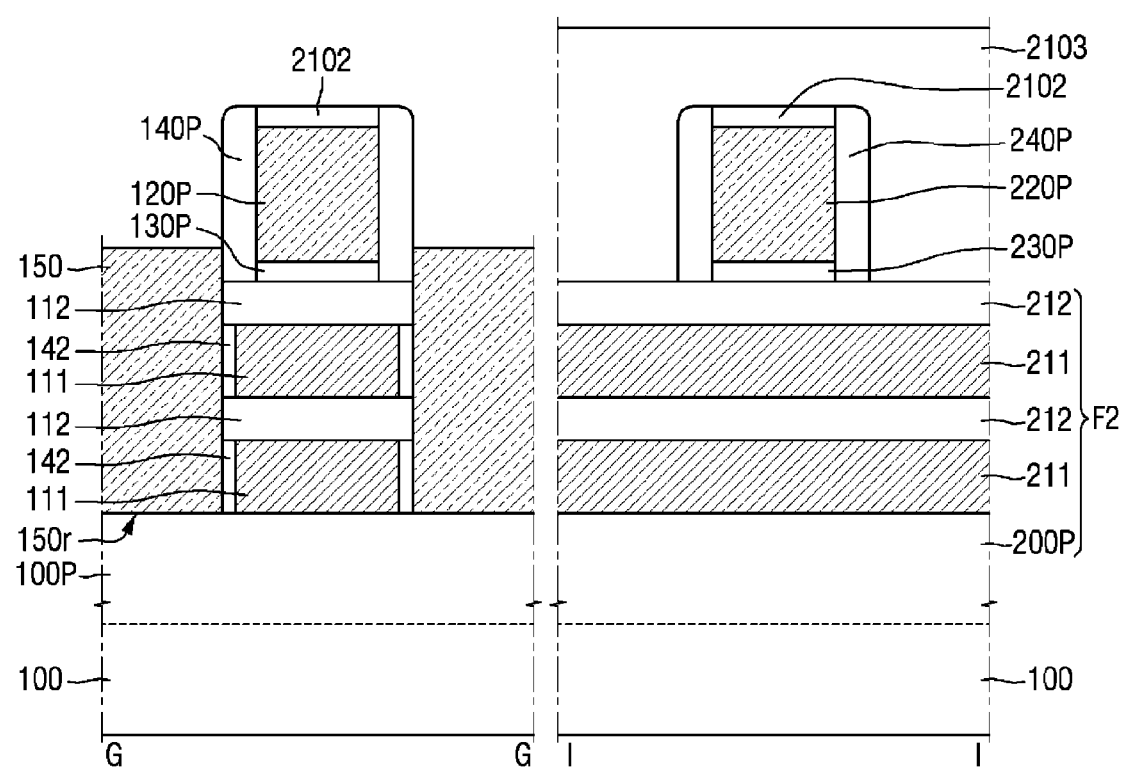

Referring to FIG. 76, a first source/drain region 150 may be formed within the first recess 150r.

Then, the third mask pattern 2103 formed in the second region II may be removed.

Figure 77:
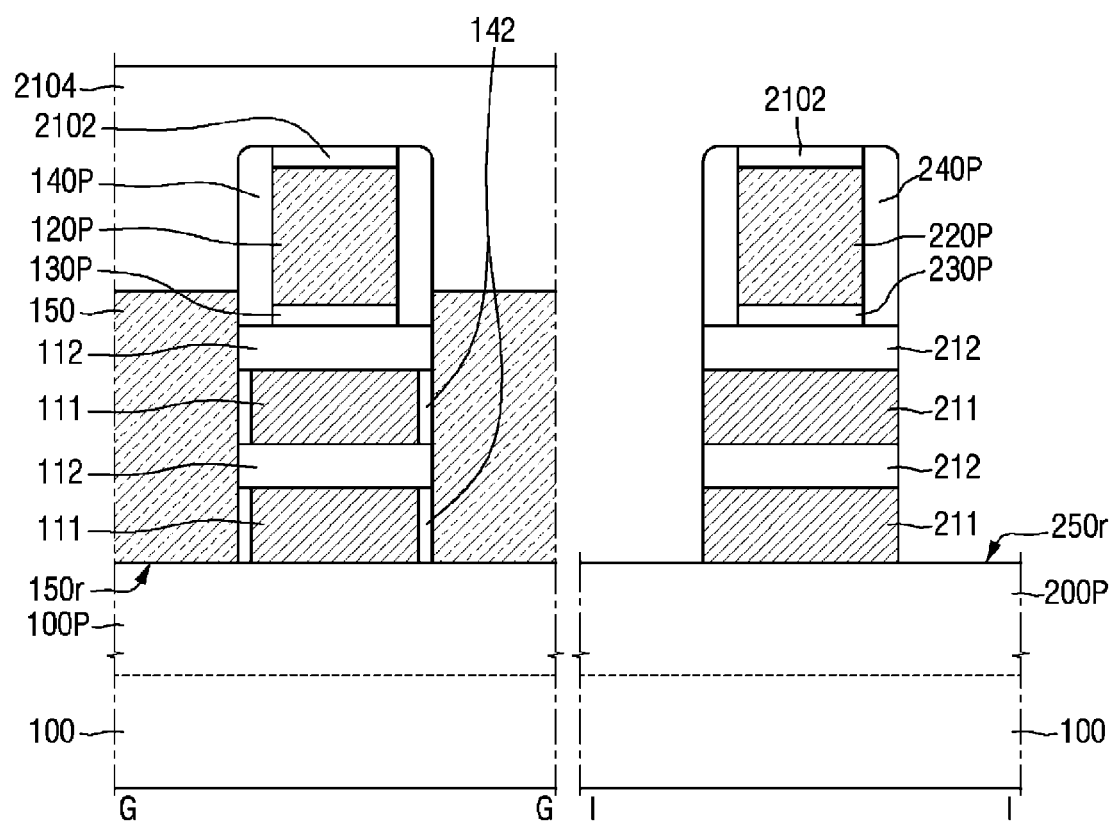

Referring to FIG. 77, a fourth mask pattern 2104 is formed on the first region I. The second region II not surrounded by the fourth mask pattern 2104 is exposed.

Unlike the illustration, the fourth mask pattern 2104 may, of course, be formed according to the profile of the first source/drain region 150 and the first dummy gate electrode 120P.

Then, a portion of the second fin-type structure F2 may be removed using the second dummy gate electrode 220P and the second pre gate spacer 240P as mask.

By doing this, a second recess 250r may be formed at both sides of the second dummy gate electrode 220P and the second pre gate spacer 240P.

Figure 78:
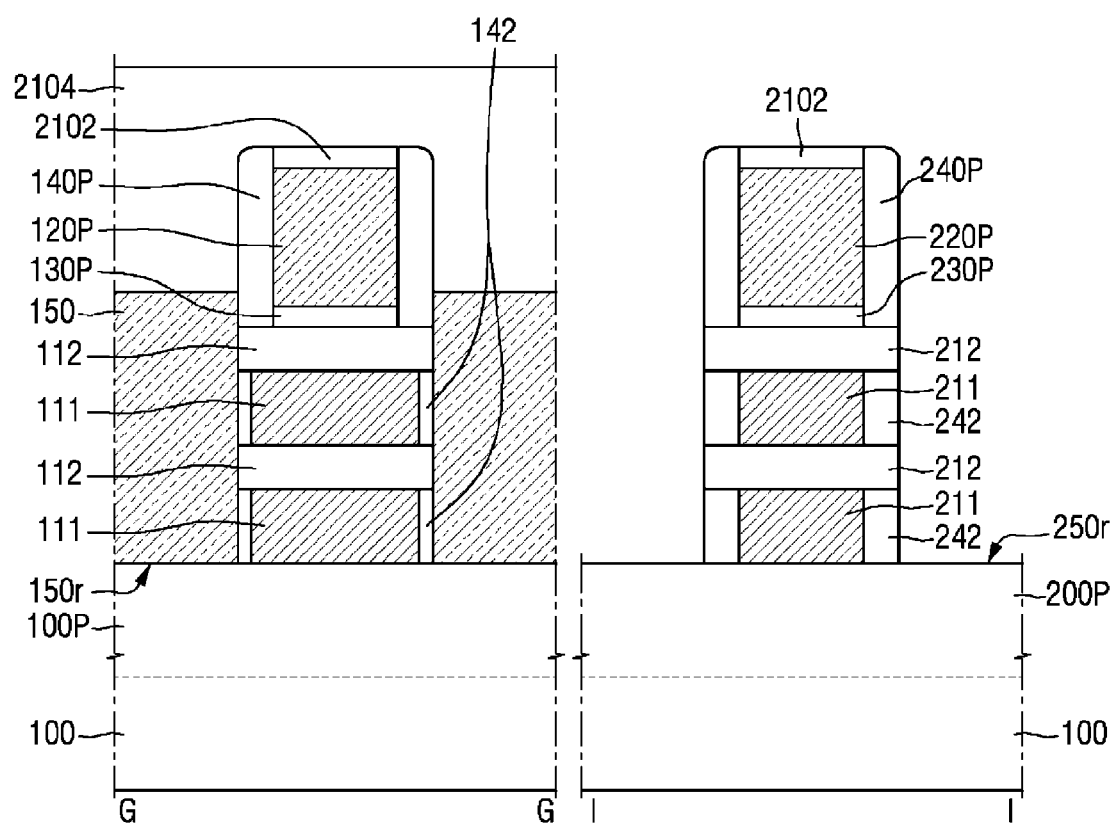

Referring to FIG. 78, the second inner spacer 242 is formed between the second active pattern 212 and the second fin-type protruding portion 200P. The second inner spacer 242 is also formed between the second active patterns 212 on the second fin-type protruding portion 200P.

Specifically, using the etch selectivity between the second active pattern 212 and the second sacrificial pattern 211, a portion of the second sacrificial pattern 211 may be removed.

Then, in the area from which a portion of the second sacrificial pattern 211 has been removed, the second inner spacer 242 may be formed.

In this case, a width of the second inner spacer 242 may be greater than a width of the first inner spacer 142.

Figure 79:
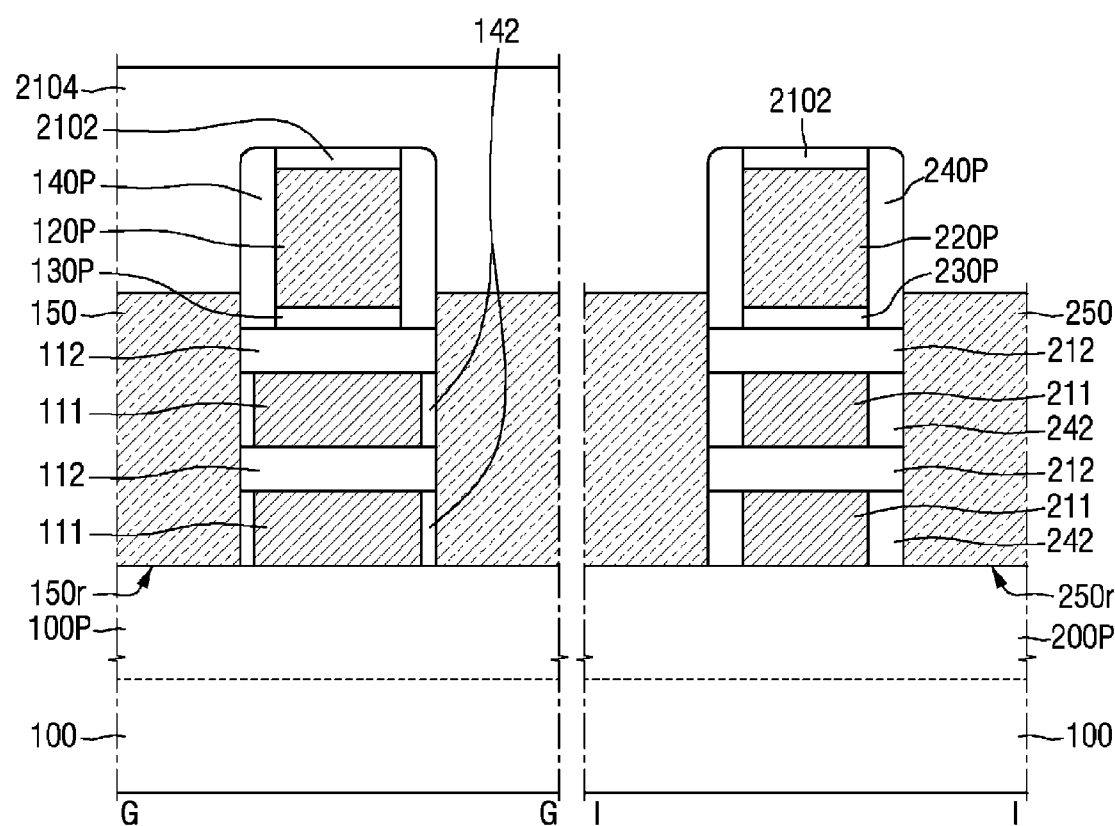

Referring to FIG. 79, a second source/drain region 250 may be formed within the second recess 250r.

Then, the fourth mask pattern 2104 formed in the first region I may be removed.

Figure 80:
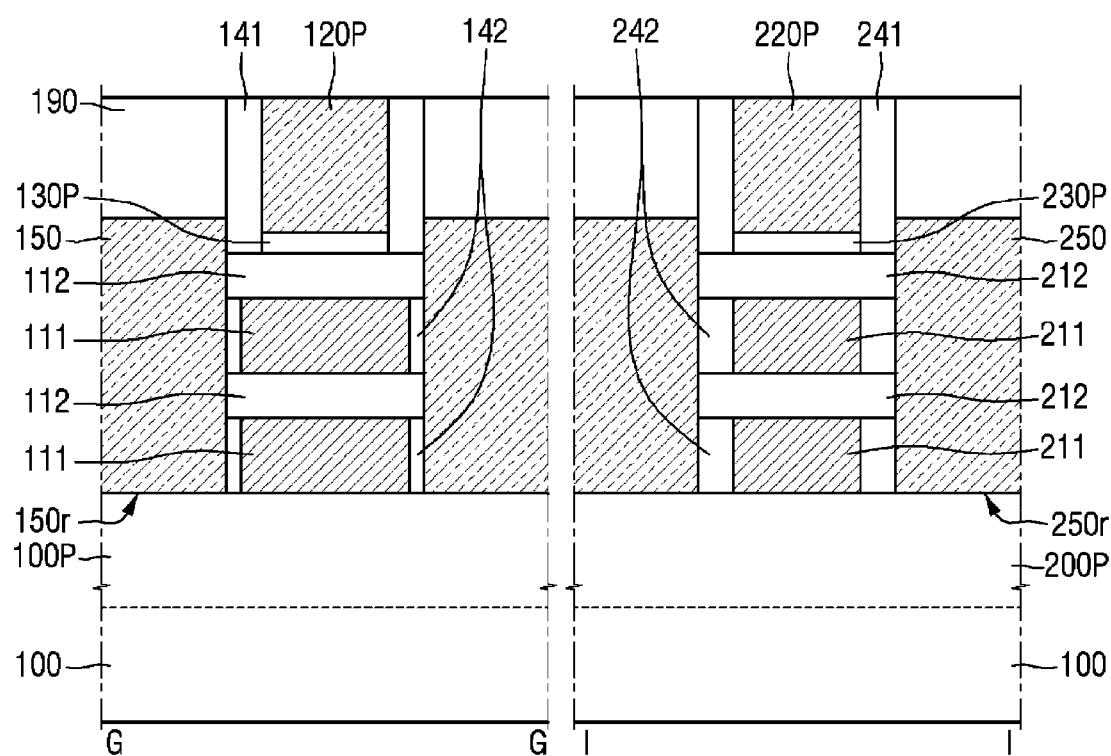

Referring to FIG. 80, an interlayer insulating film 190 surrounding the first source/drain region 150 and the second source/drain region 250 may be formed on the substrate 100.

By the interlayer insulating film 190, the first dummy gate electrode 120P and the second dummy gate electrode 220P may be exposed.

Figure 81:
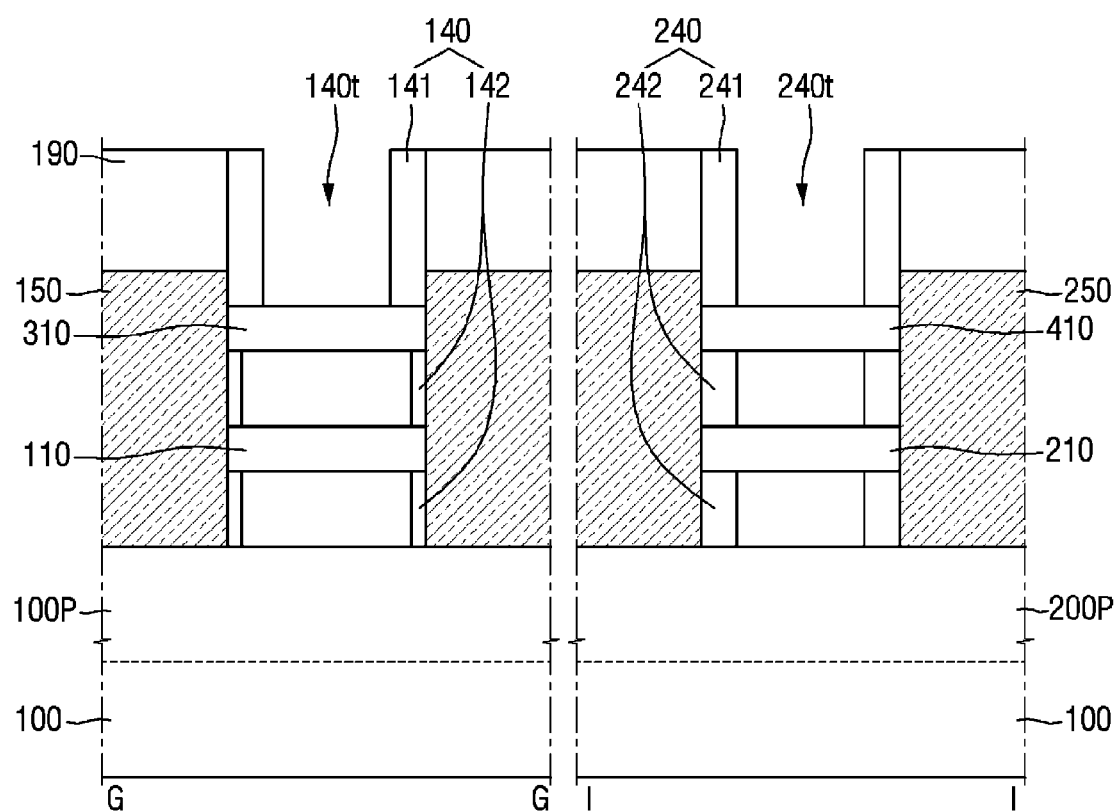

Referring to FIG. 81, as the first dummy gate electrode 120P, the first dummy gate insulating film 130P, and the first sacrificial pattern 111 are removed, a first wire pattern 110 and a third wire pattern 310 may be formed on the substrate 100 of the first region I.

Furthermore, as the second dummy gate electrode 220P, the second dummy gate insulating film 230P, and second sacrificial pattern 211 are removed, a second wire pattern 210 and a fourth wire pattern 410 may be formed on the substrate 100 of the second region II.

The first wire pattern 110 is formed in a manner such that it is spaced apart from the first fin-type protruding portion 100P, and the third wire pattern 310 is formed in a manner such that it is spaced apart from the first wire pattern 110.

Furthermore, the second wire pattern 210 is formed in a manner such that it is spaced apart from the second fin-type protruding portion 200P, and the fourth wire pattern 410 is formed in a manner such that it is spaced apart from the second wire pattern 210.

Furthermore, as the first dummy gate electrode 120P, the first dummy gate insulating film 130P, and the first sacrificial pattern 111 are removed, a first trench 140t is formed being defined by the first gate spacer 140.

Furthermore, as the second dummy gate electrode 220P, the second dummy gate insulating film 230P, and the second sacrificial pattern 211 are removed, a second trench 240t is formed being defined by the second gate spacer 240.

Then, a first gate insulating film 130 and a first gate electrode 120 are formed within the first trench 140t. Furthermore, a second gate insulating film 230 and a second gate electrode 220 are formed within a second trench 240t.

In concluding the detailed description, those skilled in the art will appreciate that many variations and modifications can be made to the exemplary embodiments without substantially departing from the principles of the present disclosure. Therefore, the disclosed exemplary embodiments of the inventive concept are used in a generic and descriptive sense only and not for purposes of limitation.

What is claimed is:
1. A semiconductor device, comprising:
   a substrate including a first region and a second region;
   a first wire pattern provided on the first region of the substrate and spaced apart from the substrate;
   a second wire pattern provided on the second region of the substrate and spaced apart from the substrate;

a first gate insulating film surrounding a perimeter of the first wire pattern;

a second gate insulating film surrounding a perimeter of the second wire pattern;

an interfacial layer interposed between the first wire pattern and the first gate insulating film;

a first gate electrode provided on the first gate insulating film, intersecting with the first wire pattern, and including a first metal oxide film therein;

a second gate electrode provided on the second gate insulating film and intersecting with the second wire pattern;

a first gate spacer on a sidewall of the first gate electrode; and a second gate spacer on a sidewall of the second gate electrode.

2. The semiconductor device of claim 1, wherein the first gate spacer defines a first trench, and the first gate electrode includes a first lower gate electrode surrounding the first gate insulating film and extending along a sidewall of the first trench, and a first upper gate electrode provided on the first lower gate electrode and filling the first trench.

3. The semiconductor device of claim 2, wherein the first metal oxide film is positioned in a boundary between the first lower gate electrode and the first upper gate electrode.

4. The semiconductor device of claim 2, wherein the first metal oxide film is positioned inside the first lower gate electrode, and the first metal oxide film is spaced apart from the first upper gate electrode and the first gate insulating film.

5. The semiconductor device of claim 2, wherein the first metal oxide film includes a first upper metal oxide film and a first lower metal oxide film that are spaced apart from each other, and the first lower metal oxide film is positioned in a boundary between the first lower gate electrode and the first gate insulating film.

6. The semiconductor device of claim 1, wherein the second gate spacer defines a second trench, and the second gate electrode includes a second lower gate electrode surrounding the second gate insulating film and extending along a sidewall of the second trench, and a second upper gate electrode on the second lower gate electrode, and the second gate electrode does not include a metal oxide film positioned inside the second gate electrode.

7. The semiconductor device of claim 1, wherein the second gate spacer defines a second trench, and the second gate electrode includes a second lower gate electrode surrounding the second gate insulating film and extending along a sidewall of the second trench, and a second upper gate electrode on the second lower gate electrode, and the second gate electrode further includes a second metal oxide film.

8. The semiconductor device of claim 7, wherein the second metal oxide film is positioned in a boundary between the second lower gate electrode and the second upper gate electrode.

9. The semiconductor device of claim 7, wherein the second metal oxide film is positioned inside the second lower gate electrode, and the second metal oxide film is spaced apart from the second upper gate electrode and the second gate insulating film.

10. The semiconductor device of claim 1, wherein the first gate insulating film comprises an upper portion and a lower portion, the first gate insulating film includes a metal oxide, and an oxygen-to-metal ratio of the upper portion of the first gate insulating film is different from the oxygen-to-metal ratio of the lower portion of the first gate insulating film.

11. A semiconductor device, comprising:

a first wire pattern provided on a substrate and spaced apart from the substrate;

a second wire pattern provided on the first wire pattern and spaced apart from the first wire pattern;

a gate spacer provided on the substrate, the gate spacer being disposed on both sides of the first wire pattern and the second wire pattern, and defining a trench;

a gate insulating film surrounding perimeters of the first wire pattern and the second wire pattern and extending along a sidewall of the trench;

a lower gate electrode provided on the gate insulating film and surrounding the first wire pattern and the second wire pattern;

a metal oxide film provided on the gate insulating film and extending along at least a portion of a profile of the gate insulating film; and an upper gate electrode surrounding the lower gate electrode and the metal oxide film and filling the trench, wherein the metal oxide film is interposed between the lower gate electrode and the upper gate electrode.

12. The semiconductor device of claim 11, wherein the lower gate electrode surrounding the first wire pattern, and the lower gate electrode surrounding the second wire pattern are spaced apart from each other.

13. The semiconductor device of claim 12, wherein the metal oxide film extends along an entire profile of the gate insulating film.

14. The semiconductor device of claim 12, wherein the upper gate electrode is interposed between the first wire pattern and the second wire pattern.

15. The semiconductor device of claim 12, further comprising an air gap interposed between the first wire pattern and the second wire pattern.

16. The semiconductor device of claim 15, wherein the upper gate electrode is not interposed between the first wire pattern and the second wire pattern.

17. The semiconductor device of claim 15, wherein the air gap is defined by the metal oxide film and the upper gate electrode.

18. The semiconductor device of claim 11, wherein the lower gate electrode surrounds the first wire pattern and the second wire pattern, and the upper gate electrode is not interposed between the first wire pattern and the second wire pattern.

19. The semiconductor device of claim 18, wherein the metal oxide film extends along an entire profile of the gate insulating film.

20. The semiconductor device of claim 18, wherein the metal oxide film is positioned at a boundary between the lower gate electrode and the upper gate electrode.

* * * * *